US005689785A

United States Patent [19]

Kato et al.

[11] Patent Number: 5,689,785

[45] Date of Patent: Nov. 18, 1997

[54] COLOR IMAGE FORMING METHOD AND APPARATUS USED THEREFOR

[75] Inventors: Eiichi Kato; Sadao Osawa, both of Shizuoka, Japan

[73] Assignee: Fuji Photo Film Co., Ltd., Kanagawa, Japan

[21] Appl. No.: 647,217

[22] Filed: May 9, 1996

Related U.S. Application Data

[62] Division of Ser. No. 219,453, Mar. 29, 1994, Pat. No. 5,582,941.

[30] Foreign Application Priority Data

Mar. 30, 1993 [JP] Japan .................................... 5-093833

[51] Int. Cl.$^6$ ........................... G03G 15/01; G03G 15/00

[52] U.S. Cl. .......................... 399/302; 399/298; 399/308; 156/240; 156/277

[58] Field of Search ..................................... 399/298, 302, 399/308; 156/240, 277

[56] References Cited

U.S. PATENT DOCUMENTS

| | | | |
|---|---|---|---|
| 5,071,728 | 12/1991 | Watts | 430/126 |
| 5,391,445 | 2/1995 | Kato et al. | 430/49 |
| 5,395,721 | 3/1995 | Kato et al. | 430/49 |
| 5,526,102 | 6/1996 | Kato | 156/240 |
| 5,582,943 | 12/1996 | Kato et al. | 430/126 |

*Primary Examiner*—George F. Lesmes
*Assistant Examiner*—Laura S. Weiner
*Attorney, Agent, or Firm*—Sughrue, Mion, Zinn, Macpeak & Seas, PLLC

[57] ABSTRACT

A color image forming method which comprises forming a mono-color or multi-color toner image on an electrophotographic photoreceptor having a releasing surface by an electrophotographic process; forming a releasable transfer layer on the photoreceptor having the toner image formed thereon; transferring the toner image together with the transfer layer onto a primary receptor; and transferring the toner image together with the transfer layer from the primary receptor onto the final receiving material, and an apparatus for carrying out the image forming method.

6 Claims, 5 Drawing Sheets

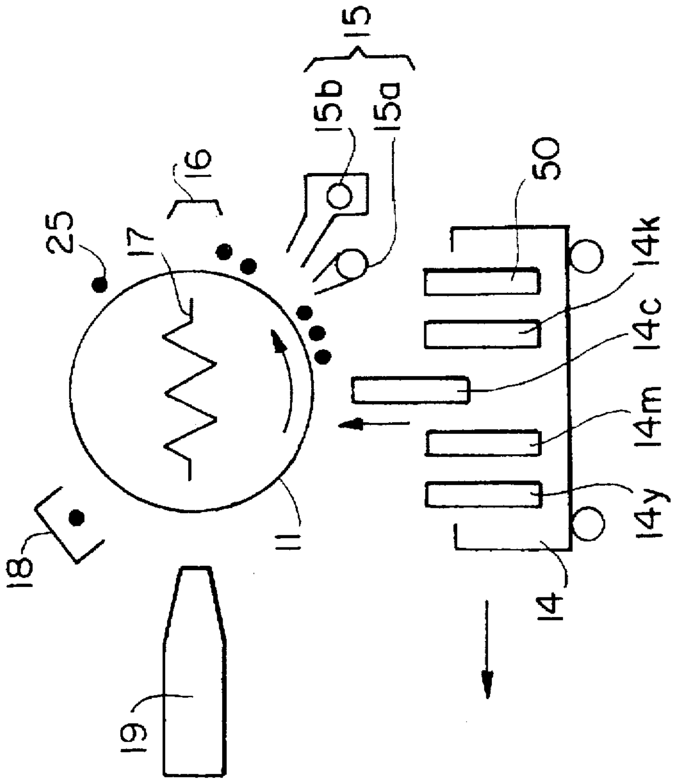
FIG.3
FIG.2
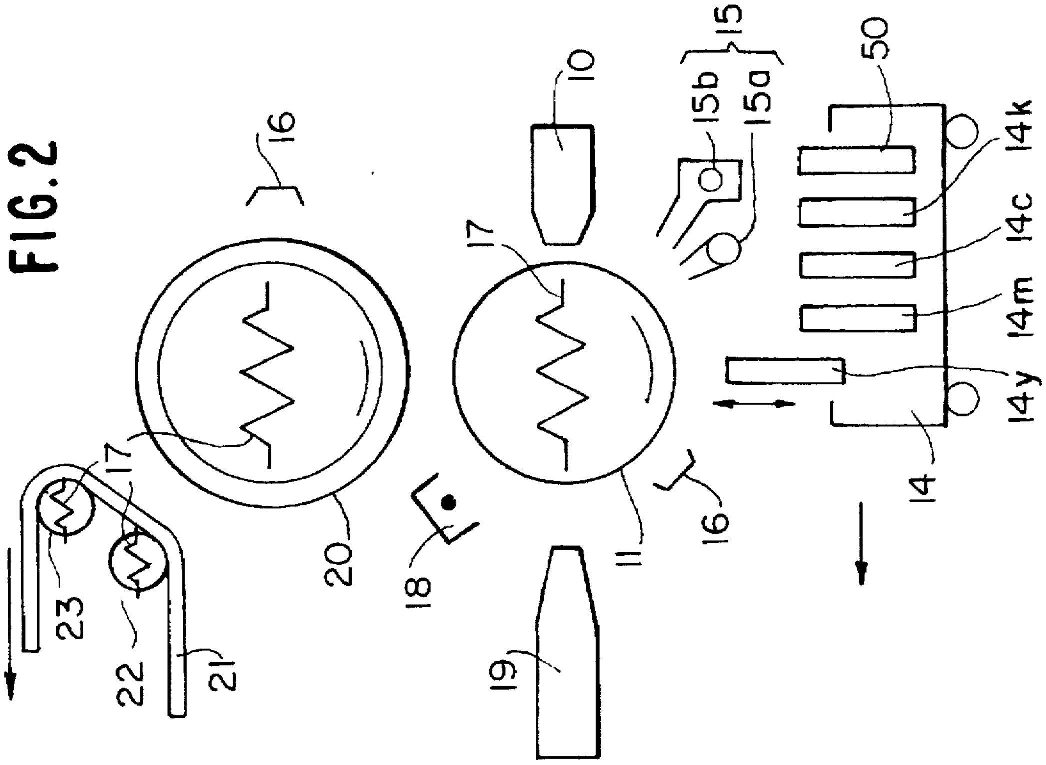

COLOR IMAGE FORMING METHOD AND APPARATUS USED THEREFOR

This is a divisional of application Ser. No. 08/219,453, now U.S. Pat. No. 5,582,941 filed Mar. 29, 1994.

FIELD OF THE INVENTION

This invention relates to a color image forming method in electrophotographic color copying machines, color printers, color proofers, color checkers etc. It also relates to an apparatus used for carrying out the color image forming method.

BACKGROUND OF THE INVENTION

A a process has been known in which development is carried out in such a way that two or more color toners are developed upon one another directly on the surface of an electrophotographic photoreceptor by using developers for electrostatic photography to form a color image, and the color image is immediately transferred onto a receiving material such as printing paper to obtain a color image print, a color image copy or a color proof (proof sheet for printing).

The above-described development process includes dry development process and wet development process. The wet development process is preferred because it provides color images which do not suffer from color drift and have high resolution in comparison with color images obtained by the dry development process. However, it is very difficult that wet toner images are completely transferred from the surface of the photoreceptor directly onto paper.

JP-A-2-272469 (the term "JP-A" as used herein means an "unexamined published Japanese patent application") discloses a method wherein after a non-aqueous solvent is fed between the photoreceptor and the receiving material during transfer, color images are electrostatically transferred to solve the above-described problem.

Further, JP-A-2-115865 and JP-A-2-115866 disclose a method wherein after a transparent film is previously laminated onto the surface of the photoreceptor, a wet toner image is formed on the film by an electrophotographic process, and the film is released from the 0photoreceptor and laminated on plain paper. There is described that it is preferred that the film to be laminated has a thickness of 9 μm. However, the production and handling of the film having such a thickness as described above is difficult and an alternative method is demanded.

Furthermore, JP-B-2-43185 (the term "JP-B" as used herein means an "examined Japanese patent publication") discloses a method wherein exposure to light is made from the back side of a transparent electrophotographic photoreceptor to form an overlapped color separation image on a dielectric support, and the image together with the support is transferred onto a receiving material. In this method, exposure to light is made from the transparent support side of the photoreceptor, and further the electrically conductive layer must be transparent. Accordingly, this method is disadvantageous in cost.

JP-A-1-112264, JP-A-1-281464 and JP-A-3-11347 propose that in an electrophotographic transfer process using the dry development process, a releasable transfer layer is previously provided on the surface of the photoreceptor, a toner image is formed thereon, and the toner image together with the transfer layer is transferred onto paper.

However, when the photoreceptor is repeatedly used in this method, there are disadvantages that an extra operation is required during operation, and it is difficult to form the transfer layer. Further, when the photoreceptor provided with the transfer layer (or a releasing layer) is used, the photoreceptor must be disposable. Accordingly, this method is disadvantageous in cost.

JP-A-2-264280 discloses a method wherein a toner image on the photoreceptive layer is transferred onto a primary intermediate transfer medium having high smoothness and then transferred onto a final receiving material. Further, JP-A-3-243973 and JP-A-4-9087 propose a method wherein a final color image of good quality is obtained by using a special transfer medium even when wet toner system is used.

In the above-described methods, it is conventionally considered that a toner image is clearly transferred without being affected by irregularities on the surfaces of the receptors. However, since the toner image is directly transferred onto a primary intermediate transfer medium and then onto the final receiving material, the resulting color image is deteriorated, for example, a lack of the toner image or unevenness in image density is found, particularly a lack of fine images such as fine lines, fine letters, etc. is found.

Further, toner image is left behind on the surface of the photoreceptor after the toner image is transferred. This causes problems in that when the photoreceptor is repeatedly used, the surface of the photoreceptor must be cleaned, a cleaning device must be provided and the surface of the photoreceptor is damaged by cleaning.

As described above, conventional color image forming method using an intermediate transfer medium has problems in that a fully satisfying color image can not be obtained and that when the intermediate medium is repeatedly used, the effect of the intermediate medium is changed, it is difficult to keep a stable performance over a long period of time, disposable members must be used to keep its performance, and a special transfer medium is required.

The present invention is intended to solve the problems associated with conventional image forming methods in electrophotographic process.

SUMMARY OF THE INVENTION

An object of the present invention is to provide a novel color image forming method in electrophotographic process using a transfer layer as an intermediate medium which provides simply, stably a fine, high-quality color image without causing color drift and can reproduce an excellent color image without specifically selecting the final receiving material (final material to be transferred), and an apparatus used for carrying out the color image forming method.

Another object of the present invention is to provide a novel color image forming method in which a transfer layer to be formed on the surface of a photoreceptor is easily formed and released, and the transfer layer is formed every time after the formation of a color image which enables the photoreceptor to be repeatedly used by using a transfer device of a simple structure within an electrophotographic apparatus, to thereby enable running costs to be reduced.

Still another object of the present invention is to provide a color image forming method which enables running costs to be reduced by using conventional general-purpose electrophotographic photoreceptors and an apparatus used for carrying out the color image forming method.

Other objects and effects of the present invention will be apparent from the following description.

The above-described objects of the present invention have been achieved by providing (1) A color image forming method which comprises forming a mono-color or multi-color toner image on an electrophotographic photoreceptor having a releasing surface; forming a releasable transfer layer on the photoreceptor having the toner image thereon; transferring the toner image together with the transfer layer onto a primary receptor; and then transferring the toner image together with the transfer layer from the primary receptor onto a receiving material; and (2) An apparatus for forming a color image which comprises a means for forming a mono-color or multi-color toner image on an electrophotographic photoreceptor by an electrophotographic process; a means for providing a releasable transfer layer on the photoreceptor having the toner image thereon; a means for transferring the toner image together with the transfer layer onto a primary receptor; and a means for transferring the toner image together with the transfer layer from the primary receptor onto the final receiving material.

BRIEF DESCRIPTION OF THE DRAWING

FIG. 2 shows schematically the method of the present invention and the general view of the apparatus of the present invention.

FIG. 3 shows schematically the stage of forming a toner image on an electrophotographic photoreceptor by an electrophotographic process.

DETAILED DESCRIPTION OF THE INVENTION

Figure 1:
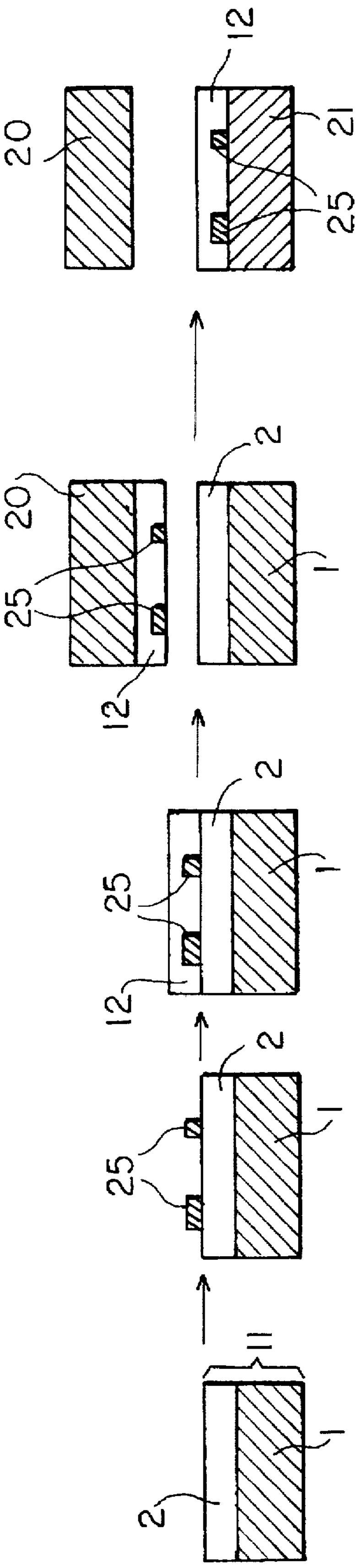
FIG. 1 is a flow sheet illustrating the method according to the present invention.

Referring now to the drawings, FIG. 1 illustrates schematically the color image forming method according to the present invention. A one-color or multi-color toner image 25 is formed on an electrophotographic photoreceptor 11 composed of at least a support 1 and a photoreceptive layer 2, and a releasable transfer layer 12 is provided on the photoreceptor 11 having the toner image 25 formed thereon. Subsequently, the toner image 25 together with the transfer layer 12 is transferred onto a primary receptor 20. Further, the toner image 25 together with the transfer layer 12 is transferred onto the final receiving material 21 to obtain a color image.

In the present invention, the releasable transfer layer 12 is provided on the photoreceptor 11 having the toner image 25 formed thereon, and the toner image 25 together with the transfer layer 12 is transferred. Accordingly, the toner image 25 can be transferred easily and completely. Further, a transfer device having a simple structure may be used, and a color image can be formed without specifically selecting transfer paper 21.

The transfer layer 12 is formed on the color image 25, and the color image and the transfer layer 12 are simultaneously transferred, and hence a fine, high-quality color image can be obtained simply and stably without causing color drift. Further, since the surface of the photoreceptive layer 2 is covered with a substantially electrical insulating transfer layer 12, the photoreceptive layer is relatively hardly affected by external environment, particularly humidity, and images can be reproduced stably and repeatedly.

Further, the surface of the photoreceptive layer 2 is protected by the transfer layer 12, and the toner image is once transferred onto the primary receptor 20. Accordingly, the final receiving material 21 not brought into direct contact with the surface of the photoreceptive layer 2, and hence the damage of the surface of the electrophotographic photoreceptor 11 is reduced, and the photoreceptor can be used repeatedly and over a long period of time.

Furthermore, by forming the transfer layer 12 in the same apparatus as in the electrophotographic process and the transfer process, the electrophotographic photoreceptor 11 can be repeatedly used in the same apparatus, and running cost can be reduced.

Accordingly, the present invention relates to, as a preferred embodiment, a feature of the color image forming method in that the following stages (i) to (iv) are carried out in the same apparatus.

(i) A stage of forming a mono-color or multi-color toner image on the electrophotographic photoreceptor by an electrophotographic process.

(ii) A stage of forming a releasable transfer layer on the photoreceptor having the toner image formed thereon.

(iii) A stage of transferring the toner image together with the transfer layer onto a primary receptor.

(iv) A stage of transferring the toner image together with the transfer layer onto a receiving material.

Further, the present invention provides an apparatus for forming a color image which comprises a means for forming a mono-color or multi-color toner image 25 on the electrophotographic photoreceptor 11 by an electrophotographic process; a means for providing a releasable transfer layer 12 on the photoreceptor 11 having the toner image 25 formed thereon; a means for transferring the toner image 25 together with the transfer layer 12 onto a primary receptor 20; and a means for transferring the toner image 25 together with the transfer layer 12 from the primary receptor 20 onto the final receiving material 21.

In the present invention, it is preferred that the releasable transfer layer 12 is formed on the photoreceptor by at least any one of hot-melt coating, transfer from release paper, electrostatic deposition or electrodeposition.

It is preferred that the electrophotographic photoreceptor 11 having a releasing surface used in the present invention has adhesion of 100 gram.force (g.f) or below, more preferably 50 g.f or below, and particularly preferably 30 g.f or below, as measured according to JIS Z0237-1980 "Testing Method for Adhesive Tape and Adhesive Sheet". It is further preferred that the adhesion of the surface of the primary receptor is greater than that of the surface of the photoreceptor. It is particularly preferred that the adhesion of the surface of the primary receptor is greater by at least 10 g.f, and more preferably at least 30 g.f, than that of the surface of the photoreceptor.

It is preferred that the adhesion of the surface of the primary receptor is 200 g.f or below, and particularly 180 g.f or below, whereby the photoreceptor 11 and the transfer layer 12 can be well peeled off from each other, and the transfer of the toner image from the photoreceptor 11 to the primary receptor and the transfer of the toner image 25 together with the transfer layer 12 from the primary receptor to the final receiving material 21 can be easily made. In addition, it is also preferred that the adhesion of the surface of the primary receptor 11 is at least less than that of the surface of the final receiving material 21.

The adhesion was measured according to JIS Z0237-1980, 180°-peeling method of 8.3.1 with the following modification:

(1) The electrophotographic photoreceptor 11 (on which the transfer layer is formed) is used as the test sheet.

(2) An adhesive tape of 6 mm with a tolerance ±1.0 in width prepared according to JIS C2338-1984 is used as the test specimen.

The thickness of the adhesive tape shall be 0.05 mm with a tolerance ±0.020, and the length shall be 10 m with a tolerance ±1.0. The adhesive tape is made in such a way that pressure-sensitive adhesive is spread uniformly on one side of a polyester film specified in JIS C 2318, the coated film is wound tightly on a core of 25 mm or more inner diameter with the pressure-sensitive adhesive side being inside. The adhesive tape shall be uniform in thickness and width, rich in tackiness and durability, uniform in electric insulation property, not corrosive for metals in contact, and free from substances harmful to electrical insulation.

Specifically, a peeling test with an angle of 180 degrees is conducted according to the following procedure:

(a) Lay the adhesive face downward and true up each one edge of the test piece upon the cleaned test plate, allow the test piece to be placed at the midway of the test plate, and keep free the remainder of the test piece 125 mm in length and powder with talc or stick a paper thereon.

Let the roller reciprocate one stroke at a rate of approximately 300 mm/min upon the test piece for pressure sticking.

Within 20 to 40 minutes after sticking with pressure, fold the free part of the test piece through 180 degrees, peel a part of the stuck portion approximately 25 mm in length, insert the test piece into the upper chuck and the test plate into the lower chuck, and peel at a rate of 120 mm/min using a constant rate of traverse type tensile testing machine.

(b) Detach the click, peel continuously, read the strength at an interval of approximately 20 mm in length of peeling, and eventually read 4 times. The test shall be made on three test pieces.

(c) Determine the mean value from 12 measured values for three test pieces, and convert this mean value in terms of 10 mm width.

Specific examples of the electrophotographic photoreceptor having a releasing surface include amorphous electrophotographic photoreceptors and photoreceptors wherein the uppermost layer of the electrophotographic photoreceptor contains a resin (resin (P)) containing silicon atom and/or fluorine atom having good releasability. The uppermost layer is adjacent to the toner image 25 or the transfer layer 12.

The layer containing the resin (P) is a layer adjacent to the transfer layer 12. The layer may be the photoreceptive layer. A non-photoreceptive layer (overcoat layer) may be provided on the photoreceptive layer to impart releasability from the transfer layer 12.

It is particularly preferred from the standpoint of improving releasability from the transfer layer 12 that the resin (P) is a copolymer composed of at least one block of a polymer segment (α) comprising at least 50% by weight of a silicon atom and/or fluorine atom containing polymer unit and at least one block of a polymer segment (β) comprising 0 to 20% by weight of a silicon atom and/or fluorine atom containing polymer unit.

In the present invention, in addition to the use of the electrophotographic photoreceptor having releasability previously imparted thereto, the electrophotographic photoreceptor having a releasing surface can be formed by a simple method wherein a compound (compound (S)) containing at least fluorine atom and/or silicon atom is adsorbed or deposited on the surface of the electrophotographic photoreceptor. By using a means for imparting releasability to the photoreceptor as described above, photoreceptors having a releasing surface can be simply obtained by using general-purpose electrophotographic photoreceptors, and good results can be obtained without taking the releasability of the surfaces of the electrophotographic photoreceptors themselves into consideration.

The transfer layer 12 used in the present invention will be illustrated in greater detail below.

The transfer layer 12 used in the present invention comprises a releasable resin (resin (A)) and may be colored, so long as the transfer layer is light-transmissive and transmits at least a part of light having wavelengths in the spectral sensitivity region of the electrophotographic photoreceptor 11. When the image 25 is a color image (particularly a full color image) after transfer onto the receiving material 21, a colorless, transparent transfer layer is usually used.

The resin (A) is preferably a resin that can be bonded at a temperature of not higher than 180° C. or at a pressure of not higher than 20 kgf/cm$^2$ and can be released. When the temperature or pressure exceeds the above value, it is not preferred since there is practically caused a problem that an apparatus for keeping the heat capacity and pressure of the transfer device must be larger-sized to peel the transfer layer from the surface of the photoreceptor and to transfer it, and that the transfer speed must be very lowered to effect sufficiently transfer when a resin releasable only under transfer conditions exceeding the above conditions is used. Though there is no particular lower limit, it is preferred to use a resin which can be bonded at a temperature of not lower than room temperature or at a pressure of not lower than 100 gf/cm$^2$ and can be released.

The resin (A) may be any resin which can be released under the above transfer conditions. However, the resin (A) is preferably a resin having such thermal properties that glass transition point is not higher than 140° C., more preferably not higher than 100° C., and softening point is not higher than 180° C., more preferably not higher than 150° C.

It is more preferred that at least two types of resins having different glass transition points or softening points are used in combination. It is particularly preferred that a resin (resin (AH)) having a glass transition point of not lower than 30° C. or a softening point of not lower than 35° C. and a resin (resin (AL)) having a glass transition point or a softening point of lower by at least 2° C., particularly at least 5° C., than a glass transition point or a softening point, respectively, of the resin (AH) are used in combination. Further, it is preferred that the resin (AL) has a glass transition point of from −50° C. to +40° C. or a softening point of from −10° C. to +45° C. When two or more species of resin (AH) or (AL) are used, a difference in the glass transition point or the softening point refers to a difference between the resin (AH) having the lowest glass transition point or softening point and the resin (AL) having the highest glass transition point or softening point.

The ratio by weight of the resin (AH) to the resin (AL) ((AH)/(AL)) is preferably 5/95 to 90/10 particularly preferably 10/90 to 70/30. When the ratio of the resin (AH)/the resin (AL) is outside the range defined above, the transfer of the transfer layer 12 from the primary receptor to the receiving material 21 tends to be insufficiently made, and the effect of the present invention can be insufficiently obtained.

It is preferred that the transfer layer 12 of the present invention has such a multi-layer structure that a first layer comprising the resin (AL) having a lower glass transition point is provided on the surface of the photoreceptor, and a second layer comprising the resin (AH) having a higher glass transition point is provided thereon. When this structure is used, the transferability of the transfer layer from the primary receptor 20 to the receiving material 21 can be further improved. As a result, latitude in transfer conditions (e.g., heating temperature, pressure, conveying speed, etc.) is widened, and influence of variation in species of the receiving material 21 which becomes a color image duplicate can be prevented, so as to make transfer easily.

Further, since the surface side of the transfer layer 12 finally transferred onto the receiving material 21 is composed of the resin (AH) having a higher glass transition point, the storage stability of the duplicates can be further improved, for example, when the duplicates are put in various sheets and filed, the peeling of the transfer sheet 12 is not caused. Namely, ability of filing can be improved. Furthermore, by appropriately selecting the types of the resins (AH), writeability and sealability similar to those of plain paper can be imparted to the duplicates.

Examples of the resin (A) used for the transfer layer 12 include thermoplastic resins and resins conventionally used as adhesives or pressure-sensitive adhesives. Specific examples of the resins include olefin polymers and copolymers, vinyl chloride copolymers, vinylidene chloride copolymers, polymers and copolymers of vinyl esters of alkane acids, polymers and copolymers of allyl esters of alkane acids, polymers and copolymers of styrene and derivatives thereof, olefin-styrene copolymers, olefin-unsaturated carboxylic acid ester copolymers, acrylonitrile copolymers, methacrylonitrile copolymers, alkyl vinyl ether copolymers, acrylic ester polymers and copolymers, methacrylic ester polymers and copolymers, styrene-acrylic ester copolymers, styrene-methacrylic ester copolymers, itaconic diester polymers and copolymers, maleic anhydride copolymers, acrylamide copolymers, methacrylamide copolymers, hydroxyl group-modified silicone resins, polycarbonate resins, ketone resins, polyester resins, silicone resins, amide resins, hydroxyl group and carboxyl group-modified polyester resins, butyral resins, polyvinyl acetal resins, cyclized rubber-mathacrylic ester copolymers, cyclized rubber-acrylic ester copolymers, heterocyclic ring-containing copolymers (examples of the heterocyclic ring include a furan ring, a tetrahydrofuran ring, a thiophene ring (a dioxane ring), a dioxofuran ring, a lactone ring, a benzfuran ring, a benzthiophene ring, a 1,3-dioxetane ring, etc.), cellulose resins, fatty acid-modified cellulose resins, and epoxy resins.

Further, there can be used resins described in *Plastic Material Lecture Series*, Vol. 1 to Vol. 18 (1981 published by Nikkan Kogyo Shinbun Sha), *Polyvinyl Chloride* edited by Vinyl Section of Kinki Kagaku Kyokai (1988 published by Nikkan Kogyo Shinbun Sha), *Functional Acrylic Resin* written by Eizo Omori (1985 published by Technosystem), *Polyester Resin Handbook* written by Eiichiro Takiyama (1988 published by Nikkan Kogyo Shinbun Sha), *Saturated Polyester Resin Handbook* edited by Kazuo Yuki (1989 published by Nikkan Kogyo Shinbun Sha), *High-Molecular Data Handbook* (*Applied Part*) Chapter 1, edited by Kobunshi Gakkai (1986 published by Baifukan), *Newest Binder Technical Handbook* Chapter 2 edited by Isamu Harasaki (1985 published by Sogo Gijutsu Center), *High-Molecular Processing* separate volume 8, Vol. 20, extra issue *Adhesion* edited by Taira Okuda (1976 published by Kobunshi Kankokai), *Adhesion Technique* written by Kenji Fukuzawa (1987 published by Kobunshi Kankokai), *Adhesive Handbook* the 14th edition, written by Mamoru Sekiguchi (1985 published by Kobunshi Kankokai) and *Adhesive Handbook* the second edition edited by Nippon Sechaku Kyokai (1980 published by Nikkan Kogyo Shinbun Sha).

Further, the resin (A) used for the transfer layer 12 of the present invention may contain a polymer unit (F) having a fluorine atom and/or silicon atom-containing substituent group having an effect of improving the releasability of the resin (A) itself as a copolymer moiety of each of the above-described resins. By incorporating the polymer unit (F) as a copolymer component in the resin, the releasability of the transfer layer from the releasing surface of the electrophotographic photoreceptor 11 can be further improved and as a result, transferability can be further improved. The content of the polymer unit (F) is preferably 3 to 40% by weight, more preferably 5 to 25% by weight, based on the weight of the total polymer components of the resin (A). The substituent group includes both substituent group incorporated in the main chain of the polymer and substituent group on the side chain thereof. It is preferred that the polymer unit (F) is incorporated as a block in the copolymer (block copolymer) of the thermoplastic resin (A).

When the resin (A) used for the transfer layer 12 comprises two or more resins having different glass transition points or softening points, the fluorine atom and/or silicon atom-containing polymer unit (F) may be incorporated in any of the resin (AH) having a higher glass transition point and the resin (AL) having a lower glass transition point.

The polymer unit (F) which has an effect of improving the releasability of the resin (A) itself and is incorporated in the polymer will be illustrated below.

Examples of the fluorine atom-containing substituent group include the following monovalent or bivalent organic residues.

$-C_hF_{2h+1}$ (h is an integer of 1 to 18), $-(CF_2)_jCF_2H$ (j is an integer of 1 to 17), $-CFH_2$,

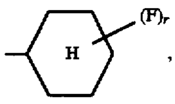 , 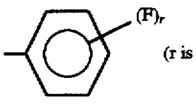 (r is an integer of 1 to 5)

$-CF_2-$, $-CFH-$, 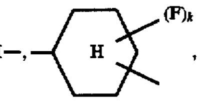 ,

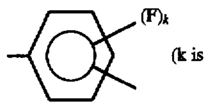 (k is an integer of 1 to 4)

Examples of the silicon atom-containing substituent group include the following monovalent or bivalent organic residues.

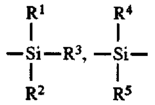

wherein $R^1$, $R^2$, $R^3$, $R^4$ and $R^5$ may be the same or different and each represents a hydrocarbon group which may be substituted or $-OR^6$ group (wherein $R^6$ represents a hydrocarbon group).

Examples of the hydrocarbon group represented by $R^1$ to $R^5$ include an alkyl group having 1 to 18 carbon atoms which may be substituted (e.g., methyl group, ethyl group, propyl group, butyl group, hexyl group, octyl group, decyl group, dodecyl group, hexadecyl group, 2-chloroethyl group, 2-bromoethyl group, 2,2,2-trifluoroethyl group, 2-cyanoethyl group, 3,3,3-trifluoroethyl group, 2-methoxyethyl group, 3-bromopropyl group, 2-methoxycarbonylethyl group, 2,2,2,2',2',2'-hexafluoroisopropyl group, etc.), an alkenyl group having 4 to 18 carbon atoms which may be substituted (e.g., 2-methyl-1-propenyl group, 2-butenyl group, 2-pentenyl group, 3-methyl-2-pentenyl group, 1-pentenyl group, 1-hexenyl group, 2-hexenyl group, 4-methyl-2-hexenyl group, etc.), an aralkyl group having 7 to 12 carbon atoms which may be substituted (e.g., benzyl group, phenethyl group, 3-phenylpropyl group, naphthylmethyl group, 2-naphthylethyl group, chlorobenzyl group, bromobenzyl group, methylbenzyl group, ethylbenzyl group, methoxybenzyl group, dimethylbenzyl group, dimethoxybenzyl group, etc.), an alicyclic group having 5 to 8 carbon atoms which may be substituted (e.g., cyclohexyl group, 2-cyclohexyl group, 2-cyclopentylethyl group, etc.), and an aromatic group having 6 to 12 carbon atoms which may be substituted (e.g., phenyl group, naphthyl group, tolyl group, xylyl group, propylphenyl group, butylphenyl group, octylphenyl group, dodecylphenyl group, methoxyphenyl group, ethoxyphenyl group, butoxyphenyl group, decyloxyphenyl group, chlorophenyl group, dichlorophenyl group, bromophenyl group, cyanophenyl group, acetylphenyl group, methoxycarbonylphenyl group, ethoxycarbonylphenyl group, butoxycarbonylphenyl group, acetamidophenyl group, propioamidophenyl group, dodecyloylamidophenyl group, etc.). The hydrocarbon group represented by $R^6$ of $-OR^6$ has the same meaning as the hydrocarbon group represented by $R^1$.

The fluorine atom and/or silicon atom-containing organic substituent group may be composed of a combination of two or more of the above-described organic groups. When the substituent group is composed of a combination of two or more groups, the groups may be bonded directly to each other or through a bonding group. Examples of the bonding group through which the organic groups are bonded to each other include bivalent organic groups such as $-O-$, $-S-$, $-N(d^1)-$, $-SO-$, $-SO_2-$, $-COO-$, $-OCO-$, $-CONHCO-$, $-NHCONH-$, $-CON(d^1)-$ and $-SO_2(d^1)-$. Further, a bivalent aliphatic group, a bivalent aromatic group or an organic group composed of a combination of two or more of these bivalent groups may be used. In the above formula, $d^1$ has the same meaning as $R^1$.

Examples of the bivalent aliphatic group include the following groups.

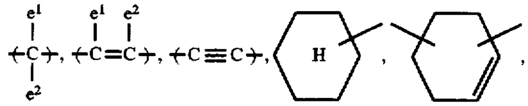

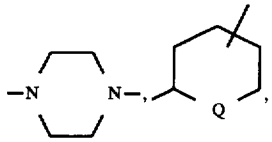

wherein $e^1$ and $e^2$ may be the same or different and each represents a hydrogen atom, a halogen atom (e.g., chlorine atom, bromine atom), or an alkyl group having 1 to 12 carbon atoms (e.g., methyl group, ethyl group, propyl group, chloromethyl group, bromomethyl group, butyl group, hexyl group, octyl group, nonyl group, decyl group); Q represents $-O-$, $-S-$ or $-N(d^2)-$; and $d^2$ represents an alkyl group having 1 to 4 carbon atoms, $-CH_2Cl$, or $-CH_2Br$.

Examples of the bivalent aromatic group include benzene ring group, naphthalene ring group, and a five-membered or six-membered heterocyclic group (having at least one hetero-atom of oxygen atom, sulfur atom and nitrogen atom). The aromatic group may be substituted. Examples of substituent groups include a halogen atom (e.g., fluorine atom, chlorine atom, bromine atom), an alkyl group having 1 to 8 carbon atoms (e.g., methyl group, ethyl group, propyl group, butyl group, hexyl group, octyl group) and an alkoxy group having 1 to 6 carbon atoms (e.g., methoxy group, ethoxy group, propoxy group, butoxy group).

Examples of the heterocyclic group include a furan ring, a thiophene ring, a pyridine ring, a piperazine ring, a tetrahydrofuran ring, a pyrrole ring, a tetrahydropyran ring, and a 1,3-oxazoline ring.

Specific examples of repeating units having a fluorine atom and/or silicon atom-containing substituent group include, but are not limited to, the following units.

In general formulas (F-1) to (F-32) described below, $R_f$ represents a group selected from the group consisting of the following groups (1) to (11), and b represents a hydrogen atom or a methyl group.

$-C_nF_{2n+1}$ (1)

$-CH_2C_nF_{2n+1}$ (2)

$-CH_2CH_2C_nF_{2n+1}$ (3)

$-CH_2(CF_2)_mCFHCF_3$ (4)

$-CH_2CH_2(CH_2)_mCFHCF_3$ (5)

$-CH_2CH_2(CH_2)_mCFHCF_2H$ (6)

$-CH_2(CF_2)_mCFHCF_2H$ (7)

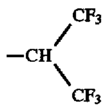 (8)

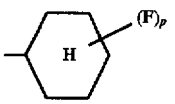 (9)

-continued
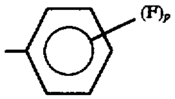
(10)
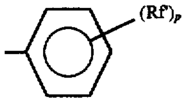
(11)
In general formulas (1) to (11), Rf' represents a group selected from the group consisting of the groups (1) to (8) described above; n represents an integer of 1 to 18; m represents an integer of 1 to 18; and p represents an integer of 1 to 5.
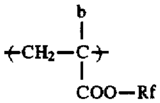
(F-1)
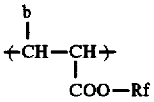
(F-2)
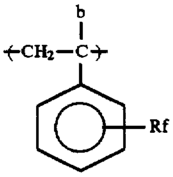
(F-3)
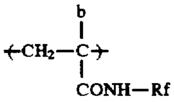
(F-4)
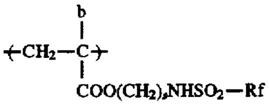
(F-5)
(s: an integer of 1 to 12)
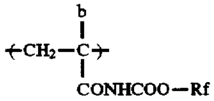
(F-6)
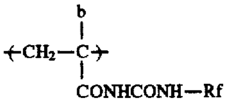
(F-7)
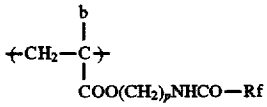
(F-8)
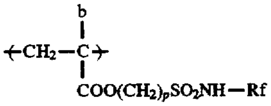
(F-9)
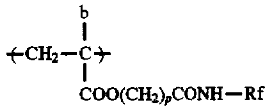
(F-10)
-continued
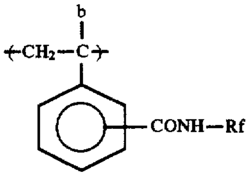
(F-11)
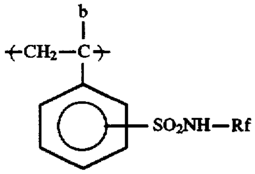
(F-12)
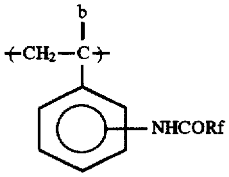
(F-13)
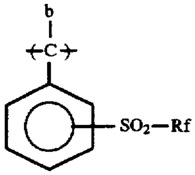
(F-14)
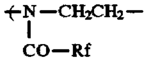
(F-15)
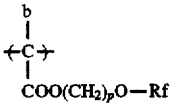
(F-16)
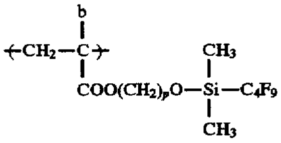
(F-17)
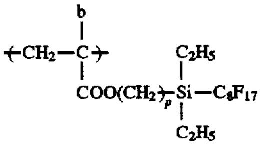
(F-18)
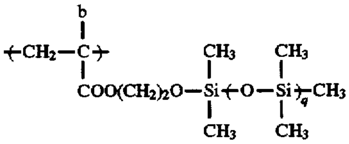
(F-19)
q: an integer of 1 to 20

-continued (F-20)

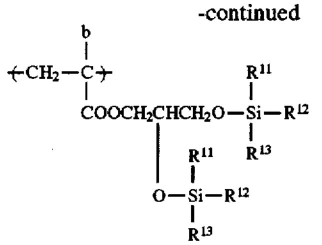

$R^{11}$, $R^{12}$, $R^{13}$: an alkyl group having 1 to 20 carbon atoms (F-21)

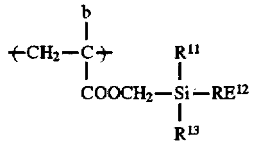

(F-22)

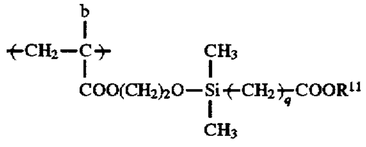

q: an integer of 1 to 20

(F-23)

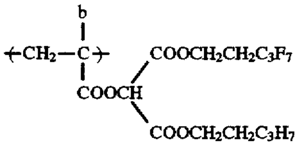

(F-24)

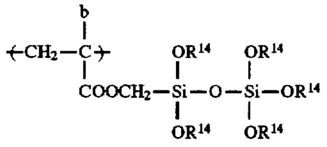

$R^{14}$:

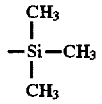

(F-25)

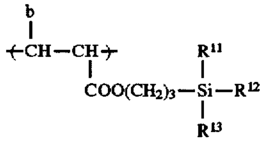

(F-26)

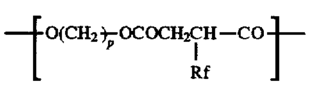

(F-27)

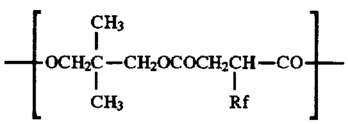

(F-28)

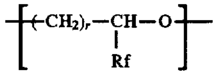

r: an integer of 3 to 6

(F-29)

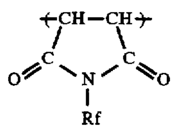

-continued (F-30)

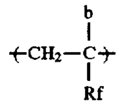

(F-31)

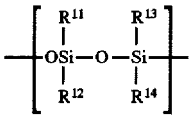

(F-32)

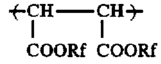

Preferred embodiments of block copolymers in the resin (A) of the present invention will be illustrated below.

The fluorine atom and/or silicon atom-containing substituent group-containing polymer unit (F) may be present in any form in the block copolymer, so long as the polymer unit (F) is present in the form of blocks. The term "in the form of blocks" as used herein refers to that the copolymer contains a polymer segment containing at least 70% by weight of the fluorine atom and/or silicon atom-containing substituent group. Examples of the blocks include an A-B type block, an A-B-A type block, a B-A-B type block, a graft type block, and a star type block as shown by the following schematic formulas.

A—B type A—B—A (B—A—B) type

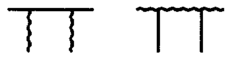

Graft type (The number of grafts is optional.)

Star type (The number of branches is optional.)

— Block A: containing flourine and silicon

~ Block B: containing no flourine and no silicon

These block copolymers can be synthesized by conventional polymerization methods such as the methods described in W. J. Burlant, A. S. Hoffman *Block and Graft Polymers* (1986Reuhold), R. J. Cevesa, *Block and Graft Copolymers* (1962 Butter worths), D. C. Allport, W. H. James, *Block Copolymers* (1972 Applied Sci.), A. Noshay, J. E. McGrath, *Block Copolymers* (1977 Academics Press), G. Huvterg, D. J. Wilson, G. Riess, *NATO AsIser*, SerE. (1985) 149, and V. Perces, *Applide. Polymer Sci.*, Vol. 285, 95 (1935).

Specific examples of ionic polymerization reaction using organometallic compounds (e.g., alkyllithiums, lithium diisopropylamide, alkali metal alcoholates, alkylmagnesium halides, alkylaluminium halides) as polymerization initiators are described in T. E. Hogeu-Esch, J. Smid, *Recent Advances in Anion Polymerization* (1987 Elsevier New York), *Kobunshi*, 38, 912 (1989 written by S. Okamoto), *Kobunshi*, 38, 1018 (1989 written by M. Sawamoto), *Kobunshi*, 37, 252 (1988 written by T. Narita), B. C. Anderson et al., *Macromolecules*, 14, 1601 (1981) and S. Aoshima, T. Higashimura, *Macromolecules*, 22, 1099 (1989).

Ionic polymerization reaction using hydrogen iodide/iodine system is described in T. Higashimura et al., *Macromol. Chem. Macromol. Symp.*, 13/14, 457 (1988), and *Kobunshi Ronbunshu*, 46, 189 (1989 written by T. Higashimura et al.)

Group transfer polymerization reaction is described in D. Y. Sogah et al., *Macromolecules*, 20, 1473 (1987), D. W. Webster, D. Y. Sogah, *Kobunshi.*, 36, 808 (1987), M. T. Reetg et al., *Angew. Chem. Int. Engl.*, 25, 9108 (1986) and JP-A-63-97609.

Living polymerization reaction using metal porphyrin complexes is described in T. Yasuda, T. Aida, S. Inoue, *Macromolecules*, 17, 2217 (1984), M. Kuroki, T. Aida, S. Inoue, *T. Ann. Chem. Soc.*, 109, 4737 (1987), M. Kuroki et al., *Macromolecules*, 21, 3155 (1988) and M. Kuroki, I. Inoue, *Yuki Gosei Kagaku*, 7, 1017 (1989).

The ring opening polymerization reaction of cyclic compounds is described in T. Saegusa, *Ring Opening Polymerization* (1984 Applied Science Publishers Ltd.), W. Seeligger et al., *Angew. Chem. Int. Ed. Engl.*, 5, 875 (1966), S. Kobayashi et al., *Poly. Bull.* 13, 447 (1985) and Y. Chujo et al., *Macromolecules*, 22, 1074 (1989).

Photoliving polymerization reaction using dithiocarbamate compounds or xanthate compounds as initiators is described in T. Otsu, *Kobunshi*, 37, 248 (1988), T. Himori, T. Otsu, *Polym. Rep. Jap.*, 37, 3508 (1988), JP-A-64-111, JP-A-64-26619 and N. Niwa, *Macromolecules*, 189, 2187 (1988).

Methods for synthesizing block copolymers by radical polymerization reaction using high-molecular materials having an azo group or a peroxide group as initiators are described in A. Ueda et al., *Kobunshi Ronbunshu*, 33, 931 (1976), A. Ueda, *Osaka Shiritsu Kogyo Kenkyusho Report*, 84, (1989), O. Nuyken et al., *Macromol. Chem. Rapid. Commun.*, 9, 671 (1988), Yasuo Moriya, *Kyoka Plastic*, 29, 907 and R. Oda, *Kagaku and Kogyo*, 61, 43 (1987).

The synthesis of graft block copolymers is described in F. Ide, *Graft Polymerization and Application thereof* (1977 Kobunshi Kankokai) and *Polymer Alloy* edited by Kobunshi Gakkai (1981 Tokyo Kagaku Dojin) in addition to the above-described literature. For example, there are known methods for carrying out the grafting of high-molecular chains by mechanochemical reaction methods using polymerization initiators, chemical actinic rays (e.g., radiations, electron beams) or mechanical application; methods for carrying out the grafting of high-molecular chains by utilizing the functional groups of high-molecular chains (a reaction between high-molecular materials); and methods for grafting macromonomers by polymerization reaction.

Specific examples of the methods for carrying out grafting by using high-molecular materials are described in T. Shota et al., *J. Appl. Polym. Sci.*, 13, 2447 (1969), W. H. Buck, *Rubber Chemistry and Technology*, 50, 109 (1976), T. Endo, T. Uezawa, *Nippon Setchaku Kyokaishi*, 24, 323 (1988) and T. Endo, ibid., 25, 409 (1989).

Specific examples of the methods for carrying out grafting by using macromonomers are described in P. Dreyfuss & R. P. Quirk, *Encyl. Polym. Sci. Eng.*, 7, 551 (1987), P. F. Rempp, E. FraNTA, *Adv. Polym. Sci.*, 58, 1 (1984), V. Percec, *Appl. Poly. Sci.*, 285, 95 (1984), R. Asami, N. Takari, *Macromol. Chem. Suppl.*, 12, 163 (1985), P. Rempp et al., *Macromol. Chem. Suppl.*, 8, 3 (1985), Y. Kawakami, *Kagaku Kogyo*, 38, 56 (1987), Y. Yamashita, *Kobunshi*, 31, 988 (1982), S. Kobayashi, *Kobunshi*, 30, 625 (1981), T. Higashimura, *Nippon Setchaku Kyokaishi*, 18, 536 (1982), K. Ito, *Kobunshi Kako*, 35, 262 (1986), K. Azuma, T. Tsuda, *Kino Zairyo*, 1987, No. 10.5, Y. Yamashita et al., *Macromonomer Kagaku and Kogyo*, (1989 I. B. C. KK), T. Endo, *Molecular Design of New Functional High-molecules*, Chapter 4 (1991 C.M.C. KK) and Y. Yamashita et al., *Polym. Bull.*, 5, 361 (1981).

Examples of the synthesis methods of star type block copolymers are described in M. T. Reetz, *Angew. Chem. Int. Ed.*, 27, 1373 (1988), M. Sgwarc Carnanions, *Living Polymers an Electron Transfer Processes*, (1968 Wiley New York), B. Gordon et al., *Polym. Bull.*, 11, 349 (1984), R. B. Bates et al., *J. Org. Chem.*, 44, 3800 (1979), Y. Sogah, *A. C. S. Polym. Rapr.*, 1988, No. 2.3, J. W. Mays, *Polym. Bull.*, 23, 247 (1990), I. M. Khan et al., *Macromolecules*, 21, 2684 (1988), A. Morikawa, *Macromolecules*, 24, 3469 (1991), A. Ueda, T. Nagai, *Kobunshi*, 39, 202 (1990) and T. Otsu, *Polym. Bull.*, 11, 135 (1984). However, the synthesis methods of the block copolymers are not limited to the above-described methods.

It is preferred that the block copolymer accounts for at least 70% by weight, more preferably at least 90% by weight, of the total amount of the entire composition of the transfer layer. The block copolymers may be used either alone or in combination of two or more of them.

The transfer layer 12 may optionally contain other additives to improve various physical properties such as adhesion, layer forming properties, layer strength, etc. For example, the transfer layer may contain rosin, petroleum resin and silicone oil to control adhesion. Plasticizers and softeners such as polybutene, DOP, DBP, low-molecular styrene resins, low-molecular polyethylene wax, microcrystalline wax and paraffin wax may be added to improve mettability to the photoreceptor and to reduce melt viscosity. High-molecular hindered polyhydric phenols and triazine derivatives as antioxidants may be added. The details thereof are described in *Practice of Hot-Melt Adhesion* (written by Hiroshi Fukada published by Kobunshi Kankokai 1983) pp. 29–107.

The thickness of the transfer layer 12 is generally 0.1 to 20 μm, and preferably 0.5 to 10 μm. When the thickness is too small, a failure in transfer is liable to be caused, while when the thickness is too large, there may be a disadvantage that a failure in electrophotographic process is apt to be caused, a sufficient image density is not obtained or a lowering in image quality is liable to be caused.

It is preferred in the present invention that the transfer layer 12 is formed within the electrophotographic apparatus, and the transfer layer is formed on the photoreceptor 11 by means of hot-melt coating, electrodeposition coating or transfer method as described hereinafter.

The electrophotographic photoreceptor 11 used in the present invention will be illustrated below.

Any of conventional electrophotographic photoreceptors can be used in the present invention. The essential matter of the electrophotographic photoreceptor 11 used in the present invention is that before the toner image 25 is formed, the surface of the photoreceptor 11 has releasability so that the transfer layer 12 provided on the surface of the photoreceptor 11 can be released together with the toner image 25. It is preferred that the surface of the photoreceptor 11 used in the present invention has adhesion of 100 g.f or below, particularly 30 g.f or below, as measured according to JIS Z0237-1980, "Testing Method for Adhesive Tape and Adhesive Sheet" before the toner image 25 is formed.

A photoreceptor having a releasing surface previously provided thereon may be used. Alternatively, a releasing compound (S) may be adsorbed or deposited on the surface of conventional general-purpose electrophotographic photoreceptor to obtain the photoreceptor 11 having a releasing surface.

Examples of the former photoreceptor having a releasing surface previously provided thereon include photoreceptors obtained by using amorphous silicon as a photoconductive material and photoreceptors obtained by using a polymer containing a polymer component containing at least one of silicon atom and fluorine atom (silicon atom and/or fluorine atom-containing polymer component) in the vicinity of the surface of the electrophotographic photoreceptor 11. The term "in the vicinity of the surface of the electrophotographic photoreceptor 11" means the uppermost layer of the photoreceptor and includes an overcoat layer provided on the photoconductive layer and the uppermost photoconductive layer. Namely, the photoreceptors include those obtained by providing an overcoat layer as the uppermost layer of the photoreceptor having a photoconductive layer and incorporating the polymer component in the overcoat layer to impart releasability and those obtained by incorporating the polymer component in the photoconductive layer (which may be composed of a single layer or a laminated layer) and modifying the surface to impart releasability. When such a photoreceptor as described above is used, the surface thereof has good releasability, and hence the toner image 25 together with the transfer layer 12 can be easily, and completely transferred onto the primary receptor.

Releasability can be imparted to the overcoat layer or the uppermost photoconductive layer by using the silicon atom and/or fluorine atom-containing polymer as a binder resin for these layer or by using a small amount of a block copolymer containing the silicon atom and/or fluorine atom-containing polymer segment (surface distributed type copolymer) as described below together with other binder resin. The silicon atom and/or fluorine atom-containing resin may be used in the form of particles.

Particularly, when the overcoat layer is provided, it is preferred that the above surface distributed type copolymer is used together with the binder resin for the overcoat layer to retain sufficiently adhesion between the photoconductive layer and the overcoat layer. The surface distributed type copolymer together with other binder resin can be used in an amount of 0.1 to 20 parts by weight-based on 100 parts by weight of the entire composition of the overcoat layer.

The above-described overcoat layer is conventionally known as a means for retaining the durability of the surface of the photoreceptor repeatedly used in the field of PPC photoreceptors using dry toners. An example thereof includes the protective layer which is provided as a surface layer on the surface of the photoreceptor to protect the surface.

Examples of the protective layer formed by using silicon block copolymers are described in JP-A-61-95358, JP-A-55-83049, JP-A-62-87971, JP-A-61-189559, JP-A-62-75461, JP-A-61-139556, JP-A-62-139557 and JP-A-62-208055. Examples of the protective layer formed by using fluorine block copolymers are described in JP-A-61-116362, JP-A-61-117563, JP-A-61-270768 and JP-A-62-14657. Examples of the protective layer formed by using resins containing a fluorine atom-containing polymer component in the form of particles are described in JP-A-63-249157 and JP-A-63-221355.

The method for modifying the surface of the uppermost photoconductive layer to impart releasability can be effectively applied to dispersion type photoreceptors obtained by using at least a photoconductive material and a binder resin.

Namely, at least one of the resin of the polymer having the block of the polymer segment containing a fluorine atom and/or silicon atom-containing polymer component and the resin particle containing a fluorine atom and/or silicon atom-containing polymer component is allowed to exist in the layer which constitutes the uppermost layer of the photoconductive layer, whereby the polymer is concentrated and migrates to the surface of the layer (surface distributed type copolymer), thus modifying the surface to make it releasable. Examples of the copolymer and the resin particle include those described in JP-A-5-197169.

Further, a block copolymer wherein the block of at least one of a fluorine atom and/or silicon atom-containing polymer segment is bonded to the block of at least one of a heat- and/or photo-curable group-containing polymer segment can be used as a binder resin for the overcoat layer and the photoconductive layer to ensure surface distribution. Examples of the heat and/or photo-curable group-containing polymer segment include those described in JP-A-5-197169. Further, photo-curable and/or heat-curable resins may be used together with the fluorine atom and/or silicon atom-containing resins according to the present invention.

With regard to the electrophotographic photoreceptor having a releasing surface previously provided, the polymer containing a fluorine atom and/or silicon atom-containing polymer component which is effective in modifying the surface of the photoreceptor comprises a resin (resin (P)) or resin particles (resin particles).

When the polymer containing a fluorine atom and/or silicon atom-containing polymer component used in the present invention is a random copolymer, it is preferred that the fluorine atom and/or silicon atom-containing polymer component accounts for at least 60% by weight, more preferably at least 80% by weight, of the entire polymer component.

More preferably, the polymer is a block copolymer comprising the block of a polymer segment ($\alpha$) containing at least 50% by weight of the fluorine atom and/or silicon atom-containing polymer component and the block of a polymer segment ($\beta$) containing 0 to 20% by weight of the fluorine atom and/or silicon atom-containing polymer component wherein both blocks are bonded to each other. Still more preferably, the polymer segment ($\beta$) in the block copolymer contains at least one member of polymer components having at least one photo-curable and/or heat-curable functional group.

It is preferred that the segment ($\beta$) in the block copolymer does not contain the fluorine atom and/or silicon atom-containing polymer component.

When the polymer is the block copolymer comprising the polymer segment ($\alpha$) and the polymer segment ($\beta$) (surface distributed type copolymer), the releasability itself of the surface can be improved, and further releasability can be retained in comparison with the random copolymer.

Namely, when a coating film is formed in the presence of a small amount of the resin (P) which is the fluorine atom and/or silicon atom-containing block copolymer of the present invention, the copolymer migrates to the surface portion of the film and is concentrated until the completion of drying after coating, whereby the surface is modified to provide releasability.

When the polymer contains the fluorine atom and/or silicon atom-containing polymer segment ($\alpha$) as a block, because the polymer segment ($\beta$) (containing no or a small amount of the fluorine atom and/or silicon atom-containing polymer component) is compatible with the film forming binder resin and well interacts with the binder resin, the resin does not migrate to the transfer layer during the formation of the transfer layer, and the interface between the transfer layer and the photoconductive layer can be clearly formed (namely, an anchor effect).

Further, when the polymer segment (β) in the block copolymer contains the photo-curable and/or heat-curable group-containing polymer component, a crosslinking reaction takes place between the polymers, and hence the releasability of the interface between the photoreceptor and the transfer layer can be further improved.

The polymer may be used in the form of resin particles (PL) as described above.

Preferably, the resin particles are capable of being dispersed in a non-aqueous solvent. Such resin particles contain a fluorine atom and/or silicon atom-containing polymer component. The polymer particles preferably comprise a polymer segment (α) insoluble in the non-aqueous solvent and a polymer segment (β) soluble in the non-aqueous solvent containing not more than 20% of the fluorine atom and/or silicon atom-containing polymer component wherein both segments are bonded to each other.

When the polymer is in the form of the resin particles, the polymer migrates to the surface and is concentrated by the effect of the insolubile polymer segment (α), and the non-aqueous solvent-soluble polymer segment (β) bonded to the particle interacts with the binder resin, thereby providing an anchor effect as described above. Further, by incorporating a photo-curable and/or heat-curable group in to the segment (β), the migration of the resin to the transfer layer is prevented.

The polymer component containing the fluorine atom and/or silicon atom-containing substituent group-containing polymer component used in the present invention will be illustrated below. The polymer component includes both the case where the substituent group is incorporated in the high-molecular main chain of the polymer and the case where the substituent group is present on the side chains of the polymer.

Specific embodiments of the substituent group and the substituent group-containing polymer component include those already described above in the illustration of the polymer unit (F) which may be incorporated in the resin (A) which constitutes the transfer layer 12.

The surface distributed type copolymer in the silicon atom and/or fluorine atom-containing resin (P) and the resin particles (PL) used in the present invention will be illustrated below.

The silicon atom and/or fluorine atom-containing polymer component generally accounts for at least 50% by weight, preferably at least 70% by weight, and more preferably at least 80% by weight, of the total amount of the segment (α).

The silicon atom and/or fluorine atom-containing polymer component generally accounts for not more than 20% by weight, and preferably 0% by weight, of the total amount of the segment (β) which is bonded to the segment (α).

The ratio by weight of the segment (α) to the segment (β) is generally 1/99 to 95/5, and preferably 5/95 to 90/10. When the ratio is outside the range defined above, the resin (P) and resin particles (PL) are reduced in the concentration effect on the surface of the photoconductive layer or the overcoat layer and in the anchor effect and as a result, the releasability of the transfer layer 12 is reduced.

The weight-average molecular weight of the resin (P) is preferably $5\times10^3$ to $1\times10^6$, more preferably $1\times10^4$ to $5\times10^5$. The segment (α) in the resin (P) has a weight-average molecular weight of preferably $1\times10^3$ or more.

The resin particles (PL) have an average particle size of preferably 0.001 to 1 μm, and more preferably 0.05 to 0.5 μm.

A preferred embodiment of the surface distributed type copolymer of the resin (P) will be illustrated below.

The resin (P) may be in any form, so long as the fluorine atom and/or silicon atom-containing polymer component is bonded as a block. The term "bonded as a block" as used herein refers to that the polymer segment (α) containing at least 50% by weight of the fluorine atom and/or silicon atom-containing polymer component is incorporated in the copolymer. Examples of the block include A-B type block, A-B-A type block, B-A-B type block, graft type block and star type block as already described above in the definition of the resin (A) for the transfer layer. These block copolymers of resin (P) can be synthesized by conventional polymerization methods. Examples of the polymerization methods include those already described above in the synthesis of the resin (A).

A preferred embodiment of the resin particles (PL) will be illustrated below.

Preferably, the resin particles (PL) comprise the fluorine atom and/or silicon atom-containing polymer segment (α) insoluble in a non-aqueous solvent and the polymer segment (β) soluble in the-non-aqueous solvent containing no or a small amount of the fluorine atom and/or silicon atom-containing polymer component as described above. The polymer particle preferably has an average particle size of as fine as 1 μm or smaller. Further, the polymer segment (α) which forms the insoluble moiety of the resin particle may have a crosslinked structure.

A preferred method for synthesizing the resin particles (PL) includes the non-aqueous dispersion polymerization method as described in the synthesis of the non-aqueous thermoplastic dispersion particles.

The non-aqueous solvent for use in the preparation of the non-aqueous dispersion resin particles may be any of organic solvents having a boiling point of not higher than 200° C. The solvents may be used either alone or as a mixture of two or more of them. Specific examples of the organic solvents include those already described above in the non-aqueous dispersion polymerization method.

When the dispersion resin particles are synthesized in the non-aqueous solvent system by the dispersion polymerization method, the average particle size of the resulting resin particles is easily made 1 μm or smaller, and monodisperse particles having a very narrow particle size distribution can be obtained.

More specifically, a monomer (a) for the polymer component of the segment (α) and a monomer (b) for the polymer component of the segment (β) are polymerized with heating in the presence of a polymerization initiator such as a peroxide (e.g., benzoyl peroxide, lauroyl peroxide), an azobis compound (e.g., azobisbutyronitrile, azobisisovaleronitrile) or an organometallic compound (e.g., butyl lithium) in a non-aqueous solvent in which the monomer (a) is soluble, but the polymer of the monomer (a) is insoluble. Alternatively, the monomer (a) and a polymer (PB) comprising the segment (β) may be polymerized in the same manner as described above.

The interior of the insolubilized polymer particle of the resin particles (PL) may have a crosslinked structure. The crosslinked structure can be formed by any of conventional methods.

Namely, the crosslinked structure can be formed by (1) a method wherein a polymer containing the polymer segment (α) is crosslinked by using a crosslinking agent or a curing agent, (2) a method wherein when a polymerization reaction is carried out in the presence of at least the monomer (a) for the polymer segment (α), a polyfunctional monomer or oligomer having at least two polymerizable functional groups is used to thereby form a network structure between molecules, and (3) a method wherein the polymer segment (α) and a polymer having a reactive group are subjected to a polymerization reaction or a polymer reaction, thereby forming a crosslinked structure.

Examples of the crosslinking agent which can be used in the above method (1) include compounds which are conventionally used as crosslinking agents. For example, compounds described in S. Yamashita, T. Kaneko, *Crosslinking Agent Handbook* (1981 published by Taisei Sha) and *High-molecular Data Handbook Fundamental* edited by Kobunshi Gakkai (1986 published by Baifukan) can be used.

Specific examples thereof include organosilane compounds (e.g., silane coupling agents such as vinyltrimethoxysilane, vinyltributoxysilane, γ-glycidoxypropyltrimethoxysilane, γ-mercaptopropyltriethoxysilane, γ-aminopropyltriethoxysilane), polyisocyanate compounds (e.g., toluylene diisocyanate, o-toluylene diisocyanate, diphenylmethane diisocyanate, triphenylmethane triisocyanate, polymethylene polyphenyl isocyanate, hexamethylene diisocyanate, isophorone diisocyanate, high-molecular polyisocyanates), polyol compounds (e.g., 1,4-butanediol, polyoxypropylene glycol, polyoxyalkylene glycol, 1,1,1-trimethylol propane), polyamine compounds (e.g., ethylenediamine, γ-hydroxypropylated ethylenediamine, phenylenediamine, hexamethylenediamine, N-aminoethylpiperazine, modified aliphatic polyamines), titanate coupling compounds (e.g., tetrabutoxy titanate, tetrapropoxy titanate, isopropylstearoyl titanate), aluminum coupling compounds (e.g., aluminum butylate, aluminum acetylacetate, aluminum oxide octate, aluminum tris(acetylacetate)), polyepoxy group-containing compounds and epoxy resins (e.g., compounds described in H. Kakiuchi, *New Epoxy Resin* published by Shoko Do (1985), K. Hashimoto, *Epoxy Resin* (1969) published by Nikkan Kogyo Shinbun Sha), melamine resins (e.g., compounds described in I. Miura, H. Matsunaga, *Urea Melamine Resin* (1969) published by Nikkan Kogyo Shinbun Sha) and poly(meth)acrylate compounds (e.g., compounds described in S. Okawara et al., *Oligomer* (1976) published by Kodansha and E. Omori, *Functional Acrylic Resin* (1985) published by Tekuno System).

Specific examples of the polymerizable functional groups of the polyfunctional monomer having at least two polymerizable functional groups (hereinafter referred to as polyfunctional monomer (c)) or the polyfunctional oligomer having at least two polymerizable functional groups used in the above method (2) include $CH_2{=}CHCH_2{-}$, $CH_2{=}CHCOO{-}$, $CH_2{=}CH{-}$; $CH_2{=}C(CH_2)\ COO{-}$, $CH(CH_3){=}CHCOO{-}$, $CH_2{=}CHCONH{-}$, $CH_2{=}C(CH_3)CONH{-}$, $CH_2{=}CHOCO{-}$, $CH(CH_3){=}CHCONH{-}$, $CH_2{=}C(CH_3)OCO{-}$, $CH_2{=}CHCH_2OCO{-}$, $CH_2{=}CHNHCO{-}$, $CH_2{=}CHCH_2NHCO{-}$, $CH_2{=}CHSO_2{-}$, $CH_2{=}CHCO{-}$, $CH_2{=}CHO{-}$ and $CH_2{=}CHS{-}$. The monomer or the oligomer must have at least two polymerizable functional groups. The polymerizable functional groups may be the same of different.

Specific examples of the monomer or oligomer having the same polymerizable functional groups per molecule include styrene derivatives such as divinylbenzene and trivinylbenzene; esters of polyhydric alcohols (e.g., ethylene glycol, diethylene glycol, triethylene glycol, polyethylene glycol #200, polyethylene glycol #400, polyethylene glycol #600, 1,3-butylene glycol, neopentyl glycol, dipropylene glycol, polypropylene glycol, trimethylol propane, trimethylol ethane, pentaerythritol) or polyhydroxyphenols (e.g., hydroquinone, resorcinol, catechol, derivatives thereof) with methacrylic acid, acrylic acid or crotonic acid; vinyl ethers or allyl ethers; vinyl esters and allyl esters of dibasic acids (e.g., malonic acid, succinic acid, glutaric acid, adipic acid, pimelic acid, maleic acid, phthalic acid, itaconic acid); vinyl amides or allyl amides; and condensates of polyamines (e.g., ethylenediamine, 1,3-propylenediamine, 1,4-butylenediamine) with carboxylic acids having vinyl group (e.g., methacrylic acid, acrylic acid, crotonic acid, allylacetic acid).

Examples of the monomer having different polymerizable functional groups or the oligomer having different polymerizable functional groups include ester derivatives having a vinyl groups such as reaction products (e.g., allyloxycarbonylpropionic acid, allyloxycarbonylacetic acid, 2-allyloxycarbonylbenzoic acid, allylaminocarbonylpropionic acid) of carboxylic acids having vinyl group (e.g., methacrylic acid, acrylic acid, methacryloylacetic acid, acryloylacetic acid, methacryloylpropionic acid, acryloylpropionic acid, itaconiloylacetic acid, itaconiloylpropionic acid, carboxylic acid anhydrides) with alcohols or amines, or amide derivatives having vinyl group (e.g., vinyl methacrylate, vinyl acrylate, vinyl itaconate, allyl methacrylate, allyl acrylate, allyl itaconate, vinyl methacryloylacetate, vinyl methacryloylpropionate, allyl methacryloylpropinate, vinyloxycarbonylmethyl methacrylate, vinyloxycarbonylmethyloxycarbonylethylene acrylate, N-allylacrylamide, N-allylmethacrylamide, N-allylitaconic acid amide, methacryloylpropionic acid allylamide) or condensates of aminoalcohols (e.g., aminoethanol, 1-aminopropanol, 1-aminobutanol, 1-aminohexanol, 2-aminobutanol) with carboxylic acids having vinyl group.

The monomer or oligomer having at least two polymerizable functional groups is generally used in an amount of not more than 10 mol %, and preferably not more than 5 mol %, based on the total amount of the monomer (a), the monomer (b) and other monomers.

The crosslinking reaction between high-molecular materials by forming a chemical bond by a reaction between the reactive groups of the high-molecular materials in the above method (3) can be carried out in the same manner as in the reaction of usual organic low-molecular compounds.

It is preferred that the method for forming a network structure is the method (2) using the polyfunctional monomer because monodisperse particles having a uniform particle size can be obtained and fine particles having a particle size of 0.5 μm or smaller can be easily obtained by dispersion polymerization. Namely, the particles can be prepared from the monomer (a), the monomer (b) and/or the polymer (PB), and optionally the polyfunctional monomer (c) by a polymerization granulation reaction. When the polymer (PB) comprising the segment (β) is used, it is preferred that the polymer (PB) is a polymer (PB') having a polymerizable double bond-containing group which is copolymerizable with the monomer (a) on the side chain of the high-molecular main chain or at one end thereof.

The polymerizable double bond-containing group may be any group copolymerizable with the monomer (a). Specific examples thereof include $CH_2{=}C(p){-}COO{-}$, $C(CH_3)H{=}CH{-}COO{-}$, $CH_2{=}C(CH_2COOH){-}COO{-}$, $CH_2{=}C(p){-}CONH{-}$, $CH_2{=}C(p){-}CONHCOO{-}$, $CH_2{=}C(p){-}CONHCONH{-}$, $C(CH_3)H{=}CH{-}CONH{-}$, $CH_2{=}CHCO{-}$, $CH_2{=}CH(CH_2)_n{-}OCO{-}$, (n is an integer of 0 to 3), $CH_2{=}CHO{-}$ and $CH_2{=}CH{-}C_6H_4{-}$ (p is $-H$ or $CH_3$).

The polymerizable group may be directly bonded to the high-molecular chain or may be bonded to the high-molecular chain through a bivalent organic residue. Specific embodiments of these polymers are described in JP-A-61-43757, JP-A-1-257969, JP-A-2-74956, JP-A-1-282566, JP-A-2-173667, JP-A-3-15862 and JP-A-4-70669.

The total amount of the polymerizable compounds is generally about 5 to 80 parts by weight, preferably 10 to 50 parts by weight based on 100 parts by weight of the non-aqueous solvent. The polymerization initiator is generally used in an amount of 0.1 to 5 parts by weight based on the total amount of the polymerizable compounds. The polymerization temperature is generally about 30° to 180° C., preferably 40° to 120° C. The reaction time is preferably 1 to 15 hours.

The case where the photo-curable and/or heat-curable group as a polymer component is contained in the resin (P) or the curable group-containing resin is used in combination with the resin (P) will be illustrated below.

Examples of the polymer component containing at least one photo-curable and/or heat-curable group to be contained in the resin (P) include those described in the above literature. More specifically, examples of the group include the same groups as the above-described polymerizable functional groups.

The amount of the polymer component containing at least one photo-curable and/or heat-curable group to be contained in the polymer is 1 to 95 parts by weight, preferably 10 to 70 parts by weight, based on 100 parts by weight of the polymer segment (β) of the block polymer (resin (P)). It is more preferred that the amount of the polymer component is 5 to 40 parts by weight based on 100 parts by weight of the total amount of the entire polymer components of the copolymer (resin (P)).

When the amount is less than the lower limit, curing does not sufficiently proceed after the formation of the photoconductive layer, the interface between the photoconductive layer and the transfer layer can not be clearly made during the coating of the transfer layer, and the releasability of the transfer layer is adversely affected. When the amount exceeds the upper limit, there is a possibility that electrophotographic characteristics as the binder resin for the photoconductive layer is deteriorated, the original reproducibility of the duplicated image is lowered, and the ground of the non-image area is fogged.

It is preferred that the amount of the photo-curable and/or heat-curable group-containing block copolymer (resin (P)) is not more than 40% by weight based on the total weight of the entire binder resins. When the amount of the resin (P) exceeds 40% by weight, electrophotographic characteristics are liable to be deteriorated.

The fluorine atom and/or silicon atom-containing resin may be used together with a photo-curable and/or heat-curable resin (resin (D)). Examples of the photo-curable and/or heat-curable group of the resin (D) include the above-described curable groups of the block copolymer.

The photo-curable and/or heat-curable resin (D) which can be used in the present invention may be any of conventional curable resins. Examples thereof include resins having the same curable group as that of the block copolymer (resin (P)).

As an embodiment of photoreceptor having releasability previously provided, the overcoat layer or photoconductive layer of the photoreceptor contains the silicon atom and/or fluorine atom-containing resin and optionally other binder resins. It is preferred that the overcoat layer or the photoconductive layer further contains the photo-curable and/or heat-curable resin (D) and/or a small amount of a crosslinking agent to improve the curability of the layer. The amount thereof is generally 0.01 to 20% by weight, preferably 0.1 to 15% by weight, based on 100 parts by weight of the entire binder resins. When the amount is less than 0.01% by weight, an effect of improving the curability of the layer is reduced, while when the amount exceeds 20% by weight, electrophotographic characteristics are adversely affected.

Further, it is preferred that crosslinking agents are used in combination with the resin (D). Compounds which are conventionally used as crosslinking agents can be used in the present invention. Examples of the compounds which can be used as the crosslinking agents include compounds described in S. Yamashita, T. Yamashita, *Crosslinking Agent Handbook* (1981 published by Taisei Sha) and *Kobunshi Data Handbook, Fundamental* edited by Kobunshi Gakkai (1986 published by Baifukan) and those already described above in the examples of the crosslinking agents. Further, polyfunctional polymerizable monomers (e.g., vinyl methacrylate, acryl methacrylate, ethylene glycol diacrylate, polyethylene glycol diacrylate, divinyl succinate, divinyl adipate, diacryl succinate, 2-methylvinyl methacrylate, trimethylol propane methacrylate, divinylbenzene, pentaerythritol polyacrylate) can be used.

It is preferred that the uppermost layer (layer adjacent to the releasable transfer layer in the transfer device) of the present invention is cured. Accordingly, it is desirable that the binder resin (B), the block copolymer (resin (P)), the curable resin (D) and the crosslinking agent are selected so that their functional groups are easily chemically bonded to form a chemical bond between the high-molecular chains.

The combinations of the functional groups which are conventionally known for polymer reactions may be used. Specific examples of the combinations of the functional groups include, but are not limited to, the following combinations of Group A and Group B shown in Table 1 below.

TABLE 1

| Group A | Group B |
|---|---|
| $-COOH$, $-PO_3H_2$, $-OH$, $-SH$, $-NH_2$, $-NHR$, $-SO_3H$ | 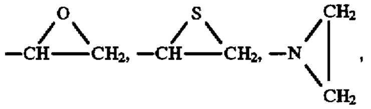 $-COCl$, $-SO_2Cl$, cyclic acid anhydride group, $-N{=}C{=}O$, $-N{=}C{=}S$, 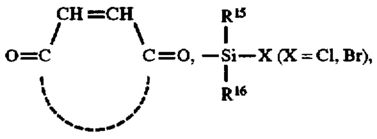 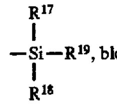, blocked isocyanate group, $-NHCOOR'$ (R': e.g., 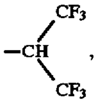, 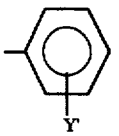 etc.) (Y: $-CH_3$, $-Cl$, $-OCH_3$, etc.) |

TABLE 1-continued

| Group A | Group B |
| --- | --- |
| | 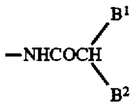 (B[1], B[2] are an electron attractive group), |
| | 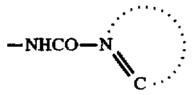 (e.g., imidazole ring, etc.) |

In Table 1, $R^{15}$ and $R^{16}$ each represents an alkyl group; $R^{17}$ to $R^{19}$ each represents an alkyl group or an alkoxy group provided that at least one thereof is an alkoxy group; R represents a hydrocarbon group; and $B^1$ and $B^2$ each represents an electron attractive group such as —CN, —$CF_3$ —$COR^{20}$, —$COOR^{20}$, $^-SO_2OR^{20}$, ($R^{20}$ is a hydrocarbon group of $C_nH_{2n+1}$ (n is an integer of 1 to 4) such as —$CH_2C_6H_5$, —$C_6H_5$.

Reaction accelerators may be optionally used in the present invention to accelerate the crosslinking reaction in the photoreceptive layer.

When the crosslinking reaction is conducted to form a chemical bond between the functional groups, examples of the reaction accelerators include organic acids (e.g., acetic acid, propionic acid, butyric acid, benzenesulfonic acid, p-toluenesulfonic acid), phenols (e.g., phenol, chlorophenol, nitrophenol, cyanophenol, bromophenol, naphthol, dichlorophenol), organometallic compounds (e.g., acetylacetonatozirconium salt, acetylacetone zirconium salt, acetylacetocobalt salt, dibutoxytin dilaurate), dithiocarbamic acid compounds (e.g., diethyl dithiocarbamates), thiuram disulfide compounds (e.g., tetramethylthiuram disulfide) and carboxylic acid anhydrides (e.g., phthalic anhydride, maleic anhydride, succinic anhydride, butylsuccinic anhydride, 3,3',4,4'-benzophenonetetracarboxylic dianhydride, trimellitic anhydride).

When the crosslinking reaction is in the form of a polymerization reaction, examples thereof include polymerization initiators (e.g., peroxides, azobis compounds).

It is preferred that the binder resin of the present invention is photo-cured or heat-cured after the coating of a composition for forming the photoreceptive layer. Heat curing is carried out, for example, by conducting drying under severer conditions than conventional drying conditions during the preparation of the photoreceptor. For example, drying is conducted under higher temperature conditions and/or for a longer time. It is preferred that after the coated solvent is dried, further a heat treatment is conducted. For example, the treatment is conducted at a temperature of 60° to 150° C. for 5 to 120 minutes. When the reaction accelerators are used, the treatment can be carried out under mild conditions.

Photo-curing for curing specific functional groups in the resin by irradiating the resin with light can be conducted by providing a stage of irradiating the resin with actinic rays.

Actinic rays which can be used in the present invention include visible light, ultraviolet light, far ultraviolet rays, electron beams, X-rays, gamma rays and alpha rays. Of these rays, ultraviolet rays are preferred. Light sources which emit light in the wavelength range of 310 to 500 nm are more preferred. Generally, low-pressure, high-pressure or ultra high-pressure mercury vapor lamp and halogen lamp are used. The treatment by irradiation with light is conducted at a distance of 5 to 50 cm for 10 sec to 10 min.

The second method for obtaining photoreceptor having a releasing surface or the method wherein before the toner image 25 is formed, the releasing compound (S) is adsorbed or deposited on the surface of general-purpose electrophotographic photoreceptor 11 to impart releasability thereto will be illustrated below.

Examples of the releasing compound (S) include compounds containing at least fluorine atom and/or silicon atom. Any of low-molecular compounds, oligomers and polymers may be used.

When the compounds are oligomers or polymers, fluorine atom and/or silicon atom may be incorporated in the main chain of the oligomer or the polymer, or fluorine atom and/or silicon atom-containing substituent group may be attached to the side chains thereof.

It is preferred that a block of a repeating unit containing fluorine atom and/or silicon atom is present in the oligomers or polymers because adsorptivity to the surface of photoreceptor and releasability attained thereby are particularly effectively exhibited.

Examples of the fluorine atom and/or silicon atom-containing groups include those already described above in the illustration of the resin (A) for the transfer layer.

Specific examples of the fluorine atom and/or silicon atom-containing compounds (S) which can be used in the present invention include fluorine atom and/or silicon atom-containing organic compounds described in *newly-edited Surfactant Handbook* edited by T. Yoshida (1987 published by Kogaku Tosho), *Newest Surfactant Application Technique* prepared by T. Karime (1990 published by CMC), *Silicone Handbook* edited by K. Ito (1990 published by Nikkan Kogyo Shinbun Sha), *Specially Functional Surfactant* prepared by T. Karime (1986 published by CMC) and A. M. Schwartz et al., *Surface Active Agents and Detergents* Vol. II.

The compounds (S) having desired physical properties used in the present invention can be synthesized by referring to the methods described in N. Ishikawa, *Synthesis and Function of Fluorine Compound* (1987 published by CMC), *Fluorine containing Compound, Synthesis and Application* edited by J. Hirano (1991 published by Gijutsu Joho Kyokai), *Organosilicon Strategic Data* Chapter 3 prepared by M. Ishikawa (1991 published by Science Forum).

Specific examples of the fluorine atom and/or silicon atom-containing polymer component include, but are not limited to, the polymer units (F) already described above in the illustration of the resin (A).

When the compound (S) is an oligomer or a polymer, that is, a block polymer, the fluorine atom and/or silicon atom-containing polymer component may be present in any form, so long as the polymer component is bonded as a block. The term "bonded-as a block" as used herein refers to that a polymer segment containing at least 70% by weight of the fluorine atom and/or silicon atom-containing polymer component is present in the chain of the polymer. Examples of the block include A-B type block, A-B-A type block, B-A-B type block, graft type block and star type block as described above in the illustration of the resin (A).

The compound (S) can be adsorbed or deposited on the surface of the electrophotographic photoreceptor 11 by conventional methods. It is preferred that a means for allowing the compound (S) to be adsorbed or deposited is incorporated in the apparatus used in the present invention.

Examples of the means include systems such as air doctor coater, blade coater, knife coater, squeeze coater, dip coater, reverse roll coater, transfer roll coater, gravure coater, kiss roll coater, spray coater, curtain coater and calender coater described in Y. Harasaki, *Coating Engineering* (1971 published by Asakura Shoten), Y. Harasaki, *Coating System* (1979 published by Maki Shoten) and H. Fukata, *Practical of Hot-Melt Adhesion* (1979 published by Kobunshi Kankokai).

Further, there can be used a method wherein cloth, paper or a felt impregnated with the compound (S) is brought into close contact with the photoreceptor 11; a method wherein a curable resin impregnated with the compound (S) is press-contacted with the photoreceptor 11; a method wherein the photoreceptor 11 is wetted with a solution of the compound (S) in a non-aqueous solvent, and the solvent is dried; and a method wherein a dispersion of the compound (S) in a non-aqueous solvent is deposited on the photoreceptor 11 by electrophoretic deposition in the same manner as wet electrodeposition system described hereinafter.

Furthermore, the surface of the photoreceptor 11 is uniformly wetted with a non-aqueous solution of the compound (S) by ink jet system and then dried, whereby the compound (S) can be adsorbed by the surface of the photoreceptor or deposited on the surface thereof. The method using the ink jet system can be accomplished by the method described in S. Ono, *Non-impact Printing* (1986 published by C.M.C.).

Examples thereof include a continuous jet type system such as Sweet system and Hertz system, an intermittent jet type system such as Winston system, an ink-on-demand type system such as pulse jet system, a bubble jet system, and an ink mist type system such as mist system.

In any case, the compound (S) is directly or diluted with a solvent and charged into an ink tank and/or an ink head cartridge in place of ink. Usually, ink has a viscosity of 1 to 10 cP and a surface tension of 30 to 60 dyne/cm. If desired, surfactants may be added, and ink may be heated. In conventional ink jet printers, the orifices provided in the head thereof are about 30 to 100 μm, and flying ink has about the same particle size. In the present invention, the size may be larger than that described above. In this case, the amount of discharged ink is increased, and hence the coating time can be shortened. Further, multi-nozzle is very effective in shortening the coating time.

Silicone rubber may be used as the compound (S). Preferably, silicone rubber is wound on a metallic core to form a silicone rubber, and the roller may be pressed against the surface of the photoreceptor. Nip pressure is 0.5 to 10 $kgf/cm^2$, and contact time is 1 sec to 30 min. In this case, the photoreceptor and/or the silicone rubber roller may be heated to 150° C. or lower. It is considered that a part of a low-molecular component of silicone rubber is transferred from the surface of the roller to the surface of the photoreceptor 11 by pressing. Silicone rubber may be swollen by silicone oil. Silicone rubber may be in the form of a sponge, and the sponge roller may be impregnated with silicone oil or silicone surfactant solution.

Further, various systems can be used depending on the types (liquid, waxy material, solid) of the compounds (S) to be used without being limited to the above-described methods. If desired, the fluidity of the compounds (S) can be adjusted by using a heating medium.

In the present invention, the compounds (S) are adsorbed or deposited on the surface of the electrophotographic photoreceptor 11 to impart releasability to the surface (thereby the surface has adhesion of preferably 100 g.f or below) before the toner image is formed by the electrophotographic process. It is not necessary that this stage (adsorbing a deposition of the compound (S)) is repeated in the color image forming stage of the present invention. The stage of imparting releasability may be appropriately chosen by a combination of a means for imparting releasability and an ability of retaining releasability imparted by the deposition or adsorption of the compound (S) and the photoreceptor 11 to be used.

The amount of the compound (S) to be adsorbed or deposited on the surface of the photoreceptor 11 is not specified, but the compound (S) is used in such an amount that the electrophotographic characteristics of the photoreceptor 11 are not adversely affected. Usually, the coated thickness of 1 μm or below is suffice to provide the desired property. The development of adhesion in the present invention will be suffice in the state of "weakboudary layer" defined by Bikeman The Science of Adhesive Joint Academic Press (1961).

Any of conventional photoconductors can be used in the electrophotographic photoreceptor 11 used in the present invention.

For example, photoconductors can be used which are described in *Foundation and Application of Electrophotographic Technique* edited by Denshi Shashin Gakkai (1988 published by Corona) and *Newest Photoconductive Material and Development and Practical Use of Photoconductor* edited by H. Komon (1985 published by Nippon Kagaku Joho KK).

Namely, a single layer composed of a photoconductive compound itself and a photoconductive layer composed of a photoconductive compound dispersed in a binder resin can be used. The photoconductive layer composed of a photoconductive compound dispersed in a binder resin may be a single layer or a laminated layer. Photoconductive compounds used in the present invention may be any of inorganic compounds and organic compounds.

Examples of the inorganic compounds which can be used as photoconductive compounds in the present invention include conventional photoconductive compounds such as amorphous silicon, zinc oxide, titanium oxide, zinc sulfide, cadmium sulfide, selenium, selenium-tellurium and silicon lead sulfide.

When inorganic photoconductive compounds such as zinc oxide and titanium oxide are used as the photoconductive compounds, the binder resin is generally used in an amount of 10 to 100 parts by weight, preferably 15 to 40 parts by weight, based on 100 parts by weight of the inorganic photoconductive compound.

Any of conventional organic photoconductive compounds can be used. More specifically, there are known photoconductive layers mainly composed of an organic photoconductive compound, a sensitizing dye and a binder resin (first embodiment) described in JP-B-37-17162, JP-B-62-51462, JP-A-52-2437, JP-A-54-19803, JP-A-56-107246 and JP-A-57-161863. There are also known photoconductive layers mainly composed of a charge generating agent, a charge transporting agent and a binder resin (second embodiment) as described in JP-A-56-146145, JP-A-60-17751, JP-A-60-17752, JP-A-60-17760, JP-A-60-254142 and JP-A-62-54266, and photoconductive layers composed of a two layer structure wherein a charge generating agent and a charge transporting agent are separately contained in separate layers as described in JP-A-60-230147, JP-A-60-230148 and JP-A-60-238853.

The electrophotographic photoreceptor of the present invention may be in any form of the above-described two types of the photoconductive layers.

Examples of the organic photoconductive compounds which can be used in the present invention include (a) triazole derivatives described in U.S. Pat. No. 3,112,197, (b) oxadiazole derivatives described in U.S. Pat. No. 3,183,447, (c) imidazole derivatives described in JP-B-37-16096, (d) polyarylalkane derivatives described in U.S. Pat. Nos. 3,615,402, 3,820,989 and 3,542,544, JP-B-45-555, JP-B-51-10983, JP-A-51-93224, JP-A-55-108667, JP-A-55-156953 and JP-A-56-36656, (e) pyrazoline derivatives and pyrazolone derivatives described in U.S. Pat. Nos. 3,180,729 and 4,278,746, JP-A-55-88064, JP-A-55-88065, JP-A-49-105537, JP-A-55-51086, JP-A-56-80051, JP-A-56-88141, JP-A-57-45545, JP-A-54-112637 and JP-A-55-74546, (f) phenyldiamine derivatives described in U.S. Pat. No. 3,615,404, JP-B-51-10105, JP-B-46-3712, JP-B-47-28336, JP-A-54-83435, JP-A-54-110836 and JP-A-54-119925, (g) arylamine derivatives described in U.S. Pat. Nos. 3,567,450, 3,180,703, 3,240,597, 3,658,520, 4,232,103, 4,175,961 and 4,012,376, JP-B-49-35702, West German Patent (DAS) 1,110,518, JP-B-39-27577, JP-A-55-144250, JP-A-56-119132 and JP-A-56-22437, (h) amino-substituted chalcone derivatives described in U.S. Pat. No. 3,526,501, (i) N,N-bicarbazyl derivatives described in U.S. Pat. No. 3,542,546, (j) oxazole derivatives described in U.S. Pat. No. 3,257,203, (k) styryl anthracene derivatives described in JP-A-56-46234, (l) fluorenone derivatives described in JP-A-54-110837, (m) hydrazone derivatives described in U.S. Pat. No. 3,717,462, JP-A-54-59143 (corresponding to U.S. Pat. No. 4,150,987), JP-A-55-52063, JP-A-55-52064, JP-A-55-46760, JP-A-55-85495, JP-A-57-11350, JP-A-57-148749 and JP-A-57-104144, (n) benzidine derivatives described in U.S. Pat. Nos. 4,047,948, 4,047,949, 4,265,990, 4,273,846, 4,299,897 and 4,306,008, (o) stilbene derivatives described in JP-A-58-190953, JP-A-59-95540, JP-A-59-97148, JP-A-59-195658 and JP-A-62-36674, (p) polyvinyl carbazole and derivatives thereof described in JP-B-34-10966, (q) vinyl polymers such as polyvinyl pyrene, polyvinyl anthracene, poly-2-vinyl-4-(4'-dimethylaminophenyl)-5-phenyl-oxazole and poly-3-vinyl-N-ethylcarbazole described in JP-B-43-18674 and JP-B-43-19192, (r) polymers such as polyacenaphthylene, polyindene and a copolymer of acenaphthylene and styrene described in JP-B-43-19193, (s) condensate resins such as pyrene-formaldehyde resin, bromopyrene-formaldehyde resin and ethyl- carbazole-formaldehyde resin described in JP-B-58-13940, and (t) triphenylmethane polymers described in JP-A-56-90833 and JP-A-56-161550.

All organic photoconductive compounds conventionally known can be used in the present invention without being limited to the above-described organic photoconductive compounds (a) to (t). These organic photoconductive compounds may be used in combination of two or more of them.

Sensitizing dyes conventionally used in the electrophotographic photoreceptors can be used as the sensitizing dyes to be contained in-the photoconductive layers described above in the first embodiment. The sensitizing dyes are described in *Electrophotography* 12 9 (1973) and *Organic Synthesis Chemistry* 24(11) 1010 (1966). Specific examples of the sensitizing dyes which can be used in the photoconductive layers include pyrylium dyes described in U.S. Pat. Nos. 3,141,770 and 4,283,475, JP-A-48-25658 and JP-A-62-71965; triarylmethane dyes described in *Applied Optics Supplement* 350 (1969) and JP-A-50-39548; cyanine dyes described in U.S. Pat. No. 3,597,196; and styryl dyes described in JP-A-60-63047, JP-A-59-164588 and JP-A-60-252517.

Examples of the charge generating agent to be contained in the photoconductive layers described above in the second embodiment include organic and inorganic charge generating agents conventionally used in the electrophotographic photoreceptors. Specific examples of the charge generating agents which can be used in the photoconductive layers include selenium, selenium-tellurium, cadmium sulfide, lead oxide and organic pigments described in the following (1) to (9).

(1) Azo dyes such as monoazo, bis-azo and trisazo dyes described in U.S. Pat. Nos. 4,436,800 and 4,439,506, JP-A-47-37543, JP-A-58-123541, JP-A-58-192042, JP-A-58-219263, JP-A-59-78356, JP-A-60-179746, JP-A-61-148453, JP-A-61-238063, JP-B-60-5941 and JP-B-60-45664.

(2) Phthalocyanine pigments such as metal-free or metal phthalocyanine pigments described in U.S. Pat. Nos. 3,397,086 and 4,666,802, JP-A-51-90827 and JP-A-52-55643.

(3) Perylene pigments described in U.S. Pat. No. 3,371,884 and JP-A-47-30330.

(4) Indigo and thioindigo derivatives described in U.K. Patent No. 2,237,680 and JP-A-47-30331.

(5) Quinacridone pigments described in U.K. Patent 2,237,679 and JP-A-47-30332.

(6) Polycyclic quinone pigments described in U.K. Patent 2,237,678, JP-A-59-184348, JP-A-62-28738 and JP-A-47-18544.

(7) Bisbenzimidazole pigments described in JP-A-47-30331 and JP-A-47-18543.

(8) Squalium salt pigments described in U.S. Pat. Nos. 4,396,610 and 4,644,082.

(9) Azulenium salt pigments described in JP-A-59-53850 and JP-A-61-212542.

These compounds may be used either alone or in combination of two or more of them.

With regard to the mixing ratio of the organic photoconductive compound and the binder resin, the upper limit of the organic photoconductive compound is determined by the compatibility of the organic photoconductive compound with the binder resin. When the amount of the photoconductive compound exceeds the upper limit, the crystallization of the organic photoconductive compound occurs. Electrophotographic sensitivity is lowered as the content of the organic photoconductive compound is reduced. Accordingly, it is desirable that the amount of the organic photoconductive compound is increased to such a degree that the crystallization thereof does not occur. The content of the organic photoconductive compound is 5 generally to 120 parts by weight, preferably 10 to 100 parts by weight based on 100 parts by weight of the binder resin. The organic photoconductive compounds may be used either alone or as a mixture of two or more of them.

Any of resins conventionally used in the electrophotographic photoreceptors can be used as the binder resin (B) used in the electrophotographic photoreceptor 11 used in the present invention. The weight-average molecular weight of the binder resin is preferably $5\times10^3$ to $1\times10^6$, more preferably $2\times10^4$ to $5\times10^5$. The binder resin has a glass transition point of preferably from −40° C. to +200° C., more preferably from −10° C. to +140° C. Examples of conventional binder resins used in the electrophotographic photoreceptive layers include compounds described in T. Shibata, J. Ishiwatari, *Kobunshi* Vol. 17, page 278 (1968), H. Miyamoto, H. Takei, *Imaging* 1973 (No. 8), K. Nakamura,

*Practical Technique of Binder for Recording Material* (1985 published by C.M.C.), *Proceedings of Symposium of Current Electrophotographic Organic Photoreceptor* edited by Denshi Shashin Gakkai (1985), *Development and Practical Use of Newest Photoconductive Material and Photoreceptor* edited by H. Komon (1986 published by Nippon Kagaku Joho KK), *Foundation and Application of Electrophotograhic Technique* Chapter 5, edited by Denshi Shashin Gakkai (1988 published by Corona KK), D. Tatt, S. C. Heidecker, Tappi, 49 (No. 10), 439 (1966), E. S. Baltazzi, R. G. Blanclotteet et al., *Phot. Sci. Eng.* 16, (No. 5), 354 (1972) and I. Shimixu et al., *Denshi Shashin Gakkai Shi* 18 (No. 2), 22 (1980).

Specific examples of the binder resins include olefin polymers and copolymers, vinyl chloride copolymers, vinylidene chloride copolymers, polymers and copolymers of vinyl esters of alkane acids, polymers and copolymers of allyl esters of alkane acids, polymers and copolymers of styrene and derivatives thereof, butadiene-styrene copolymers, isoprene-styrene copolymers, butadiene-unsaturated carboxylic acid ester copolymers, acrylonitrile copolymers, methacrylonitrile copolymers, alkyl vinyl ether copolymers, acrylic ester polymers and copolymers, methacrylic ester polymers and copolymers, styrene-acrylic ester copolymers, styrene-methacrylic ester copolymers, itaconic diester polymers and copolymers, maleic anhydride copolymers, acrylamide copolymers, methacrylamide copolymers, hydroxyl group-modified silicone resins, polycarbonate resins, ketone resins, polyester resins, silicone resins, amide resins, hydroxyl- and carboxyl group-modified polyester resins, butyral resins, polyvinyl acetal resins, cyclized rubber-methacrylic ester copolymers, cyclized rubber-acrylic ester copolymers, copolymers having a heterocyclic ring having no nitrogen atom (examples of the heterocyclic ring include furan ring, tetrahydrofuran ring, thiophene ring, dioxane ring, dioxofuran ring, lactone ring, benzfuran ring, benzthiophene ring, 1,3-dioxetane ring) and epoxy resins.

Further, there can be-used resins described in T. Endo, *Precision of Thermosetting High-molecular Material* (1986 published by C.M.C.), Y. Harasaki, *Newest Binder Technique Handbook* Chapter I-II (1985 published by Sogo Gijutsu Center), T. Otsu, *Synthesis, Design and New Use of Acrylic Resin* (1985 published by Chubu Keiei Kaihatsu Center Publishing Department) and E. Omori, *Functional Acrylic Resin* (1985 published by Technosystem).

When resins having an acid group such as carboxyl group, sulfo group or phosphono group and having a relatively low molecular weight (about $1\times10^3$ to $1\times10^4$) are used as the binder resins (B) for the photoreceptors, electrostatic characteristics can be improved. Examples of the resins include resins wherein an acid group-containing polymer component is randomly present in the main chain of the polymer as described in JP-A-63-217354; resins having an acid group at the one terminal of the polymer main chain as described in JP-A-64-70761; resins wherein an acid group is bonded to the terminals of the main chain of a graft copolymer and resins wherein an acid group is attached to the grafted moiety of a graft copolymer as described in JP-A-2-67563, JP-A-2-236561, JP-A-2-238458, JP-A-2-236562 and JP-A-2-247656; and AB type block copolymers having blocks having an acid group as described in JP-A-3-181948.

It is preferred that medium- to high-molecular resins are used together with the above low-molecular resins when a photoconductive layer having a sufficient mechanical strength can not be obtained by the use of the above low-molecular resins alone. Examples of the medium- to high-molecular resins include thermosetting resins having a crosslinked structure between polymer chains as described in JP-A-2-68561, resins having partially a crosslinked structure as described in JP-A-2-68562, and resins having an acid group at terminals of graft polymer main chain as described in JP-A-2-69759. Further, stable performances can be obtained by using specific medium- to high-molecular resins even when environment is greatly fluctuated. Examples of such types of resins as described above include resins wherein an acid group is attached to the terminal of the grafted moiety of a graft copolymer or resins wherein an acid group is present in the grafted moiety of a graft copolymer as described in JP-A-3-29954, JP-A-3-77954, JP-A-3-92861 and JP-A-3-53257; and graft copolymers wherein an AB type block copolymer component composed of a block A having an acid group and a block B having no acid group is present in the grafted moiety of the polymer as described in JP-A-3-206464 and JP-A-3-223762. When these specific resins are used, the photoconductor can be uniformly dispersed, a photoconductive layer having good smoothness can be formed, and excellent electrostatic characteristics can be kept even when environment is changed or a scanning exposure system using semiconductor laser beam is used.

The thickness of the photoconductive layer is preferably 1 to 100 μm, particularly preferably 10 to 50 μm. When the photoconductive layer is used as the charge generating layer of the laminated type photoreceptor comprising the charge generating layer and the charge transporting layer, the thickness of the charge generating layer is preferably 0.01 to 5 μm, particularly preferably 0.05 to 2 μm.

Various dyes can be used as spectral sensitizing agents according to the types of light sources for exposure such as exposure to visible light or semiconductor laser beam. Examples of the dyes which can be used as the spectral sensitizing agents include carbonium dyes, diphenylmethane dyes, triphenylmethane dyes, xanthene dyes, phthalein dyes, polymethine dyes (e.g., oxonol dyes, merocyanine dyes, cyanine dyes, rhodacyanine dyes, styryl dyes) and phthalocyanine dyes (which may be metal phthalocyanine) described in H. Miyamoto, H. Takei, *Imaging* 1973 (No. 8), page 12, C. J. Young et al., RCA Review 15 page 469 (1954), K. Kiyota et al., *Denki Tsushin Gakkai Ronbunshu* J63-C (No. 2), page 97 (1980), Y. Harasaki et al., *Kogyo Kagaku Zasshi* pages 78 and 188 (1963) and T. Tani, *Nippon Shashin Gakkai Shi* 35, page 208 (1972).

More specifically, examples of carbonium dyes, triphenylmethane dyes, xanthene dyes and phthalein dyes are described in JP-B-51-452, JP-A-50-90334, JP-A-50-114227, JP-A-53-39130, JP-A-53-82353, U.S. Pat. Nos. 3,052,540 and 4,054,450 and JP-A-57-16456.

Polymethine dyes such as oxonol dyes, merocyanine dyes, cyanine dyes and rhodacyanine dyes which can be used as the spectral sensitizing agents include dyes described in F. M. Harmer, *The Cyanine Dyes and Related Compounds*. Specific Examples of these dyes are described in U.S. Pat. Nos. 3,047,384, 3,110,591, 3,121,008, 3,125,447, 3,128,179, 3,132,942 and 3,622,317, U.K. Patents 1,226,892, 1,309,274 and 1,405,898, JP-B-48-7814 and JP-B-55-18892.

Further, polymethine dyes which spectral-sensitize light in the near infrared to infrared region of long wavelengths of 700 nm or above include dyes described in JP-A-47-840, JP-A-47-44180, JP-B-51-41061, JP-B-49-5034, JP-B-49-45122, JP-B-57-46245, JP-B-56-5141, JP-A-57-157254, JP-A-61-26044, JP-A-61-27551, U.S. Pat. Nos. 3,619,154 and 4,175,956 and *Research Disclosure* (1982) 216, pages 117 to 118.

Conventional additives for the electrophotographic photoreceptors may be optionally used.

Examples of the additives include chemical sensitizing agents for improving electrophotographic sensitivity, plasticizers for improving film forming properties, and surfactants.

Examples of the chemical sensitizing agents include electron attractive compounds such as halogen, benzquinone, chloranil, fluoran, bromanil, dinitrobenzene, anthraquinone, 2,5-dichlorobenzquinone, nitrophenol, tetrachlorophthalic anhydride, 2,3-dichloro-5,6-dicyanobenzquinone, dinitrofluorenone, trinitrofluorenone and tetracyanoethylene, polyarylalkane compounds described in H. Komon, *Development and Practical Use of Newest Photoconductive Material and Photoconductor* Chapters 4 to 6 (1986 published by Nippon Kagaku Joho Publishing Department), hindered phenol compounds and p-phenylenediamine compounds. Further, compounds described in JP-A-58-65439, JP-A-58-102239, JP-A-58-129439 and JP-A-62-71965 can be used.

Examples of the plasticizers include dimethyl phthalate, dibutyl phthalate, dioctyl phthalate, triphenyl phthalate, triphenyl phosphate, diisobutyl adipate, dimethyl sebacate, butyl laurate, methyl phthalyl glycolate and dimethyl glycol phthalate. The plasticizers are used to improve the flexibility of the photoconductive layer. The plasticizers may be added in such an amount that the electrostatic characteristics of the photoconductive layer are not deteriorated.

These additives are usually used in an amount of 0.001 to 2.0 parts by weight per 100 parts by weight of the photoconductor, though there is no particular limitation with regard to the amount added.

The photoconductive layer 2 of the present invention can be provided on conventional support 1. It is generally preferred that the support 1 for the electrophotographic photoreceptive layer is electrically conductive. Conventional electrically conductive support can be used. Examples of the support include supports obtained by subjecting a substrate such as metal, paper or plastic sheet to an electrical conductivity imparting treatment wherein the substrate is impregnated with a low resistant material; supports obtained by imparting electrical conductivity to the back side (side opposite to the side on which the photoreceptive layer is provided) of the support, and optionally coating at least one layer thereon to prevent curling; supports obtained by optionally providing at least one precoat layer on the surface layer of the above support; and supports obtained by depositing metal such as Al on a plastic sheet and laminating the resulting electrically conductive plastic substrate onto paper.

Electrically conductive supports and electrical conductive materials are described in Y. Sakamoto, *Electrophotography* 14 (No. 1), pages 2 to 11 (1975), H. Moriga, *Introduction of Chemistry of Specific Paper* (1975 published by Kobunshi Kankokai) and M. F. Hoover, *J. Macromol. Sci. Chem.* A-4 (6), pages 1327 to 1417 (1970).

It is preferred that before the toner image 25 is formed, the surface of the electrophotographic photoreceptor 11 has good releasability, said surface being brought into contact with the transfer layer 12 as described above. It can be confirmed by adhesion measured according to JIS Z0237-1980, "Testing Method of Adhesive Tape Adhesive Sheet" whether releasability is good or poor. The electrophotographic photoreceptor 11 having a releasing surface used in the present invention has adhesion of preferably 100 gram.force (g.f) or below, more preferably 50 g.f or below, particularly preferably 30 g.f or below as measured according to the above testing method.

In the present invention, the toner image 25 is formed on the electrophotographic photoreceptor 11 having a releasing surface by an electrophotographic process. Namely, each process of charging—exposure to light—development—fixing is carried out by conventional manner.

Conventional methods and apparatus can be used in the present invention to form the toner image 25 by an electrophotographic process.

Conventional developers for electrostatic photography can be used in the present invention. Any of dry developers and liquid developers can be used.

Examples of the developers are described in the aforesaid *Foundation and Application of Electrophotographic Technique*, pages 497 to 505, *Development and Practical Use of Toner Material* Chapter 3, prepared by K. Nakamura (1985 published by Nippon Kagaku Joho Sha), H. Machida, *Recording Material and Photosensitive Resin*, pages 107 to 127 (1983) and *Imaging* No. 2-5, *Development, Fixing, Charging and Transfer of Electrophotograph* edited by Denshi Shashin Gakkai (published by Gakkai Shuppan Center).

Single-component toners, two-component toners, single-component non-magnetic toners and capsule toners as dry developers are put to practical use.

More preferably, a combination of a scanning exposure system wherein exposure is conducted by laser beam on the basis of digital information, with a development system using a liquid developer is an effective process because a highly fine image can be formed. An example thereof is given below.

First, the photoreceptor 11 is positioned on a flat bed by a register pin system, and then fixed by conducting suction from the back side thereof by means of air suction. Subsequently, the photoreceptor 11 is charged by using a charging device (e.g., a device described in *Foundation and Application of Electrophotographic Technique*, from page 212 edited by Denshi Shashin Gakkai, published by Corona, Jun. 15, 1988). Corothoron or scorothoron system is generally used. It is preferred that charging conditions are controlled by applying feedback on the basis of information obtained from a charging potential detecting means so that the surface potential of the photoreceptor 11 is kept in a desired range.

Subsequently, scanning exposure is carried out by using laser beam according to the system described in the above literature. First, an image corresponding to yellow of four colors separated from a color image is converted into a dot pattern and exposed to light. Toner development is then carried out by using a liquid developer. The photoreceptor 11 charged and exposed on a flat bed may be removed therefrom and subjected to direct wet development described in the above literature (see, from page 254). Exposure mode is conducted according to toner image development mode. For example, when reversal development is to be conducted, a negative image, that is, the image area is irradiated with laser beam, and development is carried out by using a toner having the same polarity chargeability as in the charging of photoreceptor. Development bias voltage is applied thereto to deposit the toner on the exposed area. The details of the theory thereof are described in the above literature (see, from page 157).

After development, squeezing is conducted to remove an excess of the developer, and drying is then carried out. It is preferred that rinsing is conducted by a carrier liquid for the developer before squeezing is conducted.

The above-described process is repeated for each of magenta, cyan and black colors, whereby a full color image having four colors can be obtained on the photoreceptor 11.

The wet developer comprises basically an electrical insulating organic solvent (e.g., isoparaffinic aliphatic hydrocarbons such as Isopar H, Isoper G (products of Exxon), Shell Sol 70, Shell Sol 71 (products of Shell Oil), IP-solvent 1620 (a product of Idemitsu Sekiyu Kagaku KK)) as a dispersion medium, an inorganic or organic pigment or a dye as a colorant and a resin such as an alkyd resin, an acrylic resin, a polyester resin, a styrene-butadiene resin or rosin for imparting dispersion stability, fixing properties and chargeability. If desired, various additives are optionally added thereto to improve charging characteristics and image characteristics.

Conventional dyes and pigments can be used as colorants in the present invention. Examples of the pigments and the dyes which can be used as the colorants include benzidine, azo, azomethine, xanthene, anthraquinone, phthalocyanine (including metal phthalocyanines), titanium white, nigrosine, aniline black and carbon black.

Examples of the additives include those described in Y. Harasaki, *Electrophotography*, Vol. 16, No. 2, page 44. Specific examples of the additives include, but are not limited to, di-2-ethylhexyl metal sulfosuccinates, but are not limited to, di-2-ethylhexyl metal sulfosuccinates, metal naphthenates, metal salts of higher fatty acids, metal alkylbenzenesulfonates, metal alkylphosphates, lecithin, polyvinyl pyrrolidone, copolymers containing half malamide component, cumaroneindene resin, higher alcohols, polyethers, polysiloxanes and wax.

The amounts of main ingredients to be contained in the wet developer are usually as follows:

In the toner particles comprising mainly a resin (optionally a colorant), the resin is used in an amount of preferably 0.5 to 50 parts by weight based on 1,000 parts by weight of the carrier liquid. When the amount is less than 0.5 parts by weight, the resulting image density is insufficient, while when the amount is more than 50 parts by weight, the non-image area is liable to be fogged. The above-described carrier liquid-soluble resins for dispersion stabilization may be optionally used. The resins are used in an amount of about 0.5 to 100 parts by weight based on 1,000 parts by weight of the carrier liquid. The charge controlling agents are used in an amount of preferably 0.001 to 1.0 part by weight based on 1,000 parts by weight of the carrier liquid. If desired, various additives may be added to the developer. The upper limit of the total amount of the additives is determined by the electrical resistance of the liquid developer. Namely, when the electrical resistance of the liquid developer after the removal of the toner particles is lower than $1\times10^9$ Ω.cm, a continuous gradation image of good quality is difficultly obtained, and hence the amounts of the additives are controlled so as not to provide an adverse effect.

A specific example of the method of the preparation of the wet developer includes a method wherein a colorant and a resin are mechanically dispersed in a dispersion mixer such as a sand mill, a ball mill, a jet mill or an attritor to obtain colored particles as described in JP-B-35-5511, JP-B-35-13424, JP-B-50-40017, JP-A-49-98634, JP-A-58-129438 and JP-A-61-180248.

Other example of the preparation of the colored particles includes a method wherein monodisperse resin particles having a fine particle size are prepared by a non-aqueous dispersion polymerization method, and the resin particles are colored.

JP-A-57-48738 discloses a coloring method wherein dispersed resins are dyed by appropriate dyes. Other examples of coloring methods include a method wherein dispersed resins and dyes are chemically bonded to each other as described in JP-A-53-54029; and a method wherein when resins are prepared by a polymerization granulation method, monomers containing previously dyes are used to prepare dye-containing copolymers as described in JP-B-44-22955.

In the present invention, the transfer layer 12 is formed on the photoreceptor 11 having the mono-color or multi-color image 25 formed thereon. The formation of the transfer layer 12, the stage of electrophotographic process and the stage of transfer process may be separately carried out. However, it is preferred that these stages are carried out in the same apparatus. The transfer layer 12 can be formed on the surface of the photoreceptor 11 by hot-melt coating, electrodeposition or transfer method as described above. These methods are preferred from the standpoint of being capable of easily forming the transfer layer 12 on the surface of the photoreceptor 11 in the same apparatus.

Each method of forming the transfer layer will be illustrated in greater detail below.

The hot-melt coating method is a method wherein a composition for forming the transfer layer is coated on the surface of the photoreceptor 11 by hot-melt coating in conventional manner. For this purpose, a solvent-free coater such as the mechanism of heating hot-melt coater for hot-melt adhesion described in the aforesaid *Practical of Hot-Melt Adhesion* (pages 197 to 215) is modified so as to be capable of being applied to photoreceptor drum coating. Examples of the coater include direct roll coater, offset gravure coater, rod coater, extrusion coater, slot orifice coater and curtain coater.

The molten temperature of thermoplastic resins during coating is optimized according to the composition of the thermoplastic resin to be used, but is usually in the range of 50° to 180° C. It is desirable that the resin is pre-molten in a closed preheater provided with an automatic temperature controlling means, and the temperature of the resin is raised to the optimum temperature in place in a short period of time, whereby a change in the properties of the thermoplastic resin can be prevented from being caused, and unevenness in coating can be prevented from being caused.

Coating rate varies depending on the fluidity of the thermoplastic resin during hot melting, coating system and coating amount, but is usually 1 to 100 mm/sec, preferably 5 to 40 mm/sec.

Electrodeposition coating method will be illustrated below. In this method, the above thermoplastic resin in the form of resin particles is electrostatically deposited or electrodeposited (hereinafter referred to sometimes as electrodeposition) on the surface of the photoreceptor 11, and a uniform thin film is formed, for example, by heating to form the transfer layer 12.

Accordingly, it is necessary that the thermoplastic resin particles are positively or negatively charged. The polarity of the resin particles is determined by the chargeability of the electrophotographic photoreceptor to be combined with the resin.

The resin particles have physical properties meeting the above requirements, and an average particle size of usually 0.01 to 15 μm, preferably 0.05 to 5 μm, more preferably 0.1 to 1 μm. The particles may be in any form of a powder (dry deposition) and a non-aqueous dispersed resin particle (wet deposition) during electrodeposition. However, the non-aqueous dispersed resin particle is preferred because the thickness of the transfer layer can be uniformly adjusted to a thin film.

The resin particles used in the present invention can be prepared by conventional mechanical pulverizing method or polymerization granulation method. The particles obtained by these methods can be applied to any of dry electrodeposition and wet electrodeposition.

When the powder for use in the dry electrodeposition method is prepared, mechanical pulverization methods includes a method wherein particles are directly pulverized in conventional pulverizer to obtain fine particles (e.g., a method using a ball mill, a paint shaker or a jet mill). If desired, materials for resin particles are mixed, molten, kneaded and pulverized. The particles may be classified, or the surfaces of the particles may be treated. Further, a spray drying method may be used.

More specifically, there can be used methods described in *Granulation Handbook* Chapter 11 edited by Nippon Funtai Kogyo Gijutsu Kyokai (1991 published by Ohm), *Practice of Newest Granulation Technique* (1984 published by Kanagawa Keiei Kaihatsu Center Publishing Department) and *Design and Technique of Newest Powder* edited by M. Arakawa (1988 published by Techno System).

Examples of the polymerization granulation method include conventional methods such as aqueous emulsion polymerization reaction, seed polymerization reaction, suspension polymerization reaction and non-aqueous dispersion polymerization reaction.

More specifically, particles are prepared by the methods described in S. Muroi, *Chemistry of High-Molecular Latex* (1970 published by Kobunshi Kankokai), T. Okuda, H. Inagaki, *Synthetic Resin Emulsion* (1978 published by Kobunshi Kankokai), S. Muroi, *Introduction to High-Molecular Latex* (1983 published by Kobunsha), I. Piirma, P. C. Wang, *Emulsion Polymerization*, I. Piirma and J. L. Gavdon, *ACS Symp. Sev.* 24, P34 (1974), F. Kitahara et al., *Dispersion Emulsion Chemistry* (1979 published by Kogaku Tosho) and *Top Technique of Ultrafine Particle Polymer* prepared by S. Muroi (1991 published by C.M.C.). These particles can be powdered by the methods described in the above literature.

The dry electrodeposition of the resulting fine particles can be carried out by conventional electrostatic powder coating methods or conventional development methods of dry developers for electrostatic photography. For example, dry electrodeposition can be carried out by methods for electrodepositing fine particles charged by corona charging, friction charging, induction charging, ionic atmospheric charging and counter ionization phenomenon utility described in J. F. Hughes *Electrostatic Powder Coating* or development methods such as cascade method, magnetic brush method, far brush method, electrostatic method, induction method, touch down method and powder cloud method described in *Development and Practical Use of New Electrophotorgraphic Development System and Toner Material* edited by K. Nakamura (1985 published by Nippon Kagaku Joho KK).

The non-aqueous dispersed resin particles used in wet electrodeposition can be prepared by any of the mechanical pulverization method and the polymer granulation method.

Examples of the mechanical pulverization method include a method wherein particles together with a dispersing polymer are dispersed in a dispersion device (e.g., ball mill, paint shaker, dyno mill); and a method wherein a material which forms a resin particle component is kneaded together with a dispersion auxiliary polymer (or a covering polymer) to obtain a kneaded product, and the kneaded product is crushed and dispersed in the presence of a dispersing polymer. More specifically, methods for preparing coatings or developers for electrostatic photography can be utilized. For example, there can be used the methods described in *Fluidity of Coating and Pigment Dispersion* (1971 published by Kyoritsu Shuppan), Solomon, *Science of Coating, Paint and Surface Coating Theory and Practice*, Y. Harasaki, *Coating Engineering* (1971 published by Asakura Shoten) and Y. Harasaki, *Fundamental Science of Coating* (1977 published by Maki Shoten).

The polymerization granulation method includes conventional non-aqueous dispersion polymerization method. Examples thereof are described in the aforesaid *Newest Technique of Ultrafine Particle Polymer*, Chapter 2, *Development and Practical Use of Recent Electrophotographic Development System and Toner Material*, Chapter 3, and K. E. J. Barvettic, *Dispersion Polymerization in Organic Media* (1975 John Wiley).

Any of organic solvents can be used as the non-aqueous solvents used in the non-aqueous dispersion polymerization method, so long as the solvents have a boiling point of not higher than 200° C. The organic solvents may be used either alone or as a mixture of two or more of them. Specific examples of the organic solvents include, but are not limited to, alcohols such as methanol, ethanol, propanol, butanol, fluorinated alcohols and benzyl alcohol; ketones such as acetone, methyl ethyl ketone, cyclohexanone and diethyl ketone; ethers such as diethyl ether, tetrahydrofuran and dioxane; carboxylic acid esters such as methyl acetate, ethyl acetate, butyl acetate and methyl propionate; aliphatic hydrocarbons having 6 to 14 carbon atom such as hexane, octane, decane, dodecane, tridecane, cyclohexane and cyclooctane; aromatic hydrocarbons such as benzene, toluene, xylene and chlorobenzene; and halogenated hydrocarbons such as methylene chloride, dichloroethane, tetrachloroethane, chloroform, methylchloroform, dichloropropane and trichloroethane.

When the dispersed resin particles are synthesized in these non-aqueous solvents by the dispersion polymerization method, the average particle size of the resulting resin particles can be easily made 1 μm or below, and monodisperse particles having a very narrow particle size distribution can be obtained.

These non-aqueous dispersed resin particles can be electrodeposited by wet electrostatic photographic development method or by electrophoresis in an electric field, and hence the dispersion medium used during electrodeposition is adjusted to a non-aqueous solvent having an electrical resistance of $1\times10^8$ Ω.cm or above and a specific inductive capacity of 3.5 or below.

In this method, particles comprising mainly a thermoplastic resin are dispersed in an electrical insulating solvent having an electrical resistance of $1\times10^8$ Ω.cm or above and a specific inductive capacity of 3.5 or below and fed, and hence this method is preferred because the thickness of the transfer layer can be uniformly controlled to a thin film.

Examples of the insulating solvent include straight chain and branched aliphatic hydrocarbons, alicyclic hydrocarbons, aromatic hydrocarbons and halogenated hydrocarbons. Specific examples of the solvents include octane, isooctane, decane, isodecane, decaline, nonane, dodecane, isododecane, cyclohexane, cyclooctane, cyclodecane, benzene, toluene, xylene, mesitylene, Isopar E, Isopar G, Isopar H, Isopar L (Isopar is trade name of Exxon), Shell Sol 70, Shell Sol 71 (Shell Sol is trade name of Shell Oil), Amsco OMS and Amsco 460 (Amsco is trade name of Spirits). These solvents may be used either alone or as a mixture of two or more of them.

It is preferred that the above-described insulating solvents are used as the non-aqueous solvents for use in the polymerization granulation of the non-aqueous dispersed resin particles. However, other solvents may be used during polymerization granulation, and the above insulating solvents may be used after polymerization granulation.

The resin particles must be charged either positively or negatively to electrodeposit electrophoretically the dispersed particles in the dispersion medium. The particles can be charged by using the technique of the wet developer for electrostatic photography. For example, the particles can be charged by using charging materials and other additives described in the aforesaid *Development and Practical Use of Newest Electrophotograhic Development System and Toner Material, Foundation and Application of Electrophotorgraphic Technique* edited by Denshi Shashin Gakkai, pages 497 to 505 (1988 Corona) and Y. Harasaki, *Denshi Shashin* 16, (No. 2), page 44 (1972).

More specifically, this technique is described in U.K. Patents 893,429 and 934,038, U.S. Pat. Nos. 1,122,397, 3,900,412 and 4,606,989, JP-A-60-179751, JP-A-60-185963 and JP-A-2-13965.

The non-aqueous resin particle dispersion (latex) for use in electrodeposition comprises at least 0.1 to 20 g of the particles mainly composed of a thermoplastic resin, 0.01 to 50 g of the resin for dispersion stabilization and optionally 0.0001 to 10 g of a charge controlling agent dispersed in one liter of the electrical insulating dispersion medium.

The thermoplastic resin particles pulverized, charged and dispersed in the electrical insulating liquid as described above exhibits the same behavior as that of wet developer for electrophotography. For example, the particles can be electrophoretically deposited on the surface of the photoreceptor by using a development device such as a slit development electrode device described in the aforesaid *Foundation and Application of Electrophotograhic Technique* pages 275 to 285. Namely, the particles mainly composed of the thermoplastic resin are fed between the electrophotographic photoreceptor and an opposing electrode, electrophoresed according to potential gradient applied by an external power source and deposited or electrodeposited on the surface of the electrophotographic photoreceptor to thereby form a film.

Generally, when the particles are positively charged, voltage from an external power source is applied between the electrically conductive support of the photoreceptor and the development electrode of the development device so that the photoreceptor side is negatively charged, and the particles are electrostatically deposited on the surface of the photoreceptor.

The particles can be electrodeposited by wet toner development according to conventional electrophotographic process. Namely, after the photoreceptor is uniformly charged, exposure is not conducted or only an unnecessary area is exposed to light, that is, non-image area is erased, and usual wet toner development is conducted as described in the aforesaid *Foundation and Application of Electrophotographic Technique* pages 46 to 79.

The amount of the thermoplastic resin particles to be deposited on the photoreceptor can be arbitrarily adjusted by the applied voltage of external bias, the charged potential of the photoreceptor and the development time.

After electrodeposition, the developer is squeezed by rubber rollers, gap rollers or reverse rollers. Conventional methods such as corona squeezing and air squeezing can be used. Subsequently, drying is conducted by cold air, warm air or infrared lamp to form a film composed of the thermoplastic resin particles, or preferably a cured film of the thermosetting resin, thereby forming the transfer layer 12.

The formation of the transfer layer 12 by transfer method will be illustrated below.

In this method, the transfer layer 12 held on the release support (hereinafter referred to as release paper) such as typically release paper is transferred onto the surface of the electrophotographic photoreceptor 11.

Release paper on which the transfer layer is formed is in the form of a roll or a sheet and can be easily fed to the transfer device.

Any of conventional release paper can be used in the present invention. Examples of the release paper which can be used in the present invention include those described in *New Technique and Use of Adhesion, Development Data of Various Applied Products* (May 20, 1978 published by Keiei Kaihatsu Center Publishing Department) and *Cyclopedia of Goods of All Paper Guide* First Volume (Dec. 1, 1983 published by Shigyo Times Sha).

More specifically, examples of the release paper include paper obtained by coating polyethylene-laminated unbleached kurupack paper with a release agent mainly composed of silicone, paper obtained by coating solvent-resistant resin-precoated paper of fine quality with the release agent, release agent-coated kraft paper, products obtained by coating undercoated PET base with the release agent, and release agent-coated glassine paper.

Generally, solvent type silicone is used as the silicone. Silicone at a concentration of 3 to 7% is coated on the base by gravure coating, reverse roll coating or wire bar coating, and the coated base is dried and heat-treated at 150° C. or above to cure silicone. The coating weight is about 1 $g/m^2$.

Release paper is commercially available from paper manufacturing companies. Paper for tape, label, shaping and cast coating can be generally used.

Examples of commercially available paper include Separate Paper (a product of Oji Seishi KK), King Release (a product of Shikoku Seishi KK), Sun Release (a product of Sanyo Kokusaku Pulp KK) and NK High Release (a product of Nippon Kakoshi KK).

The transfer layer 12 can be easily formed on the release paper in the following manner. A composition mainly composed of a thermoplastic resin for the transfer layer is coated on the release paper by bar coating, spin coating or spray coating in conventional manner to form a film.

The transfer layer 12 on the release paper can be thermally transferred onto the electrophotographic photoreceptor 11 by conventional thermal transfer method. Namely, the release paper having the transfer layer 12 thereon is contact-bonded to the electrophotographic photoreceptor 11, and the transfer layer 12 is thermally transferred.

The thermal transfer of the transfer layer 12 from the release paper onto the electrophotographic photoreceptor is carried out under the following conditions. The nip pressure of the roller is preferably 0.1 to 10 $kgf/cm^2$, more preferably 0.2 to 8 $kgf/cm^2$. The transfer temperature is preferably 25° to 100° C., more preferably 40° to 80° C., and the conveying speed is preferably 0.5 to 100 mm/sec, more preferably 3 to 50 mm/sec. The conditions may be different from those of the electrophotographic stage and the thermal transfer stage of the primary receptor.

The primary receptor 20 of the present invention will be illustrated below. The primary receptor 20 is brought into close contact with the transfer layer 12 under heating and/or pressure conditions. The primary receptor 20 together with the toner image 25 and the transfer layer 12 is released from the surface of the photoreceptor 11 and transferred onto the final receiving material 21, and the primary receptor is released from the toner image together with the transfer layer 12 to form the final color image on the final receiving material.

Accordingly, it is important that the releasability of the surface of the primary photoreceptor 20 is lower than that of the surface of the photoreceptor 11, the primary receptor is releasable to transfer the image on the final receiving material, and the adhesion of the primary receptor is greater than that of the surface of photoreceptor 11 and is greater by preferably at least 10 gram.force (g.f), more preferably at least 20 g.f than that of the surface of the photoreceptor 11. Further, the maximum adhesion of the surface of the primary receptor is preferably 200 g.f, more preferably not greater than 180 g.f.

The nip pressure for transfer is preferably 0.2 to 20 $kgf/cm^2$, more preferably 0.5 to 15 $kgf/cm^2$. As roller pressure means, rollers provided with a spring at both ends of the roller shaft or air cylinder using compressed air can be used.

The conveying speed is preferably 0.1 to 300 mm/sec, more preferably 0.5 to 200 mm/sec. The conveying speed of the thermal transfer may be different from that of the electrophotographic stage.

The transfer of the image from the photoreceptor 11 to the primary receptor 20 and the transfer of the image from the primary receptor 20 to the final receiving material 21 may be simultaneously conducted within one picture. Alternatively, after the transfer of all of one picture from the photoreceptor to the primary receptor 20 is completed, the image may be transferred to the final receiving material 21. Further, the thermal transfer stage can be incorporated in a series of the stages of the electrophotographic process apparatus.

Any material can be used for the primary receptor, so long as the resulting primary receptor 20 meets the above requirements. Examples of systems for transferring the toner image 25 from the photoreceptor 11 to the primary receptor 20 which can be used in the present invention include drum system and endless belt system which can be repeatedly used.

In the drum system and the endless belt system, any material can be used as the material for the primary receptor 20 provided on the drum, so long as the material meets the above requirements. However, those comprising an elastomer layer and/or a laminated structure of an elastomer layer and a reinforcing layer support is preferred, so long as the surface of the laminated layer structure meets the above requirements. The laminated layer structure may be directly provided on the drum or may be removably provided so as to be replaced.

Any of conventional natural resins and synthetic resins can be used as the elastomer used in the present invention. These resins may be used either alone or a combination of two or more of them. Namely, a single layer composed of a resin or a laminated layer composed of two or more of these resins may be used. For example, there can be used resins described in A. D. Roberts, *Natural Rubber Science and Technology* Oxford Science publications (1988), W. Hofmann, *Rubber Technology Handbook* Hanser Publishers (1989) and *Plastic Material Lecture* in ten volumes published by Nikkan Kogyo Shinbunsha.

Specific examples of the elastomer include styrene-butadiene rubber, butadiene rubber, acrylonitrile-butadiene rubber, cyclized rubber, chloroprene rubber, ethylene-propylene rubber, butyl rubber, chlorosulfonated polyethylene rubber, silicone rubber, fluororubber, polysulfide rubber, natural rubber, isoprene rubber and urethane rubber. Desired elastomers can be appropriately chosen by taking releasability from the transfer layer, durability, etc. into consideration. The adhesion of the surface of the receptor can be easily adjusted in the same manner as in the easily releasable photoreceptor.

Examples of materials used in the reinforcing layer for the elastomer layer include cloth, glass fiber, resin-impregnated specialty paper, aluminum and stainless steel. A spongy rubber layer may be provided between the surface elastomer layer and the reinforcing layer. The surface of the primary receptor 20 has an average roughness of preferably 0.01 mm or below. The thickness of the surface elastomer layer is preferably 0.01 to 10 mm.

Conventional materials can be used as materials for the belt system primary receptor in the endless belt system. For example, the materials are described in U.S. Pat. Nos. 3,893,761, 4,684,238 and 4,690,539. Further, a layer serving as a heating medium may be provided in the carrier layer of the belt of the belt system primary receptor. This is described in JP-W-45-03265 (the term "JP-W" as used herein means an "unexamined published international patent application").

The toner image 25 together with the transfer layer 12 can be transferred onto the receiving material 21 by conventional method and conventional apparatus.

Examples of the receiving material 21 used in the present invention include paper of fine quality, natural paper such as coated paper and art paper, synthetic paper support, reflection type materials such as metallic (e.g., aluminum, iron, SUS) supports and transmission type materials such as resin films (plastic films) of polyesters, polyolefins, polyvinyl chloride and polyacetates.

The transfer behavior of the transfer layer to the final receiving material is considered to be made in the following manner. Namely, when the transfer layer 12 somewhat softened is heated, the tackiness thereof is increased, and the transfer layer is bonded to the final receiving material 21. After the transfer layer is passed through the releasing roller, the temperature thereof is lowered, and the fluidity and tackiness thereof are reduced. The film as such together with the toner image 25 is bonded to the final receiving material 21, and the film is released from the surface of the primary receptor 20. Accordingly, the transfer conditions should be set so as to meet the above conditions.

The toner image 25 on the final receiving material 21 is overcoated with the transfer layer 12, and hence the toner image 25 is protected from being marred or stained.

The color image forming method of the present invention will be illustrated below by referring to the accompanying drawings.

FIG. 2 shows schematically an embodiment for carrying out the method of the present invention and an embodiment of the apparatus for conducting the method according to the present invention wherein a means for depositing the compound (S) is provided, development is conducted by wet development method, the transfer layer 12 is formed by electrodeposition, and the transfer of the toner image from the photoreceptor 11 to the primary receptor 20 is conducted by the drum system. The means 10 for depositing the compound (S) can be omitted when the surface of the photoreceptor has releasability.

A drum of the electrophotographic photoreceptor 11, a drum of the primary receptor 20 and the receiving material 21 are arranged above a development unit set 14. A temperature controlling means 17 is provided within each drum and each of back-up rollers for transfer and releasing.

The drum of the primary receptor 20 and the receiving material 21 are not brought into contact with each other during the formation of the image by an electrophotographic process as shown in FIG. 2.

When the surface of the electrophotographic photoreceptor 11 has releasability previously imparted thereto by modifying the surface, the toner image 25 is formed on the photoreceptor 11 as such. When the releasability of the surface of the photoreceptor 11 is insufficient, the compound (S) is adsorbed or the surface of the photoreceptor, or the compound (S) is deposited thereon to impart releasability thereto before the toner image 25 is formed. Namely, the compound (S) is fed to the surface of the photoreceptor 11 from a compound (S) feed unit 10 by any one of the above-described systems. The unit 10 for adsorbing or depositing the compound (S) on the surface of the photoreceptor 11 may be a fixed type or a movable type.

Development in the present invention may be carried out by using any of the dry developer and the wet developer. However, it is conventionally known that duplicated images obtained by using wet developers have high resolving power. The present invention will be illustrated below by means of an example wherein the wet development unit is used as the development unit.

The wet development unit set 14 is a traveling system. The unit set is provided with development devices 14*y* (containing yellow liquid developer), 14*m* (containing magenta liquid developer), 14*c* (containing cyan liquid developer) and 14*k* (containing black liquid developer) and further provided with a thermoplastic resin particle electrodeposition unit 50 for forming the transfer layer 12 by electrostatic deposition and/or electrodeposition when the transfer layer 12 is formed by an electrodeposition system.

Each device is provided with a prebath, a rinsing means and a squeezing means. Usually, a carrier liquid for the liquid developer is used for the prebath and the rinsing solution.

The electrophotographic process will be illustrated below by referring to FIG. 3. FIG. 3 is a view showing a stage of forming the toner image 25 on the electrophotographic photoreceptor 11 by an electrophotographic process in FIG. 2.

The photoreceptor 11 is uniformly charged, for example, positively charged by a corona charging device. Subsequently, the photoreceptor 11 is then imagewise exposed to light first on the basis of yellow image information by using an exposure device (e.g., semiconductor laser), whereby the potential of the exposed area is reduced, and a potential contrast between the exposed area and the unexposed area can be obtained. Only the yellow development device 14*y* containing a liquid developer comprising a yellow pigment having positive electrostatic charge dispersed in an electrical insulating dispersion medium is allowed to approach the surface of the photoreceptor 11 from the development unit 14, and the device 14*y* is fixed by a gap of 1 mm between the device 14*y* and the surface of the photoreceptor.

The photoreceptor 11 is first passed through the prebath. While a development bias voltage is applied between the photoreceptor 11 and the development electrode by a bias power source (not shown), the yellow liquid developer is fed to the surface of the photoreceptor 11. The bias voltage is applied so that the development electrode side is made positive, and the photoreceptor side is made negative, and the applied voltage is slightly lower than the surface potential of the unexposed area. When the applied voltage is too low, a toner image having a sufficient density can not be obtained.

Subsequently, the developer is washed off by the rinsing means provided within the development unit, the rinsing solution deposited on the surface of the photoreceptor is removed by the squeezing means, and the photoreceptor is passed under a suction exhaust unit 15 (a suction part 15*a* and an exhaust part 15*b*) to thereby dry it.

The above stage is repeated for each of magenta, cyan and black to obtain a color image on the photoreceptor 11.

Subsequently, the releasable transfer layer 12 is formed on the electrophotographic photoreceptor 11 having the toner image 25 formed thereon. This stage will be illustrated by referring to FIG. 4 to FIG. 6.

Figure 4:
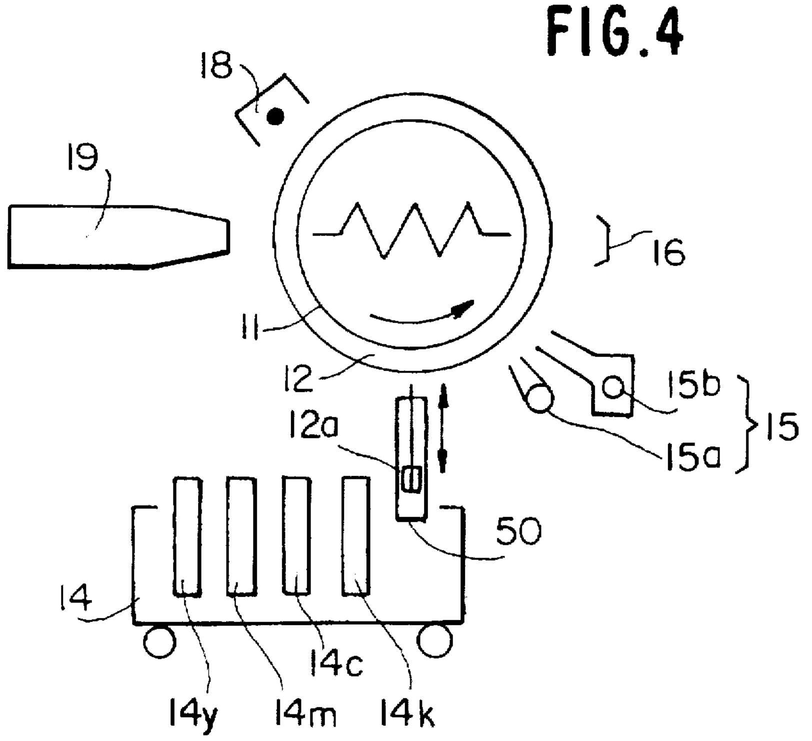
FIG. 4 shows schematically the formation of a transfer layer by electrostatic deposition or electrodeposition.
Figure 5:
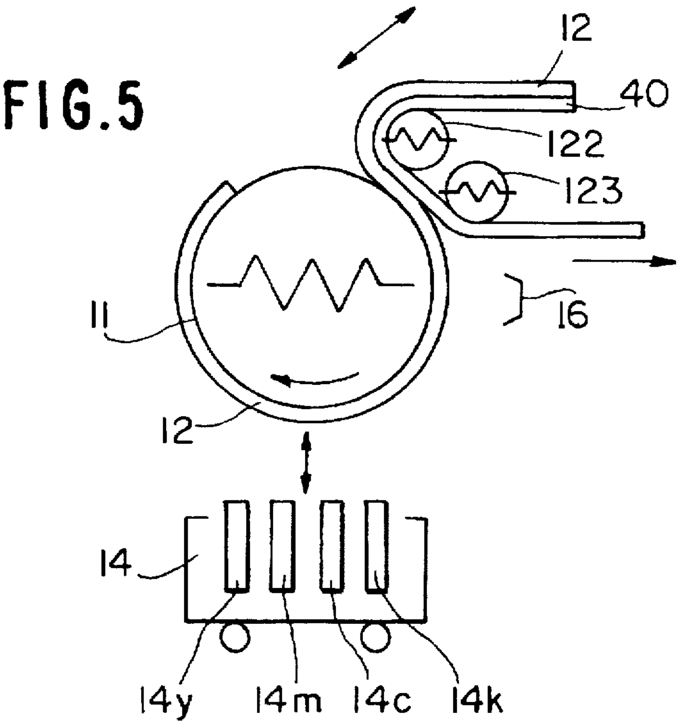
FIG. 5 shows schematically the formation of a transfer layer by thermal transfer from release paper.
Figure 6:
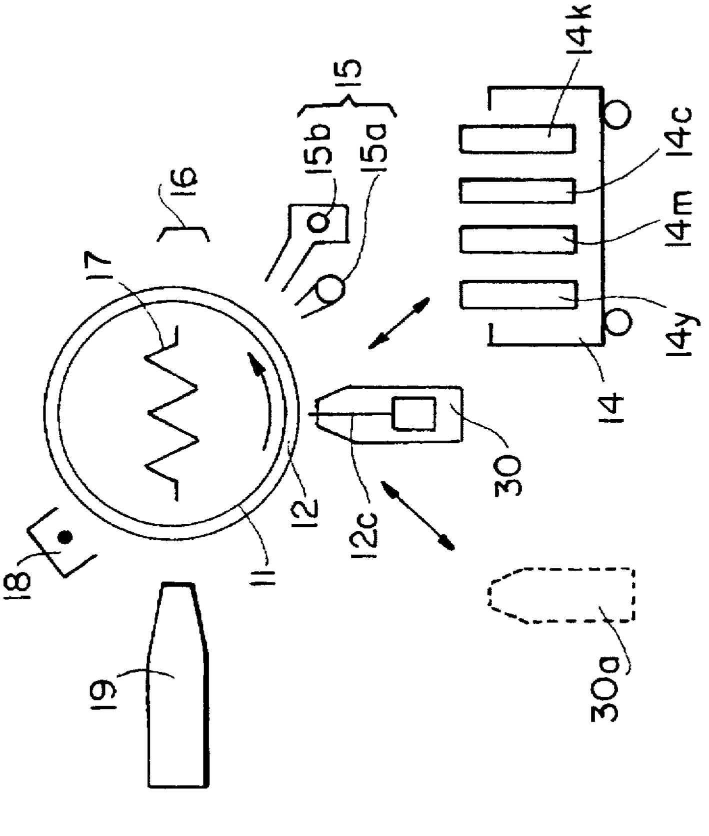
FIG. 6 shows schematically the formation of the transfer layer by hot melt coating.

FIG. 4 shows schematically the formation of the transfer layer by electrostatic deposition or electrodeposition. FIG. 5 shows schematically the formation of the transfer layer by transfer from release paper. FIG. 6 shows schematically the formation of the transfer layer by hot-melt coating.

The formation of the transfer layer 12 by electrodeposition coating will be illustrated below by referring to FIG. 4. The thermoplastic resin (A) which is the material for the transfer layer is pulverized into fine particles which are then charged to form a dispersion (12*a*) of the thermoplastic resin particle. The dispersion of the charged particle is introduced into the electrodeposition unit 50 of the liquid development unit. After the completion of the development process, the development (electrodeposition) unit set 14 is allowed to approach the photoreceptor 11, and the unit set 14 is fixed at a distance of 1 mm from the development electrode. The particle dispersion from the unit 50 is fed to the gap therebetween. While voltage from an external power source is applied thereto, the drum is rotated so that the particles are adsorbed by the whole surface of the photoreceptor 11. If desired, the particle dispersion deposited on the surface of the photoreceptor 11 is removed by means of the squeeze unit of the unit set 14. The resin particles are then heat-molten by a heating means to form a film of the resin, thereby forming the transfer layer 12. If desired, the photoreceptor is then cooled to a predetermined temperature by externally cooling the photoreceptor 11 with a cooling device similar to the suction exhaust unit or by cooling the photoreceptor 11 from the inside of the drum. The squeeze unit is descended, and the unit set 14 is moved to the stand-by position thereof, thereby completing the stage of forming the transfer layer 12.

When the transfer layer 12 is formed by transfer from the release paper or hot-melt coating method, the device shown in FIG. 5 or FIG. 6 is used in place of the electrodeposition unit 50 and applied to the apparatus shown in FIG. 2.

FIG. 5 shows schematically a device for simply preparing the transfer layer 12 on the photoreceptor 11 by using the release paper.

Namely, the release paper 40 having the transfer layer 12 thereon is heated and contact-bonded to the photoreceptor 11 by a heating roller 122, and the transfer layer 12 is transferred onto the surface of the photoreceptor 11. The release paper 40 is cooled by a cooling roller 123 and recovered. If desired, the photoreceptor 11 itself is heated by a preheating means to improve the transferability of the transfer layer by contact-bonding with heating. The position where the preheating means is incorporated in the device of FIG. 5 is not particularly limited.

Hot-melt coating can be carried out by using the device of FIG. 6. Referring to FIG. 6, the liquid development unit 14 comprising the development devices containing yellow 14*y*, magenta 14*m*, cyan 14*c* and black 14*k* liquid developers, respectively is traveled to thereby form the toner image 25 by the above electrophotographic process. After the liquid development unit 14 is traveled to the stand-by position thereof, the hot-melt coater 30 is traveled from the stand-by position 30*a* thereof to the position where the unit 14 stands before traveling. A hot-melted thermoplastic resin 12*c* is coated on the surface of the photoreceptor 11 around the drum by the hot-melt coater 30, and is passed under the suction exhaust unit 15, whereby the photoreceptor is cooled to the predetermined temperature, thereby forming the transfer layer 12.

Figure 7A:
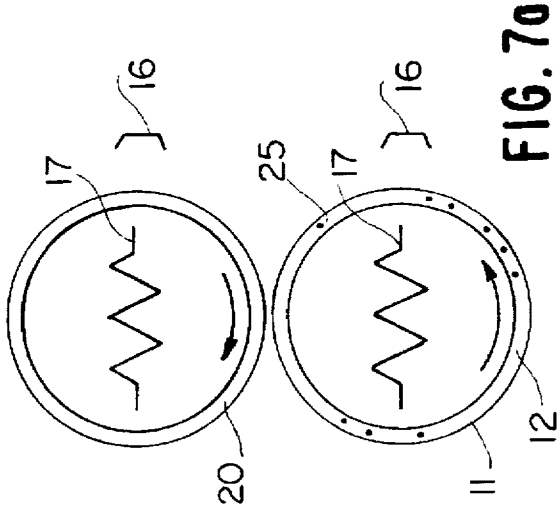
FIG. 7 shows schematically the stage of transferring a toner image together with the transfer layer onto a primary receptor.
Figure 7B:
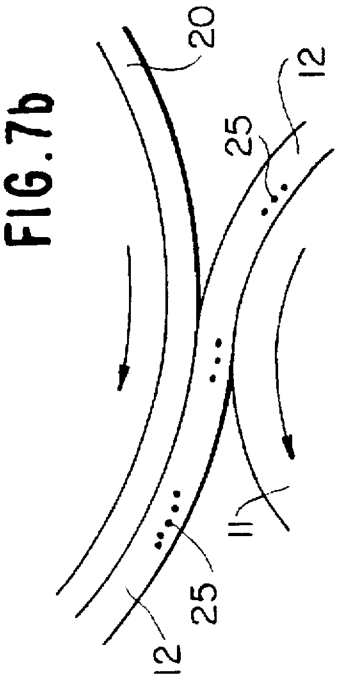

The stage of transferring the toner image together with the transfer layer to the primary receptor will be illustrated by referring to FIG. 7.

The photoreceptor 11 having the toner image 25 and the transfer layer 12 formed thereon which is positioned as shown in FIG. 7*a* is brought into contact with the drum of the primary receptor 20, and they are heated and pressurized, whereby the toner image 25 together with the transfer layer 12 can be transferred from the photoreceptor 11 onto the drum of the primary receptor 20. Namely, after the transfer layer 12 is formed, the photoreceptor is preheated to the pre-determined temperature by a heating means 16 and/or 17 for thermal transfer from the drum of the photoreceptor. If desired, the primary receptor 20 is preheated by the heating means 16 and/or 17. The toner image 25 together with the transfer layer 12 is brought into close contact with the primary receptor 20 to thereby thermally transfer the toner image 25 together with the transfer layer onto the primary receptor 20.

It is preferred that the heating means 16 is a non-contact type such as an infrared line heater or a flash heater. The heating surface temperature of the photoreceptive layer during thermal transfer is preferably 40° to 150° C., particularly preferably 50° to 120° C.

Figure 8:
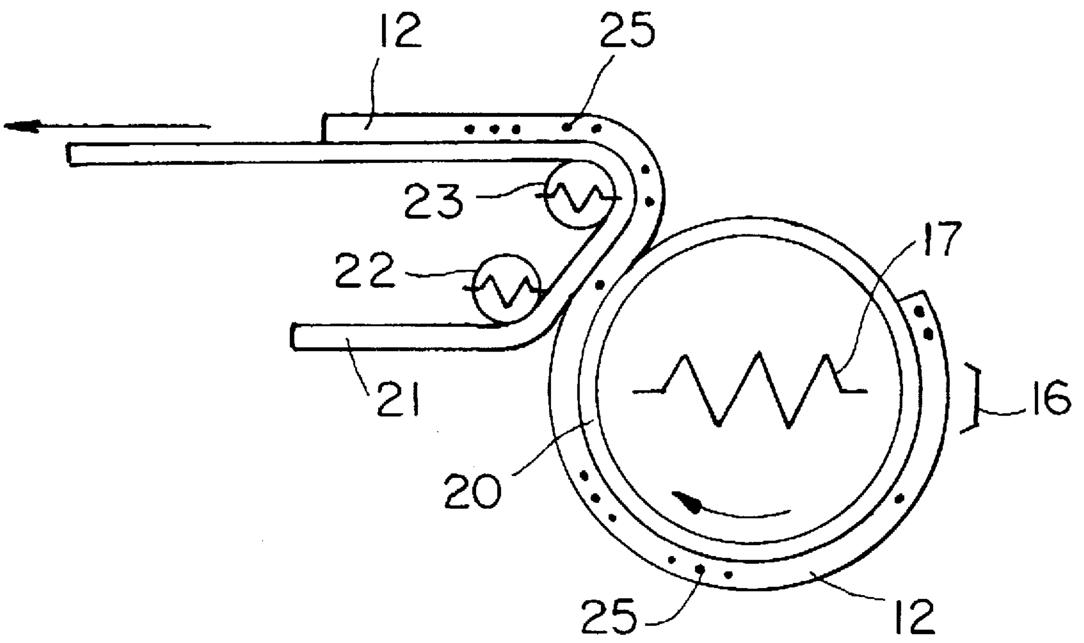
FIG. 8 shows schematically the stage of transferring a toner image together with the transfer layer on the primary receptor onto a receiving material.

The transfer of the toner image together with the transfer layer onto the final receiving material 21 will be illustrated by referring to FIG. 8.

After the toner image 25 together with the transfer layer 12 is completely transferred onto the primary receptor 20, the primary receptor 20 is brought into close contact with the final receiving material 21 (e.g., coated paper) to thereby conduct the thermal transfer of the toner image 25 together with the transfer layer 12 onto the final receiving material. The primary receptor 20 is preheated by the heating means 16 and/or 17, and the receiving material 21 is also preheated by the back-up roller 22 for transfer. Subsequently, the receiving material 21 which is positioned as shown in FIG. 2 is pressed against the drum of the primary receptor 20 by the back-up rollers 22 and 23 for transfer and releasing, and the toner image 25 together with the transfer layer 12 is transferred onto the final receiving material 21 as shown in FIG. 8. Subsequently, while cooling is conducted by the back-up roller 23 for releasing, the transfer layer 12 together with the toner image 25 on the receiving material 21 is released, thereby completing a series of the stages.

When the endless belt system is applied to the primary receptor 20, the toner image together with the transfer layer can be transferred onto the final receiving material 21 and a series of the stages can be completed in the same manner as in the drum system.

In the color image forming method of the present invention, it is desirable that the transfer conditions of the toner image 25 and the transfer layer 12 are optimized by taking into consideration the photoreceptor 11 (photoreceptive layer and support) to be used, the physical properties of the surface of the primary receptor, the physical properties of the transfer layer 12 and the receiving material 21, etc. Particularly, it is necessary that temperature conditions in the thermal transfer stage are determined by taking the glass transition point, softening temperature, fluidity, tackiness, film forming properties and thickness of the transfer layer into consideration. Namely, the transfer layer is somewhat softened by the preheating means and passed under the heating roller, whereby thickness is increased and the transfer layer can be bonded to the receiving material. Subsequently, the transfer layer is passed under the cooling roller as a result, the temperature is lowered, fluidity and thickness are reduced, and the transfer layer film together with the toner image as bonded to the receiving material is released. The temperature conditions in the transfer stage are set so as to meet the above conditions.

It is desirable that the cooling roller is prepared by covering a good thermal conductive metal such as aluminum or copper with silicone rubber, and a cooling means is provided within the interior of the roller or on the outer periphery thereof that is not brought into contact with the transfer paper to thereby dissipate heat. It is preferred that a cooling fan, a refrigerant circulation element or an electronic cooling element is used as the cooling means, and the cooling means is used in combination with a temperature controller to keep the temperature in the desired range.

The present invention is now illustrated in greater detail by reference to the following examples which, however, are not to be construed as limiting the invention in any way.

PREPARATION EXAMPLE OF RESIN PARTICLE FOR TRANSFER LAYER

Preparation Example 1 of Resin Particle (AL): (AL-1)

A mixed solution of 10 g of the resin (Q-1) having the following structure for dispersion stabilization, 100 g of vinyl acetate and 384 g of Isopar H was heated to 70° C. in a nitrogen gas atmosphere with stirring. Subsequently, 0.8 g of 2,2'-azobis(isovaleronitrile) (abbreviated to A.I.V.N.) as the polymerization initiator was added thereto. The mixture was reacted for 3 hours. Twenty minutes after the addition of the initiator, the reaction mixture became cloudy, and the reaction temperature was raised to 88° C. Further, 0.5 g of the initiator was added thereto. After the reaction was carried out for 2 hours, the temperature was raised to 100° C. The mixture was stirred for 2 hours, and unreacted vinyl acetate was distilled off. After cooling, the reaction mixture was passed through a 200-mesh nylon cloth. The resulting white dispersion was a latex of good monodisperse particles having an average particle size of 0.23 μm. The polymerization conversion was 90%. The particle size was measured by CAPA-500 (a product of Horiba Seisakusho KK).

A part of the white dispersion was centrifuged ($1\times10^4$ rpm, revolution time: 60 min). The precipitated resin particles were collected and dried. The resin particles had a weight-average molecular weight (Mw: GPC value in terms of polystyrene) of $2\times10^5$ and a glass transition point (Tg) of 38° C.

Resin (Q-1) for Dispersion Stabilization

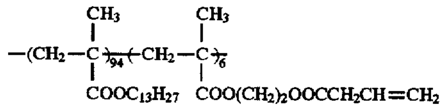

$\overline{M}w$ $4\times10^4$ (composition ratio by weight)

Preparation Example 2 of Resin Particle (AL): (AL-2)

A mixed solution of 15 g of the resin (Q-2) having the following structure for dispersion stabilization, 7.5 g of benzyl methacrylate, 25 g of methyl methacrylate, 1.3 g of methyl 3-mercaptopropionate and 552 g of Isopar H was heated to 50° C. in a nitrogen gas atmosphere with stirring. One gram of 2,2'-azobis(2-cyclopropylpropionitrile) (abbreviated to A.C.P.P.) was added thereto, and the mixture was reacted for 2 hours. Further, 0.8 g of A.C.P.P. was added thereto. After the mixture was reacted for 2 hours, 0.8 g of the initiator A.I.V.N. was added thereto. The reaction temperature was set to 75° C., and the reaction was carried out for 3 hours. Subsequently, the temperature was raised to 90° C., and unreacted monomers were distilled off under reduced pressure of 20 to 30 mmHg. The reaction mixture was cooled and filtered through a 200-mesh nylon cloth. The resulting white dispersion was a latex of good monodisperse particles having an average particle size of 0.20 μm. The polymerization conversion was 98%. The resin particles had a Mw of $2.8\times10^4$ and a Tg of 55° C.

Resin (Q-2) for Dispersion Stabilization

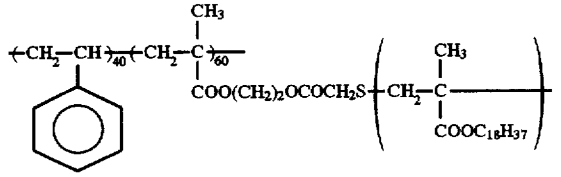

Preparation Example 3 of Resin Particle (AL): (AL-3)

A mixed solution of 14 g of the resin (Q-3) having the following structure for dispersion stabilization and 382 g of Isopar G was heated to 50° C. in a nitrogen gas atmosphere with stirring. A mixture of 80 g of benzyl methacrylate, 20 g of vinyltoluene and 0.8 g of A.C.P.P. was added dropwise thereto over a period of one hour, and the reaction was carried out for one hour. Further, 0.8 g of A.C.P.P. was added thereto, and the reaction was carried out for 2 hours. Subsequently, 0.8 g of A.I.V.N. was added thereto, the temperature was raised to 80° C., and the reaction was carried out for 2 hours. Further, 0.5 g of A.I.V.N. was added thereto, and the reaction was carried out for 2 hours.

Subsequently, the reaction mixture was heated to 100° C., and unreacted monomers were distilled off under reduced pressure of 10 to 20 mmHg. The reaction mixture was filtered through a 200-mesh nylon cloth. The resulting white dispersion was a latex of good monodisperse particles having an average particle size of 0.17 μm. The polymerization conversion was 90%. The resin particles had an Mw of $1\times10^5$ and a Tg of 55° C.

Resin (Q-3) for Dispersion Stabilization

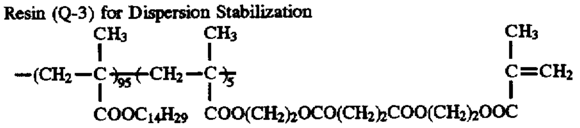

$\overline{M}w$ $5\times10^4$

Preparation Example 4 of Resin Particle (AL): (AL-4)

A mixed solution of 14 g of the resin (Q-4) having the following structure for dispersion stabilization, 10 g of a monofunctional macromonomer (M-1) (Praksel FM-0725, a product of Chisso Corporation) and 553 g of Isopar H was heated to 50° C. in a nitrogen gas atmosphere with stirring.

A mixture of 70 g of methyl methacrylate, 20 g of ethyl acrylate, 1.3 g of methyl 3-mercaptopropionate and 1.0 g of A.C.P.P. was added dropwise thereto over a period of 30 minutes, and the mixture was reacted for 1.5 hours. Further, 0.8 g of A.C.P.P. was added thereto, and the reaction was carried out for 2 hours. Subsequently, 0.8 g of A.I.V.N. was added thereto, and the temperature was set to 80° C., and the reaction was carried out for 2 hours. Further, 0.5 g of A.C.P.P. was added thereto, and the reaction was carried out for 2 hours.

After cooling, the reaction mixture was passed through a 200-mesh nylon cloth. The resulting white dispersion was a latex of good monodisperse particles having an average particle size of 0.15 μm. The polymerization conversion was 99%. The resin particles had an Mw of $3\times10^4$ and a Tg of 50° C.

Resin (Q-4) for Dispersion Stabilization

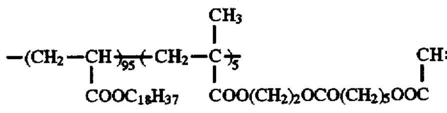

$\overline{M}w$ $5\times10^4$

Preparation Examples 5 to 9 of Resin Particle (AL) : (AL-5) to (AL-9)

The procedure of Preparation Example 4 was repeated except that each of macromonomers (Mw: $8\times10^3$ to $1\times10^4$) shown in Table 2 below was used in place of 10 g of the macromonomer (FM-0725) used in the preparation of the resin particles (AL) of Preparation Example 4 to prepare resin particles.

The polymerization conversion of the resins were in the range of 98 to 99%. The particles had an average particle size of 0.15 to 0.25 μm, a narrow particle size distribution and good monodisperse system. The resins had an Mw of $2.5\times10^4$ to $4\times10^4$ and a Tg of 40° to 70° C.

TABLE 2

| Preparation Example | Resin Particle (AL) | Macromonomer | |
|---|---|---|---|
| 5 | AL-5 | M-2 | 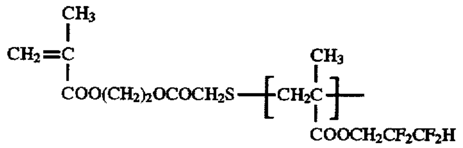 |
| 6 | AL-6 | M-3 | 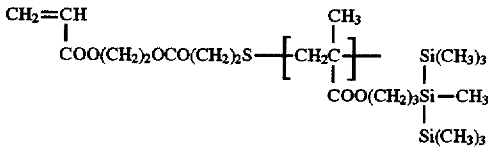 |
| 7 | AL-7 | M-4 | 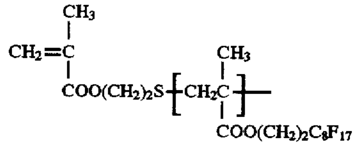 |
| 8 | AL-8 | M-5 | 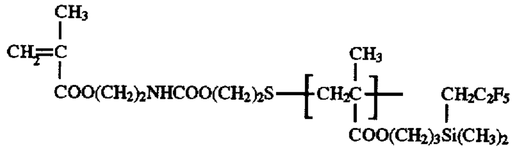 |
| 9 | AL-9 | M-6 | 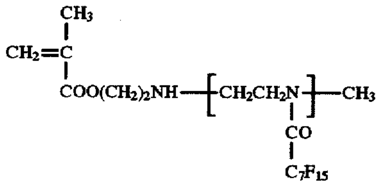 |

Preparation Example 10 of Resin Particle (AL) (AL-10)

The solids of a styrene-butadiene copolymer (48/52 by weight) having a softening point of 45° C. (Solprene 303, a product of Asahi Chemical Industry Co., Ltd.) as the thermoplastic resin (A) were crushed in a crusher (Trio blender). Five grams of the resulting crushed powder, 4 g of the resin (Solprene 1205, a product of Asahi Chemical industry Co., Ltd.) for dispersion stabilization and 51 g of Isopar H were charged into a paint shaker (a product of Toyo Seiki KK) containing glass beads of about 4 mm in diameter as a dispersion medium were pre-dispersed for 20 minutes. The resulting pre-dispersion was wet-dispersed in a dyno mill (a product of Sinmal Enterprise) containing glass beads having a diameter of 0.75 to 1 mm as a dispersion medium at 4,500 rpm for 6 hours. The resulting dispersion was filtered through a 200-mesh nylon cloth. The resulting white dispersion was a latex of particles having an average particle size of 0.4 μm.

Preparation Examples 11 to 16 of Resin Particle (AL): (AL-11) to (AL-16)

Dispersions were prepared in the same manner as in the preparation of the dispersion of Preparation Example 10 using the wet dispersion method except that each of compounds shown in Table 3 below was used in place of Solprene 303. The white dispersions were latexes of particles having an average particle size of 0.3 to 0.6 μm. The resulting resin particles had a softening point of 40° to 100° C.

TABLE 3

| Preparation Example | Resin Particle (AL) | Resin (A) |
|---|---|---|
| 11 | AL-11 | Ethylene/methacrylic acid copolymer (96.4:3.6 by mol) Nimacrel N-699 (Mitsui DuPont Chemical) |
| 12 | AL-12 | Ethylene/vinyl acetate copolymer Evaflex 420 (Mitsui DuPont Chemical) |
| 13 | AL-13 | Ethylene/ethyl acrylate copolymer Evaflex-EEA,A703 (Mitsui DuPont Chemical) |
| 14 | AL-14 | Natural resin-modified polyester resin Tescon RM-1000 |
| 15 | AL-15 | Cellulose acetate butyrate Cellidor Bsp. (Bayer AG) |
| 16 | AL-16 | Polyvinyl butyral resin S-Lec (Sekisui Chemical Co., Ltd.) |

Preparation Example 17 of Resin Particle (AL): (AL-17)

A mixture of 12 g of the resin (Q-1) for dispersion stabilization, 70 g of vinyl acetate, 30 g of vinyl butyrate and 388 g of Isopar H was heated to 80° C. in a nitrogen gas atmosphere with stirring. To the mixture, there was added 1.5 g of 2,2'-azobis (isobutyronitrile) (abbreviated to) A.I.B.N. as an initiator, and the mixture was reacted for 2 hours. Further, 0.8 g of A.I.B.N. was added twice at intervals of 2 hours, and the reaction was carried out every time for 2 hours. After cooling, the reaction mixture was passed through a 200-mesh nylon cloth. The resulting white dispersion was a latex of good monodisperse particles having an average particle size of 0.18 μm. The polymerization conversion was 93 %. The resin particles had an Mw of $8\times10^4$ and a Tg of 18° C.

Preparation Example 18 of Resin Particle (AL): (AL-18)

A mixture of 18 g of the resin (Q-3) for dispersion stabilization and 549 g of Isopar H was heated in a nitrogen gas atmosphere with stirring. A mixture of 70 g of benzyl methacrylate, 30 g of methyl acrylate, 2.6 g of methyl 3-mercaptopropionate and 1.0 g of A.I.V.N. was added dropwise thereto over a period of one hours. The mixture was then reacted for one hour. After 0.8 g of A.I.V.N. was added thereto, the temperature was set to 75° C., and the reaction was carried out for 2 hours. Further, 0.8 g of A.I.V.N. was added thereto, and the reaction was carried out for 3 hours. After cooling, the reaction mixture was passed through a 200-mesh nylon cloth. The resulting white dispersion was a latex of particles having an average particle size of 0.18 μm. The polymerization conversion was 98%. The resin particles had an Mw of $3\times10^4$ and a Tg of 18° C.

Preparation Examples 19 to 28 of Resin Particle (AL): (AL-19) to (AL-28)

Resin particles (AL) were synthesized in the same manner as in the preparation of the resin particles of Preparation Example 18 except that monomers shown in Table 4 below were used in place of 70 g of benzyl methacrylate and 30 g of methyl acrylate used in Preparation Example 18. The white dispersions were latexes of good monodisperse particles having an average particle size of 0.13 to 0.20 μm. The polymerization conversions were 90 to 99%. The resin particles had a Tg of 10° to 25° C.

TABLE 4

| Preparation Example | Resin Particle (AL) | Monomer | |
|---|---|---|---|
| 19 | AL-19 | Phenethyl Methacrylate | 70 g |
| | | Methyl Acrylate | 30 g |
| 20 | AL-20 | 3-Phenylpropyl Methacrylate | 80 g |
| | | Ethyl Acrylate | 20 g |
| 21 | AL-21 | Methyl Methacrylate | 60 g |
| | | 2-Methoxyethyl Methacrylate | 40 g |
| 22 | AL-22 | Vinyltoluene | 20 g |
| | | 2-Ethylhexyl Methacrylate | 15 g |
| | | Methyl Methacrylate | 65 g |
| 23 | AL-23 | Vinyl Acetate | 70 g |

TABLE 4-continued

| Preparation Example | Resin Particle (AL) | Monomer | |
|---|---|---|---|
| | | Vinyl Valerate | 30 g |
| 24 | AL-24 | Methyl Methacrylate | 60 g |
| | | Butyl Methacrylate | 20 g |
| | | 2,3-Dichloropropoxypropyl Methacrylate | 20 g |
| 25 | AL-25 | Methyl Methacrylate | 65 g |
| | | Ethyl Methacrylate | 30 g |
| | | Plaksel FM0725 | 5 g |
| 26 | AL-25 | Benzyl Methacrylate | 60 g |
| | | Benzyl Acrylate | 30 g |
| | | Macromonomer M-3 | 10 g |
| 27 | AL-27 | Benzyl Methacrylate | 70 g |
| | | Ethylene Giycol Monomethyl Ether Monomethacrylate | 25 g |
| | | Macromonomer M-4 | 5 g |
| 28 | AL-28 | 2-Phenyl-2-methylethyl Methacrylate | 75 g |
| | | Methyl Acrylate | 25 g |

Synthesis Example of Resin (P)

Synthesis Example 1 of Resin (P): (P-1)

A mixed solution of 80 g of methyl methacrylate, 20 g of dimethylsiloxane macromonomer FM-0725 (Mw=$1\times10^4$, a product of Chisso Corporation) and 200 g of toluene was heated to 75° C. in a nitrogen stream. One gram of A.I.B.N. was added thereto, and the mixture was reacted for 4 hours. Further, 0.7 g of A.I.B.N. was added thereto, and the mixture was reacted for 4 hours. The resulting copolymer had an Mw of $5.8\times10^4$ (as measured by GPC).

Resin (P-1)

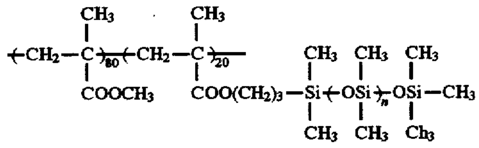

Synthesis Examples 2 to 9 of Resin (P): (P-2) to (P-9)

The procedure of Synthesis Example 1 was repeated except that monomers shown in Table 5 below were used in place of methyl methacrylate and macromonomer used in Synthesis Example 1 to prepare copolymers. The resulting copolymers had an Mw of $4.5\times10^4$ to $6\times10^4$.

TABLE 5
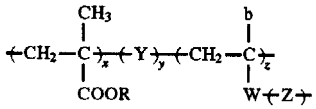
| Synthesis Example of Resin [P] | [P] | −R | −Y− | b | −W− | −Z− | x/y/z (by weight) |
| --- | --- | --- | --- | --- | --- | --- | --- |
| 2 | P-2 | $-C_2H_5$ | 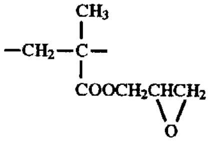 | $-CH_3$ | $-COO(CH_2)_2S-$ | 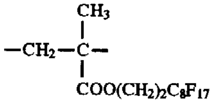 | 65/15/20 |
| 3 | P-3 | $-CH_3$ | 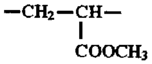 | −H | $COO(CH_2)_2OCO(CH_2)_2S-$ | 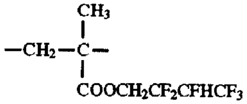 | 60/10/30 |
| 4 | P-4 | $-CH_3$ | 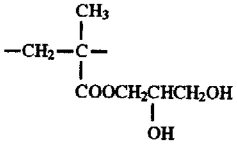 | $-CH_3$ | 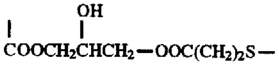 | 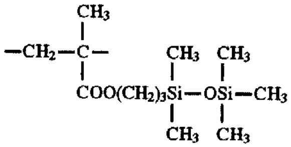 | 65/10/25 |
| 5 | P-5 | $-C_3H_7$ | 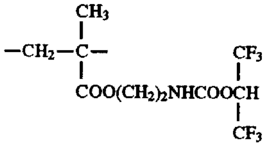 | $-CH_3$ | 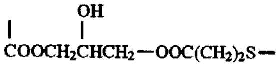 | 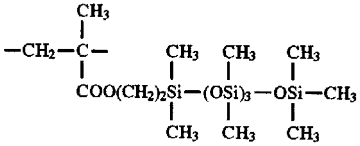 | 65/15/20 |
| 6 | P-6 | $-CH_3$ | 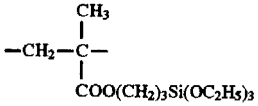 | " | " | 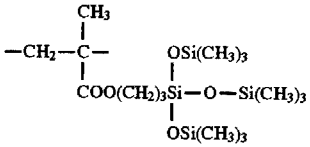 | 50/20/30 |
| 7 | P-7 | $-C_2H_5$ | 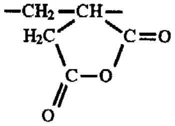 | −H | $-CONH(CH_2)_2S-$ | 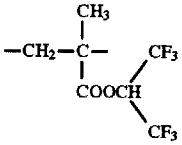 | 57/8/35 |

TABLE 5-continued
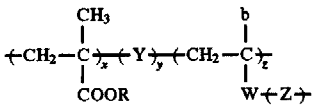
| Synthesis Example of Resin [P] | [P] | —R | —Y— | b | —W— | —Z— | x/y/z (by weight) |
|---|---|---|---|---|---|---|---|
| 8 | P-8 | $-CH_3$ | 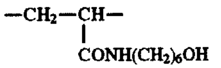 | —H | $COO(CH_2)_2OCO-CH_2S-$ | 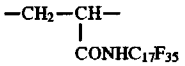 | 70/15/15 |
| 9 | P-9 | $-C_2H_5$ | 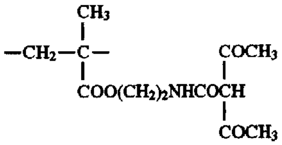 | $-CH_3$ | " | 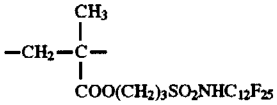 | 70/10/20 |

Synthesis Example 10 of Resin (P): (P-10)

A mixed solution of 60 g of 2,2,3,4,4-hexafluorobutyl methacrylate, 40 g of macromonomer (AA-6) of methyl methacrylate (Mw: $1\times10^4$, a product of Toagosei Chemical Industry Co., Ltd.) and 200 g of benzotrifluoride was heated to 75° C. in a nitrogen stream. One gram of A.I.B.N. was added thereto, and the mixture was reacted for 4 hours. Further, 0.5 g of A.I.B.N. was added thereto, and the mixture was reacted for 4 hours. The resulting Copolymer had an Mw of $6.5\times10^4$.

Resin (P-10)

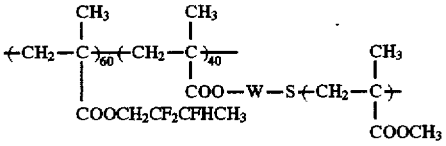

—W—: organic residue (unknown)

Synthesis Examples 11 to 15 of Resin (P): (P-11) to (P-15).

The procedure of Synthesis Example 10 was repeated except that monomers and macromonomers shown in Table 6 below were used in place of the monomers and the macromonomer used in Synthesis Example 10 to prepare copolymers. The resulting copolymers had an Mw of $4.5\times10^4$ to $6.5\times10^4$.

TABLE 6

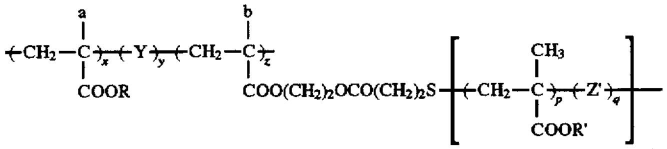

| Synthesis Example of Resin [P] | [P] | a | —R | —Y— | b |
|---|---|---|---|---|---|
| 11 | P-11 | —$CH_3$ | $-(CH_2)_2C_nF_{2n+1}$ n = 8–10 | — | —$CH_3$ |
| 12 | P-12 | —$CH_3$ | $-(CH_2)_2CF_2CFHCF_3$ | — | —H |
| 13 | P-13 | —$CH_3$ | —$CH_2CF_2CF_2H$ | 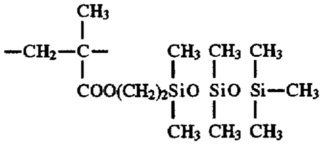 | —$CH_3$ |
| 14 | P-14 | —H | —$CH_2CF_2CFHCF_3$ | 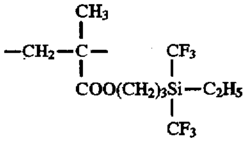 | —$CH_3$ |

| Synthesis Example of Resin [P] | —R' | —Z'— | x/y/z (by weight) | p/q (by weight) |
|---|---|---|---|---|
| 11 | —$CH_3$ | 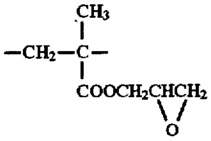 | 70/0/30 | 70/30 |
| 12 | —$CH_3$ | 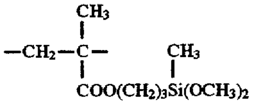 | 60/0/40 | 70/30 |
| 13 | — | 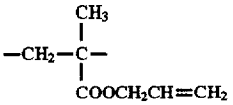 | 40/30/30 | 90/10 |

TABLE 6-continued

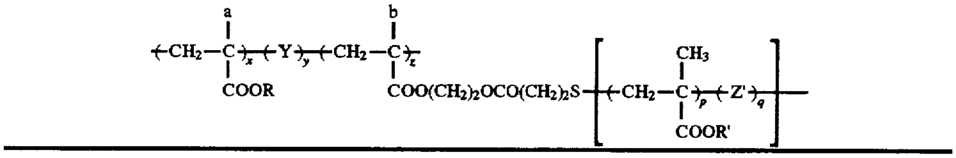

| | | | | |
|---|---|---|---|---|
| 14 | $-C_2H_5$ | 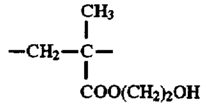 | 30/45/25 | 60/40 |

Synthesis Example 16 of Resin (P): (P-16)

A mixed solution of 67 g of methyl methacrylate, 22 g of methyl acrylate, 1 g of methacrylic acid and 200 g of toluene was heated to 80° C. in a nitrogen stream. Ten grams of the high-molecular azobis initiator (PI-1) was added thereto, and the mixture was reacted for 8 hours. After completion of the reaction, the product was re-precipitated. The resulting precipitate was collected and dried to obtain a copolymer having an Mw of $3\times10^4$. Yield: 75 g.

Initiator (PI-1)

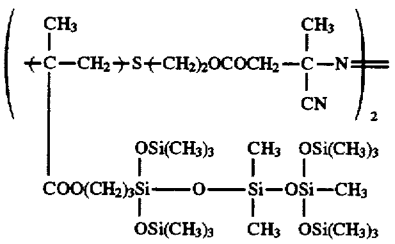

Resin (P-16)

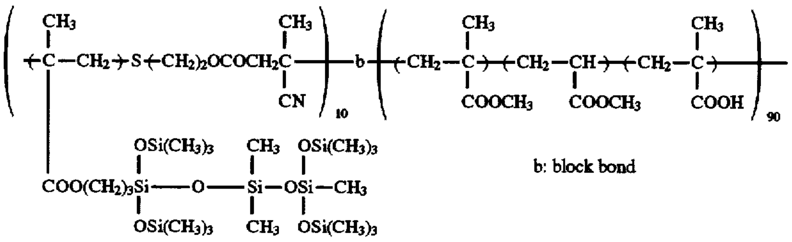

b: block bond

Synthesis Example 17 of Resin (P): (P-17)

A mixed solution of 70 g of methyl methacrylate and 200 g of tetrahydrofuran was thoroughly deaerated in a nitrogen stream and cooled to −20° C. Subsequently, 0.8 g of 1,1-diphenylbutyl lithium was added thereto, and the mixture was reacted for 12 hours. A mixed solution of 30 g of the following monomer (m-1) and 60 g of tetrahydrofuran was thoroughly deaerated in a nitrogen stream and added to the above mixed solution. The mixture was reacted for 8 hours.

The mixture was cooled to 0° C., and 10 ml of methanol was added thereto. The mixture was reacted for 30 minutes, and the polymerization was terminated. The temperature of the resulting polymerization solution was raised with stirring to 30° C., and 3 ml of a 30 % ethanol solution of hydrogen chloride was added thereto. The mixture was stirred for one hour. The solvents were distilled off under reduced pressure until the volume was reduced to half. The reaction product was reprecipitated in one liter of petroleum ether. The precipitate was collected and dried under reduced pressure to obtain a copolymer having an Mw of $6.8\times10^4$. Yield: 76 g.

Monomer (m-1)

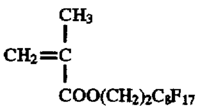

Resin (P-17)

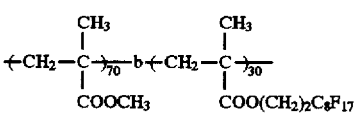

Synthesis Example 18 of Resin (P): (P-18)

A mixed solution of 52.5 g of methyl methacrylate, 22.5 g of methyl acrylate, 0.5 g of (tetraphenylporphinato)

aluminum methyl and 200 g of methylene chloride was heated to 30° C. in a nitrogen stream. The mixed solution was then irradiated with light of 300 W xenon lamp through a glass filter at a distance of 25 cm to thereby carry out a reaction. Further, 25 g of the following monomer (m-2) was added thereto, and the resulting mixture was irradiated with light for 12 hours, and 3 g of methanol was added to the reaction mixture. The mixture was stirred for 30 minutes, and the reaction was terminated. The reaction mixture was reprecipitated in 15 liters of methanol. The precipitate was collected and dried. The resulting copolymer had an Mw of $9\times10^4$. Yield: 78 g.

Monomer (m-2)

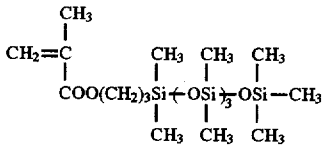

Resin (P-18)

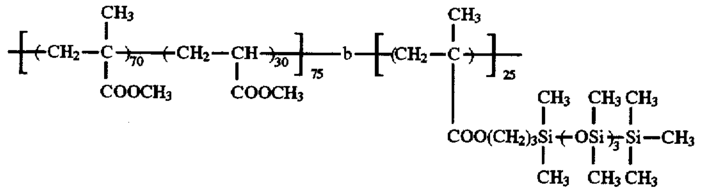

Synthesis Example 19 of Resin (P): (P-19)

A mixture of 50 g of ethyl methacrylate, 10 g of glycidyl methacrylate and 4.8 g of benzyl N,N-diethyldithiocarbamate was closed in a container under nitrogen gas stream conditions and heated to 50° C. The mixture was irradiated with light through a glass filter at a distance of 10 cm for 6 hours by using a 400 W high-pressure mercury vapor lamp to carry out photopolymerization. The polymerization mixture was dissolved in 100 g of tetrahydrofuran. Further, 40 g of the following monomer (m-3) was added thereto. The container was purged with nitrogen gas, and the mixture was irradiated with light for 10 hours. The resulting reaction product was reprecipitated in one liter of methanol. The precipitate was collected and dried. The resulting polymer had an Mw of $4.8\times10^4$. Yield: 73 g.

Monomer (m-3)

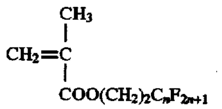

(n: an integer of 8 to 10)

Resin (P-19)

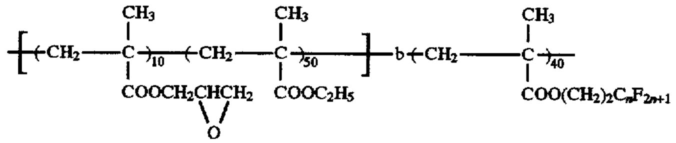

(n: 8 to 10)

Synthesis Example 20 of Resin (P): (P-20)

A mixture of 50 g of methyl methacrylate, 25 g of ethyl methacrylate and 1.0 g of benzylisopropyl xanthate was closed in a container under nitrogen gas stream conditions and heated to 50° C. The mixture was irradiated with light through a glass filter at a distance of 10 cm for 6 hours by using a 400 watt high-pressure mercury vapor lamp to carry out photopolymerization. Subsequently, 25 g of the monomer (m-1) was added thereto, and the container was purged with nitrogen gas. The mixture was again irradiated with light for 10 hours. The reaction product was reprecipitated in 2 liters of methanol. the precipitate was collected and dried. The resulting polymer had an Mw of $6\times10^4$. Yield: 63 g.

Resin (P-20)

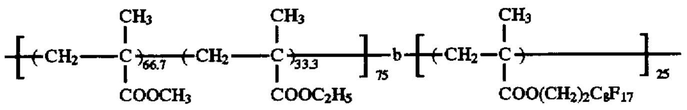

Synthesis Examples 21 to 27 of Resin (P): (P-21) to (P-27)

Copolymers shown in Table 7 below were prepared in the same manner as in the preparation of the copolymer of Synthesis Example 19. The Mw of the resulting polymer were $3.5\times10^4$ to $6\times10^4$.

TABLE 7

| Synthesis Example of Resin [P] | [P] | A-B Type Block copolymer (composition: by weight) |
|---|---|---|
| 21 | P-21 | 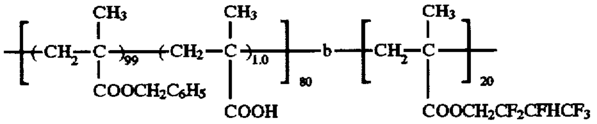 |
| 22 | P-22 | 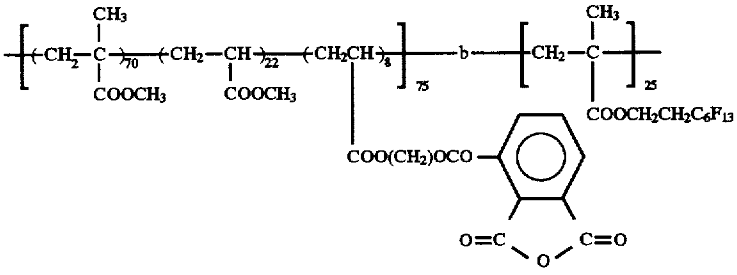 |
| 23 | P-23 | 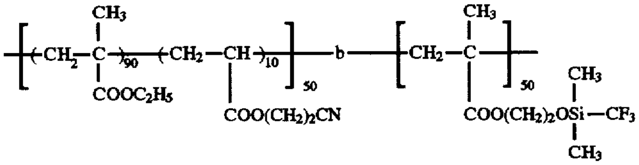 |
| 24 | P-24 | 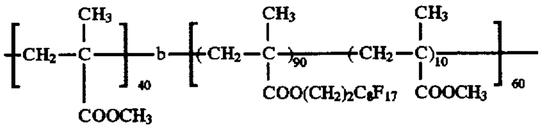 |
| 25 | P-25 | 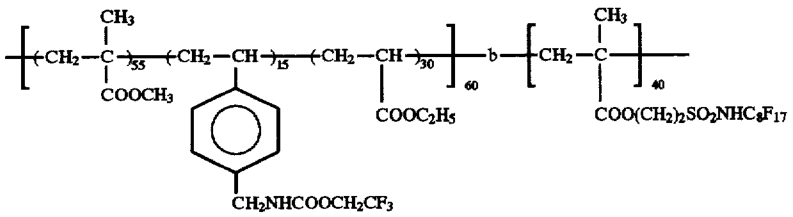 |

TABLE 7-continued

| Synthesis Example of Resin [P] | [P] | A-B Type Block copolymer (composition: by weight) |
| --- | --- | --- |
| 26 | P-26 | 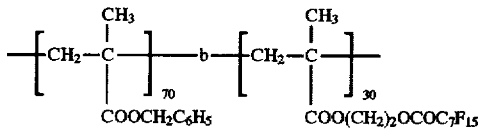 |
| 27 | P-27 | 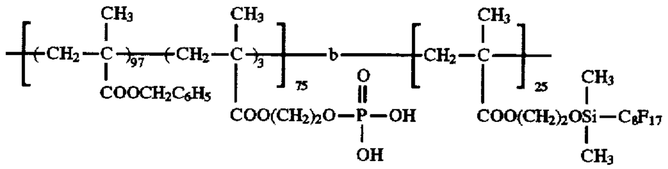 |

Synthesis Example 28 of Resin (P): (P-28)

The procedure of Synthesis Example 19 was repeated except that 18 g of the following initiator (I-1) was used in place of benzyl N,N-diethyldithiocarbamate used in Synthesis Example 19. There was obtained a copolymer having an Mw of $4.5\times10^4$.

Initiator (I-1)

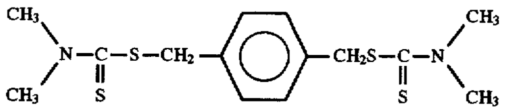

Resin (P-28)

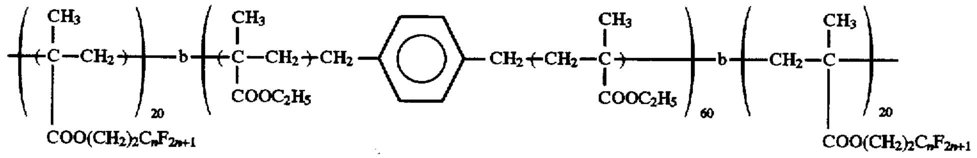

n: an integer of 8 to 10

Synthesis Example 29 of Resin (P): (P-29)

The procedure of Synthesis Example 20 was repeated except that 0.8 g of the following initiator (I-2) was used in place of benzylisopropyl xanthate used in Synthesis Example 20. There was obtained a copolymer having an Mw of $2.5\times10^4$.

Initiator (I-2)

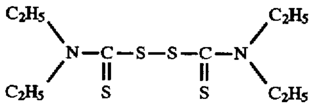

Resin (P-29)

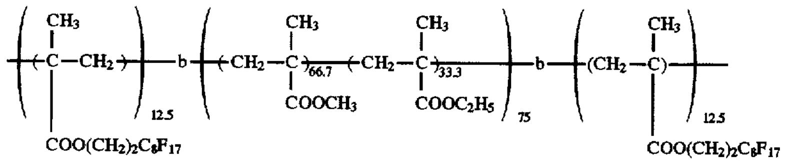

Synthesis Example 30 of Resin (P): (P-30)

A mixed solution of 68 g of methyl methacylate, 22 g of methyl acrylate, 10 g of glycidyl methacrylate, 17.5 g of the following initiator (I-3) and 150 g of tetrahydrofuran was heated in a nitrogen gas stream to 50° C. The solution was irradiated with light through a glass filter at a distance of 10 cm for 10 hours by using a 400 watt high-pressure mercury vapor lamp to carry out photopolymerization. The resulting reaction product was reprecipitated in one liter of methanol. The precipitate was collected and dried. There was obtained a copolymer having an Mw of $4.0\times10^4$. Yield: 72 g.

A mixed solution of 70 g of the copolymer, 30 g of the monomer (m-2) and 100 g of tetrahydrofuran was heated in a nitrogen gas stream to 50° C. The mixture was irradiated with light in the same manner as described above for 13 hours. The reaction product was reprecipitated in 1.5 liters of methanol. The precipitate was collected and dried. There was obtained a copolymer having an Mw of $6\times10^4$. Yield: 73 g.

Initiator (I-3)

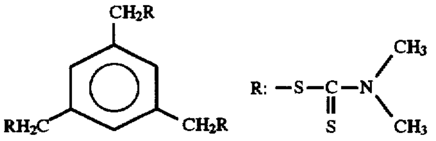

Resin (P-30)

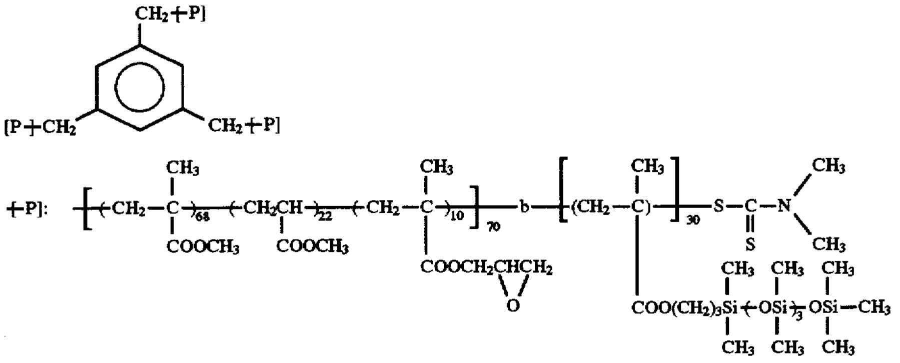

Synthesis Examples 31 to 38 of Resin (P): (P-31) to (P-38)

The procedure of Synthesis Example 30 was repeated except that 0.031 mol of each of initiators (I) shown in Table 8 below was used in place of 17.5 g of the initiator (I-3) used in Synthesis Example 30. The resulting copolymers had an Mw of $4\times10^4$ to $6\times10^4$. Yields: 70 to 89 g.

TABLE 8
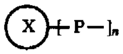 n: integer
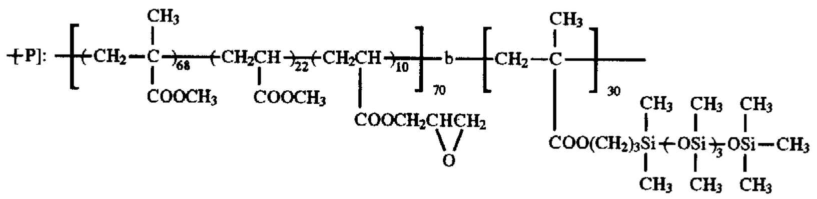
| Synthesis Example of Resin (P) | (P) | Initiator (I) | −R | 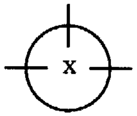 |
|---|---|---|---|---|
| 31 | P-31 | 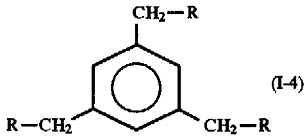 (I-4) | 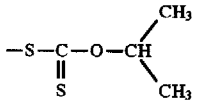 | 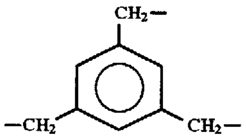 |
| 32 | P-32 | 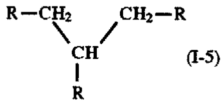 (I-5) | 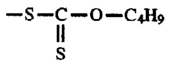 | 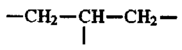 |
| 33 | P-33 | 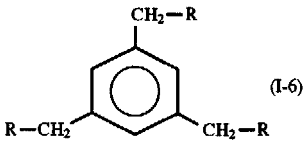 (I-6) | 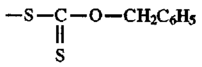 | 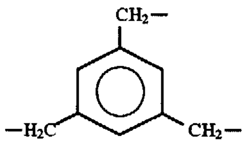 |
| 34 | P-34 | 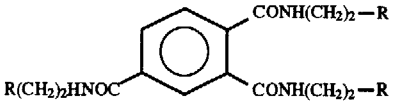 (I-7) | 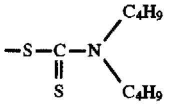 | 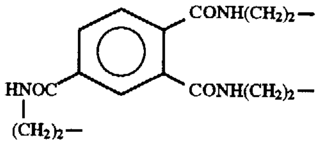 |

TABLE 8-continued
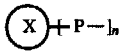 n: integer
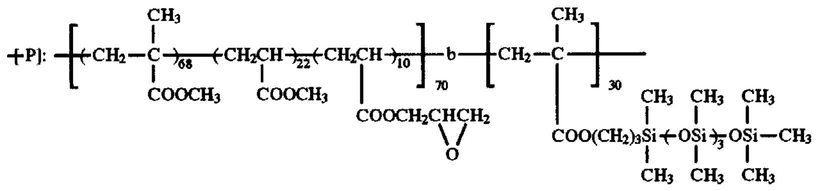
| Synthesis Example of Resin (P) | (P) | Initiator (I) | —R | 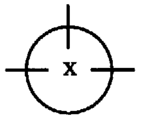 |
|---|---|---|---|---|
| 35 | P-35 | 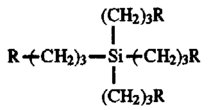 (I-8) | 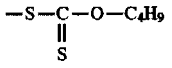 | 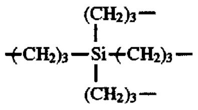 |
| 36 | P-36 | 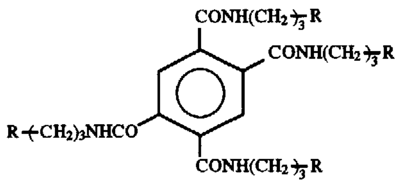 (I-9) | 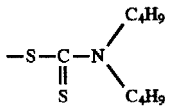 | 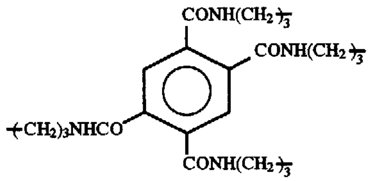 |
| 37 | P-37 | 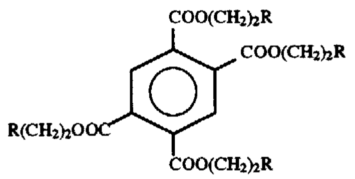 (I-10) | 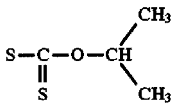 | 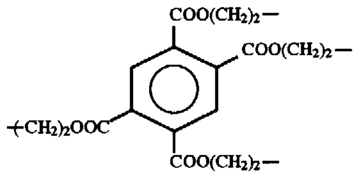 |

TABLE 8-continued
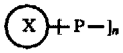 n: integer
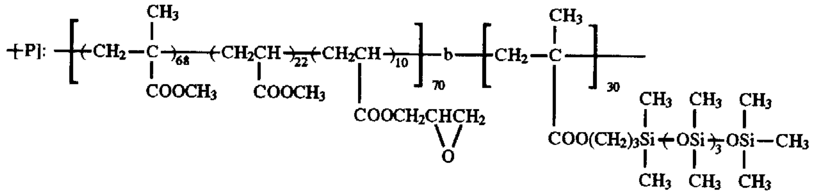
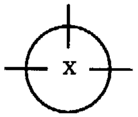
| Synthesis Example of Resin (P) | (P) | Initiator (I) | −R | X |
|---|---|---|---|---|
| 38 | P-38 | 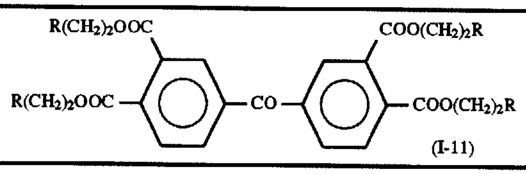 (I-11) | 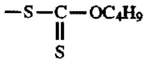 | 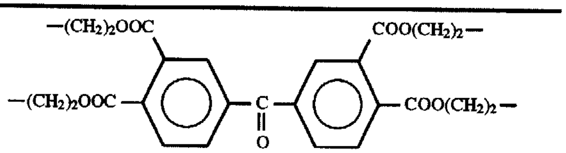 |

Synthesis Example of Resin Particles (PL)

Synthesis Example 1 of Resin Particles (PL): (PL-1)

A mixed solution of 40 g of the following monomer (LM-1), 2 g of ethylene glycol dimethacrylate, 4.0 g of the following resin (LP-1) for dispersion stabilization and 180 g of methyl ethyl ketone was heated to 60° C. in a nitrogen gas stream with stirring. Subsequently, 0.3 g of A.I.V.N. was added thereto, and the mixture was reacted for 3 hours. Further, 0.1 g of A.I.V.N. was added thereto, and the reaction was carried out for 4 hours. After cooling, the reaction mixture was passed through a 200-mesh nylon cloth. The resulting white dispersion was a latex of particles having an average particle size of 0.25 μm.

Monomer (LM-1)

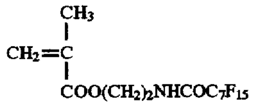

Resin (LP-1) for Dispersion Stabilization

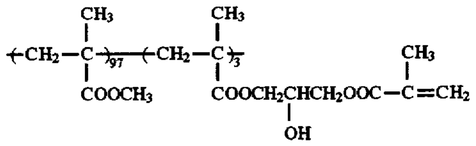

$\overline{M}w$ 3 x $10^4$ (ratio by weight)

Synthesis Example 2 of Resin Particles (PL): (PL-2)

A mixed solution of 5 g of the resin (AB-6) (monofunctional macromonomer composed of butyl acrylate unit, a product of Toagosei Chemical Industry Co., Ltd.) for dispersion stabilization and 140 g of methyl ethyl ketone was heated to 60° C. in a nitrogen stream with stirring. A mixed solution of 40 g of the following monomer (LM-2), 1.5 g of ethylene glycol diacrylate, 0.2 g of A.I.V.N. and 40 g of methyl ethyl ketone was added dropwise thereto over a period of one hour. The mixture as such was reacted for 2 hours. Further, 0.1 g of A.I.V.N. was added thereto, and the mixture was reacted for 3 hours to obtain a white dispersion. After cooling, the dispersion was filtered through a 200-mesh nylon cloth to obtain a dispersion of particles having an average particle size of 0.35 μm.

Monomer (LM-2)

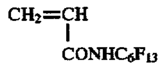

Synthesis Examples 3 to 11 of Resin Particles (PL): (PL-3) to (PL-11)

Resin particles were prepared in the same manner as in the preparation of the resin particles of Synthesis Example 1 except that compounds shown in Table 9 below were used in place of the monomer (LM-1), ethylene glycol dimethacrylate and methyl ethyl ketone used in Synthesis Example 1. The resulting resin particles had an average particle size of 0.15 to 0.30 μm.

TABLE 9

| Synthesis Example of Particle (PL) | (PL) | Monomer (LM) | | Crosslinking Polyfunctional Monomer | Reaction Solvent |
|---|---|---|---|---|---|
| 3 | PL-3 | 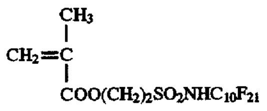 | LM-3 | Ethylene Glycol Dimethacrylate 2.5 g | Methyl Ethyl Ketone |
| 4 | PL-4 | 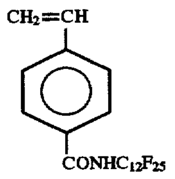 | LM-4 | Divinylbenzene 3 g | Methyl Ethyl Ketone |
| 5 | PL-5 |  | LM-5 | — | Methyl Ethyl Ketone |
| 6 | PL-6 | 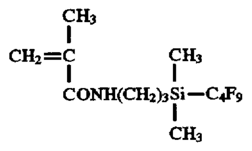 | LM-6 | Diethylene Glycol Diacrylate 5 g | n-Hexane |

TABLE 9-continued

| Synthesis Example of Particle (PL) | (PL) | Monomer (LM) | | Crosslinking Polyfunctional Monomer | Reaction Solvent |
|---|---|---|---|---|---|
| 7 | PL-7 | 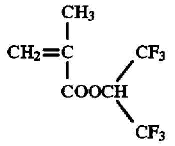 | LM-7 | Ethylene Glycol Dimethacrylate 3.5 g | n-Hexane |
| 8 | PL-8 | 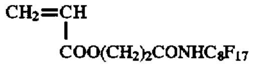 | LM-8 | Trimethylol Propane Trimethacrylate 2.5 g | Methyl Ethyl Ketone |
| 9 | PL-9 | 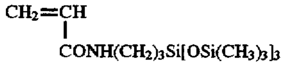 | LM-9 | Trivinylbenzene 3.3 g | Ethyl Acetate/ n-Hexane (4/1) by wt. |
| 10 | PL-10 |  | LM-10 | Divinyl Glutaconate 4 g | Ethyl Acetate/ n-Hexane (2/1) by wt. |
| 11 | PL-11 |  | LM-11 | Propylene Glycol Diacrylate 3 g | Methyl Ethyl Ketone |

Synthesis Examples 12 to 17 of Resin Particle (PL): (PL-12) to (PL-17)

The procedure of Synthesis Example 2 was repeated except that each of resins shown in Table 10 below was used in place of 5 g of the resin (AB-6) used in Synthesis Example 2. The resulting particles had an average particle size of 0.10 to 0.25 μm.

TABLE 10

| Synthesis Example of Resin Particle (PL) | (PL) | Resin (LP) for Dispersion Stabilization | (Amount) |
|---|---|---|---|
| 12 | PL-12 | 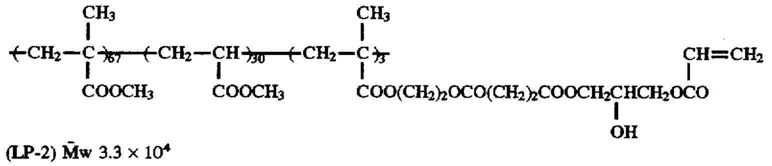 (LP-2) $\bar{M}w$ 3.3 × $10^4$ | 4 g |
| 13 | PL-13 | 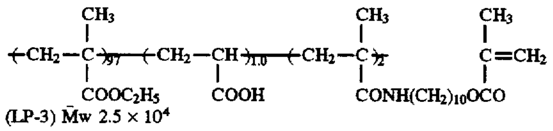 (LP-3) $\bar{M}w$ 2.5 × $10^4$ | 2 g |
| 14 | PL-14 | 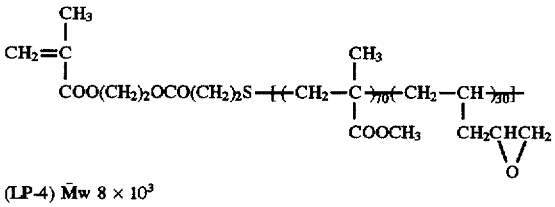 (LP-4) $\bar{M}w$ 8 × $10^3$ | 6 g |

TABLE 10-continued

| Synthesis Example of Resin Particle (PL) | (PL) | Resin (LP) for Dispersion Stabilization | (Amount) |
|---|---|---|---|
| 15 | PL-15 | 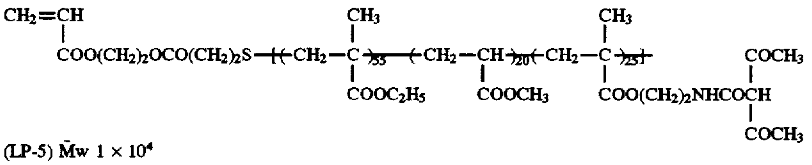 (LP-5) $\bar{M}w$ 1 × $10^4$ | 6 g |
| 16 | PL-16 | 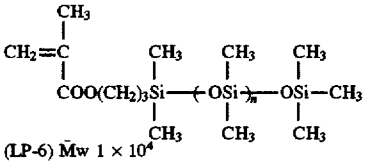 (LP-6) $\bar{M}w$ 1 × $10^4$ | 4 g |
| 17 | PL-17 | 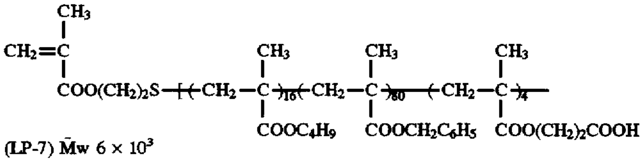 (LP-7) $\bar{M}w$ 6 × $10^3$ | 5 g |

Synthesis Examples 18 to 23 of Resin Particle (PL-18) to (PL-23)

The procedure of Synthesis Example 2 was repeated except that monomers shown in Table 11 below were used in place of 40 g of the monomer (LM-2) used in Synthesis Example 2, and 6 g of the following resin (LP-8) was used in place of 5 g of the resin (AB-6) for dispersion stabilization. The resulting resins had an average particle size of 0.05 to 0.20 μm.

Resin (LP-8) for Dispersion Stabilization

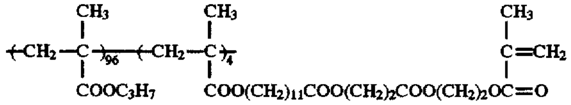

$\bar{M}w$ 3 × $10^4$

TABLE 11

| Synthesis Example of Resin Particle (PL) | (PL) | Monomer (LM) | | Other Monomer | |
|---|---|---|---|---|---|
| 18 | PL-18 | 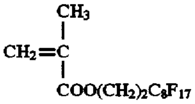 LM-12 | 30 g |  | 10 g |
| 19 | PL-19 | 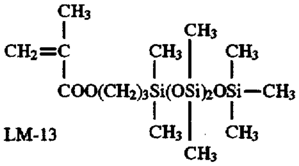 LM-13 | 25 g | Glycidyl Methacrylate | 15 g |
| 20 | PL-20 | 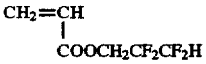 LM-14 | 20 g | Acrylonitrile | 20 g |

TABLE 11-continued

| Synthesis Example of Resin Particle (PL) | (PL) | Monomer (LM) | | Other Monomer | |
|---|---|---|---|---|---|
| 21 | PL-21 | 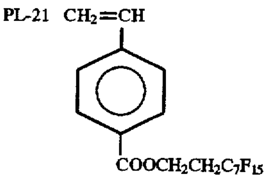 LM-15 | 25 g | 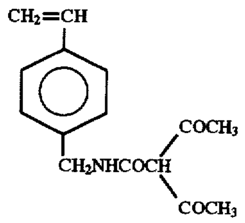 | 15 g |
| 22 | PL-22 | 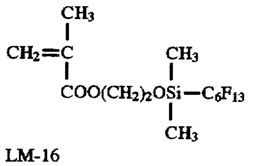 LM-16 | 20 g | Methyl Methacrylate | 20 g |
| 23 | PL-23 | 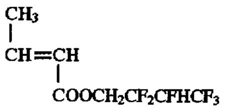 LM-17 | 20 g | Vinyl Acetate | 20 g |

EXAMPLE 1

A mixture of 2 g of X-type metal phthalocyanine (a product of Dainippon Ink & Chemicals Inc.), 10 g of the following binder resin (B-1), 0.3 g of the resin (P-1), 0.15 g of the following compound (A) and 80 g of tetrahydrofuran together with glass bead was placed in a 500 ml glass container and dispersed in a paint shaker (a product of Toyo Seiki KK) for 60 minutes. Glass bead was then recovered by filtration to obtain a dispersion for the photoreceptive layer.

Binder Resin (B-1)

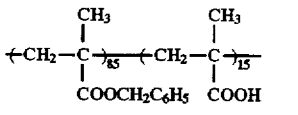

$\overline{Mw}$ 4 × $10^4$

Compound (A)

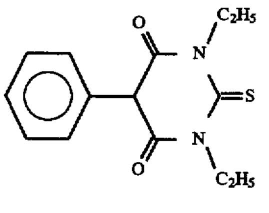

The resulting dispersion was coated on base paper having a thickness of 0.2 mm for paper plate master by means of wire bar coating, the base paper being previously subjected to an electrical conductivity imparting treatment and a solvent resistance imparting treatment. The coated paper was dried to the touch and then heated at 110° C. in a circulating oven. The resulting photoreceptor had a film thickness of 8 μm. The adhesion of the photoreceptor was measured according to JIS Z0237-1980, "Testing Method of Adhesive Tape Adhesive Sheet". Adhesion was 15 g.f.

In another experiment, a dispersion for the photoreceptive layer was prepared in the same manner as described above except that 0.3 g of the resin (P-1) was omitted. The adhesion of the surface of the photoreceptor composed of the photoreceptive layer prepared by the dispersion was at least 450 g.f. When the transfer layer was formed thereon, no releasability was found.

The photoreceptor having an easily releasing surface as the electrophotographic photoreceptor 11 was fed to the apparatus of FIG. 2 (the compound (S) feeding means was not provided).

Electrophotographic process was conducted.

The photoreceptor 11 kept in a dark place was passed under the corona charging device 18 and corona-charged to +450 V. The photoreceptor was exposed to light of 788 nm by using a semiconductor laser device 19 so as to provide an exposure amount of 30 erg/$cm^2$ by a negative image mode on the basis of information on yellow color of yellow, magenta, cyan and black colors which were previously red from the original by a color scanner, subjected to color separation, corrected with regard to color reproducibility peculiar to the system and stored as digital image data in the hard disk in the system.

Positively chargeable yellow toner for signature system (manufactured by Eastman Kodak Co.) was diluted 75 times with Isopar H (a product of Exxon Co.) and fed to the yellow liquid development unit 14y. Bias voltage of +350 V was applied to the development unit 14y side, and reversal development was carried out so as to allow the toner to be electrodeposited on the exposed area. The photoreceptor was rinsed by using a bath containing Isopar H alone to remove stain on the non-image area, and passed under the suction exhaust unit 15 and under the preheating means 16 to dry it.

The above toner development processing was repeated for each of magenta, cyan and black colors to obtain the color toner image 25.

Subsequently, 8 g (on a solid basis) of the resin particles (AL-1), 0.02 g of a positive charge controlling agent (CD-1) {(octadecyl vinyl ether/half maleic acid dodecylamide) copolymer)} and 10 g of branched tetradecyl alcohol (FOC-1400, a product of Nissan Chemical Industries, Ltd.) were added to one liter of Isopar H, and the mixture was adjusted to obtain a dispersion (L-1) for electrodeposition. The dispersion was fed onto the toner image by using the method and the device of FIG. 4.

The drum of the photoreceptor 11 was rotated at a peripheral speed of 10 mm/sec. While the dispersion 12*a* was fed from the electrodeposition unit 50 to the surface of the photoreceptor, the photoreceptor 11 side was earthed, and a voltage of +200 V was applied to the electrode side of the electrodeposition unit 50 to carry out the electrodeposition of the resin particles. The dispersion was removed by air squeezing with the suction exhaust unit 15, and the resin particles were molten by the infrared line heater of the preheating means 16 to form a film, thus forming the transfer layer 12 composed of the thermoplastic resin. The film had a thickness of 3 μm.

A drum provided with blanket 9600-A (adhesion: 80 g.f/10 mm wide; the total thickness: 1.6 mm; a product of Meiji Rubber KK) for offset printing as the primary receptor 20 was previously heated to 120° C. The photoreceptor 11 was heated by using the preheating means 16 and the temperature controlling means 17 so that the surface temperature of the photoreceptor became 60° C.

The drum of the photoreceptor 11 and the drum of the primary receptor 20 were brought into contact with each other, and heating and pressurizing were conducted under such conditions that nip pressure was 3 $kgf/cm^2$ and drum peripheral speed was 5 mm/sec, whereby the color toner image 25 together with the transfer layer 12 could be completely transferred onto the primary receptor 20.

The surface temperature of the drum of the primary receptor 20 was set to 60° C. by the temperature controlling means 17. The back-up roller 22 for transfer was set to 130° C. The back-up roller 23 for releasing was set to 10° C. Printing coated paper 21 (the final receiving material) was guided between the drum of the primary receptor 20 and the rollers 22, 23, and heated and pressurized under such conditions that nip pressure was 5 $kgf/cm^2$ and drum peripheral speed was 10 mm/sec, whereby the color toner image was completely transferred onto the coated paper. There was obtained a clear color image of high quality.

For the purpose of comparison, a color image was formed on the coated paper in the same manner as described above except that the toner image was directly transferred onto the primary receptor 20 without providing the transfer layer 12 on the photoreceptor 11 after the toner image 25 was formed.

It was found that the resulting color image on the coated paper had a lack of the toner image and unevenness in image density. Further, fine lines and fine letters were visually observed by a loupe of 20 magnifications, and a lack of fine images was found.

The surface of the photoreceptor was observed, and it was found that toner image area was left behind. This means that when the photoreceptor is to be repeatedly used, the surface of the photoreceptor must be subjected to cleaning to remove the remaining toner, and a cleaning device is required, or there is caused a problem that the surface of the photoreceptor is damaged by cleaning.

In the present invention, the toner image is completely released from the photoreceptor, and the toner image can be easily, completely transferred from the primary receptor onto the final receiving material. Accordingly, the above-described problem is not caused, and since the toner image is protected by the transfer layer, the resulting color duplicate has excellent stability.

EXAMPLE 2

An electrophotographic photoreceptor (the surface thereof had adhesion of 80 g.f) obtained by modifying the surface of an amorphous silicon photoreceptor with tridecylfluorooxyltrimethoxysilane was used. In the same manner as in Example 1, the photoreceptor was fed to the apparatus of FIG. 2 (the compound (S) feeding device 10 was not provided).

The photoreceptor 11 was corona-charged to −700 V. The same digital image data as those of Example 1 were used. The photoreceptor was exposed to light of 780 mm by using semiconductor laser so as to provide an exposure amount of 25 $erg/cm^2$ by a negative image mode on the basis of information on yellow. Residual potential of the exposure area was +120 V. Yellow toner for Basertech 3000 (color electrostatic plotter, a product of Xerox) was diluted with Isopar H to a volume of 50 times, and used. Bias voltage of +300 V was applied to the photoreceptor side electrode of a development device having a pair of plate electrodes, and reversal development was carried out so as to allow the toner to be electrodeposited on the exposed area. The photoreceptor was then rinsed by using a bath containing Isopar H alone to remove stain on the non-image area.

The above processing was repeated for each of magenta, cyan and black colors.

The image of the thus obtained photoreceptor was fixed by a fixing method using heated roll. The image (fog, image quality) was visually evaluated by an optical microscope of 200 magnifications to confirm the reproducibility of the duplicated image before transfer.

The image quality of the toner image 25 on the photoreceptor 11 was such that fine lines, fine letters and highly fine image area in the dot area having continuous gradation were clear, the image density in the solid area was as good as at least 1.2, and fog was not found in the non-image area.

The surface temperature of the photoreceptor was set to 60° C., and the drum of the photoreceptor 11 was rotated at a peripheral speed of 10 mm/sec as in Example 1. Separately, there was prepared a dispersion (L-2) of positively chargeable resin particles by adding 4 g (on a solid basis) of the thermoplastic resin particles (AL-17), 4 g (on a solid basis) of the thermoplastic resin particles (AL-4), 0.05 g of the charge controlling agent (CD-2) ([1-tetradecene/half maleic acid decyl amide]copolymer) and 10 g of branched octadecyl alcohol (FOC-1800, a product of Nissan Chemical Industries, Ltd.) to Isopar G to make the total amount one liter. While the dispersion was fed to the surface of the photoreceptor 11 by using a slit electrodeposition device, the photoreceptor side was earthed, and a voltage of −100 V was applied to the electrode side of the slit electrodeposition device to carry out the electrodeposition of the resin particles and fixing, thus providing a layer of 2 μm in thickness.

A film of 10 μm in thickness was formed on the surface of the roll of blanket 9600-A used in Example 1 by using 5 parts by weight of the resin (P-2) and 0.01 g of phthalic anhydride based on 100 parts by weight of isoprene, and the film was cured by heating. The resulting product (the adhesion of the surface thereof being 130 g.f) was used as the primary receptor 20. The color image 25 was transferred onto coated paper in the same manner as in Example 1 except that the product obtained above was used as the primary receptor 20.

The resulting color image was clear. Further, since the color image was coated with the transfer layer having a sufficient strength, the image area was not scraped off even when the image area was rubbed. Further, writeability with an HB pencil and sealability were superior.

EXAMPLE 3

A mixture of 2 g of X-type metal-free phthalocyanine (a product of Dainippon Ink & Chemicals Inc.), 10 g of the following binder resin (B-2), 0.15 g of the following compound (B) and 80 g of tetrahydrofuran together with glass bead was placed in a 500 ml glass container and dispersed in a paint shaker (a product of Toyo Seiki Seisakusho) for 60 minutes. Further, 2 g of the resin (P-35) according to the present invention, 0.1 g of gluconic anhydride and 0.002 g of o-chlorophenol were added thereto, and the mixture was dispersed for 10 minutes. Glass bead was then recovered by filtration to obtain a dispersion for the photoreceptive layer.

Binder Resin (B-2)

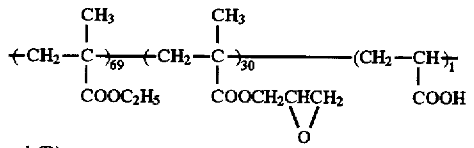

Compound (B)

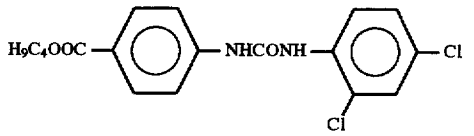

The dispersion was coated on an aluminum support by wire bar coating, dried to the touch, heated at 110° C. in a circulating oven for 20 seconds and further heated at 140° C. for 2 hours to carry out a curing treatment. The resulting photoreceptor had a film thickness of 8 μm. The adhesion of the photoreceptor was measured according to JIS Z 0237-980, "Testing Method of Adhesive Tape Adhesive Sheet". It was found that the surface of the photoreceptor had adhesion of 5 g.f.

For the purpose of comparison, a photoreceptor was prepared in the same manner as described above except that 2 g of the resin (P-35) was omitted in the preparation of the photoreceptive layer. The surface of the resulting photoreceptor had adhesion of at least 450 g.f and no releasability even when the transfer layer was formed thereon.

The photoreceptor was fed to the apparatus of FIG. 2 (the compound (S) feeding means 10 was not provided) having the device of FIG. 6 applied thereto. After the color toner image 25 was formed on the photoreceptor 11 in the same manner as in Example 1, the transfer layer 12 was formed by the following hot-melt coating method.

An ethylene-vinyl acetate copolymer (vinyl chloride content: 20% by weight; softening point: 90° C. as measured by ball and ring test) was used as the thermoplastic resin for the transfer layer. The resin was coated on the surface of the photoreceptor 11 at a coating rate of 20 mm/sec by using a hot-melt coater 30 set to 120° C. After the coated photoreceptor was cooled by blowing cooling air from the unit 15 against the surface of the photoreceptor, the surface of the photoreceptor was kept at a temperature of 30° C. The transfer layer had a thickness of 3 μm.

The transfer of the transfer layer onto the primary receptor 20 and then onto the coated paper was carried out in the same manner as in Example 1 to form the color image on the coated paper 21.

The color image on the coated paper was clear and not scraped off because the toner image on the coated paper was completely covered with the thermoplastic resin of the transfer layer.

EXAMPLE 4

The procedure of Example 3 was repeated except that the transfer layer was formed by transfer from release paper in the following manner in place of the hot-melt coating to obtain a color image duplicate.

The photoreceptor 11 was fed to the apparatus of FIG. 2 (provided that the compound (S) feeding means 10 was not provided) having the device of FIG. 5 applied thereto. Separate paper (a product of Oji Paper Co., Ltd.) was used as release paper 40, and a coat of 3 μm in thickness composed of a 5/5 by weight composition of polyvinyl acetate and a methyl methacrylate/methyl acrylate (6/4 by weight) copolymer was formed thereon. The resulting coated paper was fed to the device of FIG. 5 and transferred onto the photoreceptor 11 having the toner image 25 formed thereon under such conditions that pressure between the rollers was 3 kgf/$cm^2$, the surface temperature was 80° C. and the transfer rate was 10 mm/sec. to form the transfer layer 12.

The color image on the coated paper was a clear image having no fog and had a sufficient strength. Further, writeability and sealability were superior.

EXAMPLES 5 TO 14

The procedure of Example 1 was repeated except that each of the resin particles (AL) shown in Table 12 below was used in place of 8 g of -the resin particles (AL-1) used in the dispersion (L-1) of Example 1 to form the color image.

TABLE 12

| Example | Resin Particle (AL) (by weight) |
|---|---|
| 5 | AL-2/AL-17 (8/2) |
| 6 | AL-4/AL-18 (5/5) |
| 7 | AL-5/AL-19 (6/4) |
| 8 | AL-8/AL-20 (7/3) |
| 9 | AL-9/AL-21 (4/6) |
| 10 | AL-10/AL-23 (5/5) |
| 11 | AL-11/AL-24 (8/2) |
| 12 | AL-12/AL-27 (5/5) |
| 13 | AL-14/AL-26 (4/6) |
| 14 | AL-15/AL-28 (4/6) |

The resulting color duplicates did not suffer from ground staining and had images of good quality. Namely, the toner images formed on the photoreceptor had such good properties that the images were well-reproduced and the non-image area was not fogged. Further, the images together with the transfer layer were completely transferred onto the coated paper without causing unevenness in transfer. Furthermore, the duplicated paper could be written and sealed as in plain paper.

EXAMPLES 15 TO 30

The procedure of Example 3 was repeated except that each of the resins shown in Table 12 below was used in place of the ethylene-vinyl acetate copolymer used in the formation of the transfer layer 12. Similar results to those obtained in Example 2 were obtained.

TABLE 13

| Example | Thermoplastic Resin |
|---|---|
| 15 | Cellulose Acetate Butyrate: Cellidor Bsp (Bayer AG) |
| 16 | Polyvinyl Butyral Resin: S-Lec (Sekisui Chemical Co., Ltd.) |
| 17 | Cellulose Propionate: Cellidoria (Daicel Co., Ltd.) |
| 18 | Polyvinyl Acetate |
| 19 | 8/2 by weight of Vinyl Acetate/Crotonic Acid (99/1 by weight) Copolymer and Cellidor Bsp |
| 20 | Methyl Methacrylate/Methyl Acrylate (60/40 by weight) Copolymer |
| 21 | Polypropyl Methacrylate |
| 22 | 5/5 by weight of Polyvinyl Methyl Ether and Polyvinyl Acetate |
| 23 | (Styrene/Butadiene) Copolymer |
| 24 | Styrene-Butadiene Copolymer: Solprene (Asahi Chemical Industry Co., Ltd.) |
| 25 | Polydecamethylene Terephthalate |
| 26 | Polydecamethylene Isophthalate |

TABLE 13-continued

| Example | Thermoplastic Resin |
|---|---|
| 27 | (Styrene/Vinyl Acetate) Copolymer (20/80 by weight) |
| 28 | Polyhexamethylene Succinate |
| 29 | Poly-4-methylpentene-1 |
| 30 | Polypentamethylene Carbonate |

EXAMPLES 31 TO 37

The procedure of Example 4 was repeated except that Sun Release (a product of Sanyo Kokusaku Pulp Co., Ltd.) was used as release paper in place of separate paper 40, and a coat of 3.5 μm in thickness composed of each of resins (A) shown in Table 14 below was formed as the transfer layer on the release paper to form a color image.

TABLE 14

| Example | Resin (A) | |
|---|---|---|
| 31 | (60/40) by weight of Vinyl Acetate/Vinyl Butyrate (8/2 by weight) Copolymer and Benzyl Methacrylate/Methyl Methacrylate (8/2 by weight) Copolymer | |
| 32 | 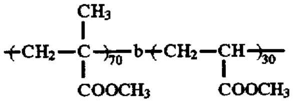 | $\bar{M}w$ $4 \times 10^4$ (-b-: block bond) |
| 33 | 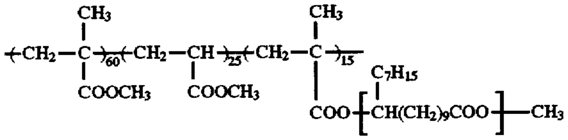 | $\bar{M}w$ $4 \times 10^4$ (graft moiety $\bar{M}w$ $4 \times 10^3$) |
| 34 | 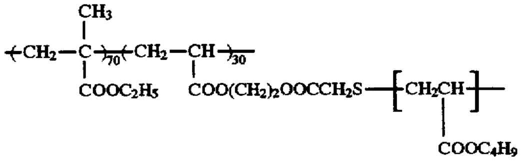 | $\bar{M}w$ $4 \times 10^4$ (graft moiety $\bar{M}w$ $6 \times 10^3$) |
| 35 | (70/30) by weight of Vinyl Acetate/Vinyl Propionate (7/3 by weight) Copolymer | |
| 36 | 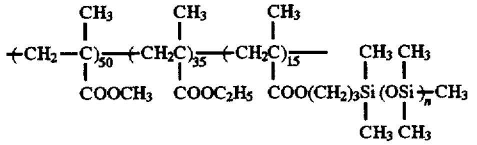 and Polyvinyl Acetate (40/60 by weight) | $\bar{M}w$ $5 \times 10^4$ (graft moiety $\bar{M}w$ $1 \times 10^4$) |
| 37 | 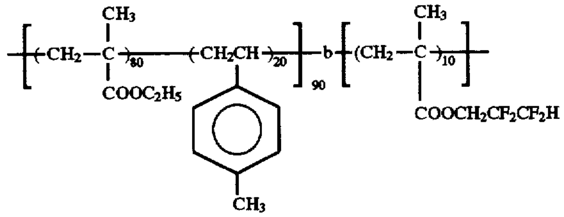 | $\bar{M}w$ $4 \times 10^4$ |

The resulting color images were clear images which did not suffer from ground fogging. It was found that the images were scarcely deteriorated in comparison with the original. This shows that that transfer layer is uniformly, completely transferred by the above method wherein after the toner image is formed, the transfer layer is formed on the photoreceptor by using the release paper, and further the transfer layer is transferred onto the coated paper, and the above method does not any adverse effect on the image.

EXAMPLE 38

Five grams of 4,4'-bis(diethylamino)-2,2'-dimethyltriphenylmethane as the organic photoconductive material, 4 g of the following binder resin (B-3), 0.4 g of the resin (P-27), 40 mg of the following dye (D-1) and 0.2 g of the following anilide compound (C) as the chemical sensitizing agent were dissolved in a mixture of 30 ml of methylene chloride and 20 ml of ethylene chloride to obtain a dispersion for the photoreceptive layer.

Binder Resin (B-3)

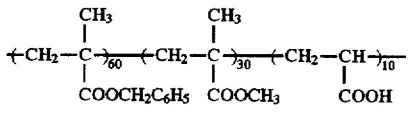

$\overline{M}w$ 8 × $10^4$

Dye (D-1)

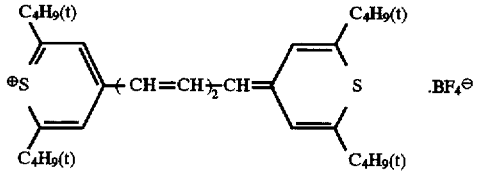

Compound (C)

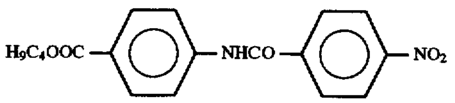

The dispersion for the photoreceptive layer was coated on an electrically conductive transparent support (having an indium-deposited film on a polyethylene terephthalate support of 100 μm in thickness; surface resistance: $10^3\Omega$) by using wire round rod to form an organic thin film having a photoreceptive layer of about 4 μm. The surface of the photoreceptor had adhesion of 8 g.f.

An image was formed on the photoreceptor in the same manner as in Example 1 except that the photoreceptor obtained above was used in place of the photoreceptor used in Example 1. The duplicated color image on the coated paper obtained by transfer was a clear image which did not suffer from ground staining, and the image had good durable strength.

EXAMPLE 39

The procedure of Example 2 was repeated except that a photoreceptor obtained by providing a releasing surface layer of 1.5 μm in thickness on an amorphous silicon photoreceptor in the following manner was used as the electrophotographic photoreceptor 11.

Formation of Releasing Surface Layer

A toluene solution consisting of 1.0 g of the resin (P-12), 15 g of the following binder resin (B-4), 0.03 g of phthalic anhydride and 100 g of toluene was coated on the amorphous silicon photoreceptor in such an amount as to provide a coat of 1.5 μm in thickness. The coat was dried to the touch and then heated at 130° C. for one hour to cure the film. The surface of the amorphous silicon photoreceptor having the surface layer formed above had adhesion of 8 g.f.

Binder Resin (B-4)

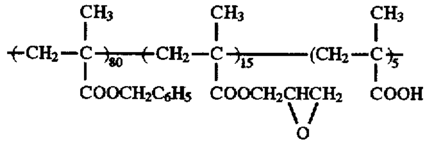

$\overline{M}w$ 3 × $10^4$ (by weight)

In the same manner as in Example 2, image formed on the photoreceptor was superior, and the duplicated image transferred onto the coated paper was an image almost completely reproduced from the original. Unevenness in transfer was not found. Further, the duplicated paper could well-filed, and peeling caused by adhesion of sheets was not found. Furthermore, sealability was superior.

EXAMPLE 40

A mixture of 5 g of the following bis-azo pigment, 95 g of tetrahydrofuran and 5 g of a polyester resin (Vylon 200, a product of Toyobo Co., Ltd.) was thoroughly pulverized in a ball mill. The mixture was taken out, and 520 g of tetrahydrofuran was added thereto with stirring. The resulting dispersion was coated on the electrically conductive transparent support used in Example 1 by using a wire round rod to form a charge generating layer of about 0.7 μm.

Bis-azo Pigment

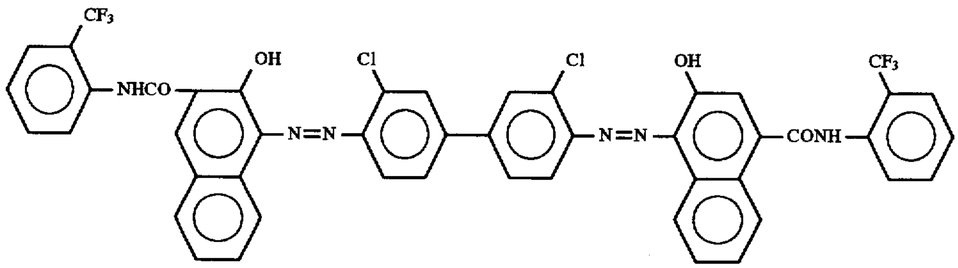

Subsequently, a mixed solution of 20 g of the following hydrazone compound, 20 g of a polycarbonate resin (Lexane 121, a product of GE) and 160 g of tetrahydrofuran was coated on the charge generating layer by using a wire round rod. The coat was dried at 60° C. for 30 seconds and then heated at 100° C. for 20 seconds to form a charge transporting layer of about 18 μm, thus preparing an electrophotographic photoreceptor having a photoreceptive layer composed of two layers.

Hydrazone Compound

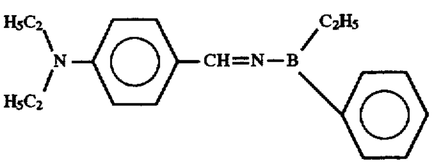

Further, a mixed solution of 13 g of the following resin (P-3), 0.2 g of phthalic anhydride, 0.002 g of o-chlorophenol and 100 g of toluene was coated on the photoreceptive layer by using a wire round rod in such an amount as to provide a film of 1 μm in thickness, thereby forming a surface layer for imparting releasability. The film was dried to the touch and then heated at 120° C. for one hour. The surface of the resulting photoreceptor had adhesion of 5 g.f.

Resin (P-39)

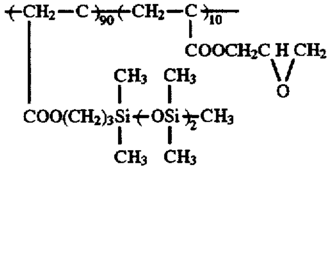

The photoreceptor was charged to a surface potential of +500 V and exposed to light of 633 nm by using He—Ne laser beam so as to provide an exposure amount of 30 erg/cm$^2$. Subsequently, a color toner image was formed on the photoreceptor in the same manner as in Example 1. The transfer layer of 4.5 μm in thickness was formed thereon by using 4.5 g of the resin particles (AL-17) and 2 g of the resin particles (AL-10) in the same manner as in Example 1. Further, a full color image was formed on the coated paper in the same manner as in Example 1. The resulting duplicated paper had good performance as in Example 1.

EXAMPLE 41

A mixture of 100 g of photoconductive zinc oxide, 15 g of the following binder resin (B-5), 5 g of the following binder resin (B-6), 2 g of the resin (P-28), 0.01 g of the following dye (D-2), 0.1 g of salicylic acid and 150 g of toluene was placed in a ball mill and dispersed for 2 hours to obtain a dispersion for the photoreceptive layer.

Binder Resin (B-5)

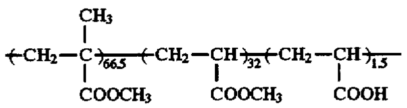

$\overline{Mw}$ 6.8 × 10$^4$

Binder Resin (B-6)

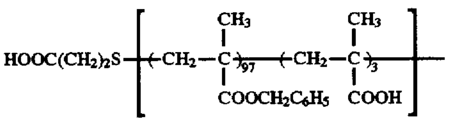

$\overline{Mw}$ 8 × 10$^3$

Dye (D-2)

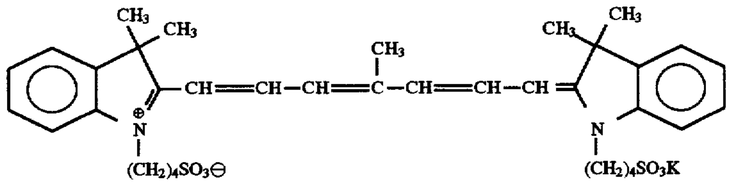

The dispersion was coated on base paper having a thickness of 0.2 mm for paper plating by wire bar coating, said base paper being previously subjected to an electrical conductivity-imparting treatment and a solvent resistance-imparting treatment. The resulting coated paper was dried to the touch, then heated at 110° C. in a circulating oven and left to stand at 25° C. and 65% RH in a dark place for 24 hours. The surface of the photoreceptor had adhesion of 12 g.f.

The photoreceptor 11 kept in a dark place was corona-charged to −600 V and exposed to light of 780 nm by using semiconductor laser 19 so as to provide an exposure amount of 25 erg/cm$^2$ by positive image mode on the basis of information on first yellow by using the same digital image data as those of Example 1. Residual potential of the exposed area was −120 V. Subsequently, yellow toner for Basertech 3000 (color electrostatic plotter, a product of Xerox) was diluted with Isopar H to a volume of 50 times and used. Bias voltage of −200 V was applied to the photoreceptor side electrode of a development device having a pair of plate development electrodes, and positive development was carried out so as to allow the toner to be electrodeposited on the unexposed area. Rinsing was then conducted by using a bath containing Isopar E alone to remove stain on the non-image area.

The above processing was carried out for each of magenta, cyan and black colors.

In the same manner as in Example 1, the transfer layer 12 was formed and transferred onto the primary receptor 20 and then onto the coated paper 21, thereby forming the color image 25 on the coated paper.

The resulting color image was a clear duplicate of good quality which was not fogged. Further, the image area had a sufficient strength.

EXAMPLES 42 TO 64

The procedure of Example 1 was repeated except that resins (P) and/or resin particles (PL) shown in Table 15 below were used in place of 0.3 g of the resin (P-1) to prepare photoreceptors.

The photoreceptors were processed in a dark place in the same manner as in Example 1, and image properties and transferability were examined. Each of the resulting duplicated color images on the coated paper after transfer was a clear image which did not suffer from ground fogging. Further, the images had good durable strength.

TABLE 15

| Example | Resin (P) and/or Resin Particle | |
|---|---|---|
| 42 | P-2 | 0.2 g |
| 43 | PL-14 | 0.5 g |
| 44 | P-6 | 0.3 g |
| 45 | P-11 | 0.3 g |
| 46 | PL-19 | 0.4 g |
| 47 | P-19 | 0.2 g |
| | PL-23 | 0.3 g |
| 48 | P-13 | |
| 49 | P-16 | |
| 50 | P-32 | |
| 51 | P-17 | |
| 52 | P-22 | 0.2 g |
| | PL-9 | 0.4 g |
| 53 | P-28 | 0.4 g |
| 54 | P-30 | 0.3 g |
| 55 | PL-2 | 0.6 g |
| 56 | P-34 | 0.3 g |
| 57 | P-36 | 0.25 g |
| 58 | P-31 | 0.1 g |
| | PL-15 | 0.3 g |
| 59 | P-35 | 0.3 g |
| 60 | PL-24 | 0.6 g |
| 61 | P-38 | 0.25 g |

EXAMPLES 62 TO 72

A mixture of 3.5 g of X type metal-free phthalocyanine, 10 g of the following binder resin (B-7) and 80 g of tetrahydrofuran together with glass bead was placed in a 500 ml glass container and dispersed in a paint shaker (a product of Toyo Seiki Seisakusho) for 60 minutes. Further, the resins (P) and crosslinking compounds shown in Table 16 below were added thereto, and the mixture was dispersed for 10 minutes. Glass bead was then recovered by filtration to obtain a dispersion for the photoreceptive layer.

Binder Resin (B-7)

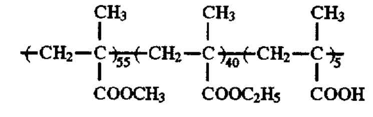

$\overline{M}w$ 7 × $10^4$

TABLE 16

| Example | Resin (P) or Resin Particle (PL) | Crosslinking Compound | Amount of Crosslinking Compound |
|---|---|---|---|
| 62 | P-30 | Phthalic Anhydride | 0.2 g |
| | | Acetylacetone Zirconium Salt | 0.01 g |
| 63 | P-22 | Gluconic Acid | 0.008 g |
| 64 | P-25 | N-Methylaminopropanol | 0.25 g |
| | | Dibutyltin Dilaurate | 0.001 g |
| 65 | P-9 | N,N'-Dimethylaminopropylamine | 0.3 g |
| 66 | P-7 | Propylene Glycol | 0.2 g |
| | | Tetrakis(2-ethylhexane diolato)titanium | 0.008 g |
| 67 | PL-18 | — | |
| 68 | PL-15 | N,N-Dimethylpropanediamine | 0.25 g |
| 69 | P-13 | Divinyl Adipate | 0.3 g |
| | | 2,2'-Azobis(isobutyronitrile) | 0.001 g |
| 70 | P-14 | Propyltriethoxysilane | 0.01 g |
| 71 | PL-21 | N,N-Diethylbutanediamine | 0.3 g |
| 72 | P-5 | Ethylenediglycidyl Ether | 0.2 g |
| | | o-Chlorophenol | 0.001 g |

The dispersion was coated on an aluminum support by wire bar coating, dried to the touch, then dried at 110° C. in a circulating oven for 20 seconds and heated at 140° C. for one hour. A transferred image was formed in the same manner as in Example 3 except that the photoreceptor 11 obtained above was used in place of the photoreceptor used in Example 3. The duplicated color image on the coated paper after transfer was a clear image which did not suffer from ground fogging, and the image had a good durable strength.

EXAMPLE 73

An amorphous silicon photoreceptor 11 (a product of Kyocera KK) was fed to the apparatus of FIG. 2. A releasing property was imparted to the surface of the photoreceptor in the following manner by using the means 10. The photoreceptor 11 was brought into contact with a solution of one gram of the following releasing compound (S-1) (polyether-modified silicone oil) dissolved in one liter of Isopar G, rotated at a rotational speed of 30 mm/sec (peripheral speed) for 10 seconds, squeezed by squeeze rollers and then dried by the preheating means. The surface of the photoreceptor had adhesion of 8 g.f, though adhesion was 203 g.f before the above treatment was conducted. Compound (S-1)

Compound (S-1)

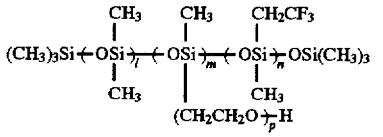

The amorphous silicon photoreceptor 11 having a releasing surface kept in a dark place was corona-charged to +700 V and exposed to light of 780 nm by using semiconductor laser with negative image mode on the basis of information on first yellow of yellow, magenta, cyan and black colors which were previously red from the original by a color scanner, subjected to color separation, corrected with regard to color reproducibility peculiar to the system and stored as digital image data in the hard disk in the system. The potential of the exposed area was +220 V, and that of the unexposed area was +600 V.

Subsequently, the photoreceptor was prebathed by using a prebath device containing Isopar H set to the development unit. Positively chargeable yellow toner for Basertech 300 (color electrostatic plotter, a product of Xerox) was diluted with Isopar H in an amount of 50 times the amount of the toner to obtain a liquid developer 14y. The developer 14y from the development unit was fed to the surface of the photoreceptor 11. In this case, development bias voltage of +500 V was applied to the development unit side, and reversal development was carried out so as to allow the toner to be electrodeposited on the unexposed area of yellow. The photoreceptor was rinsed with Isopar H alone to remove stain on the non-image area and dried by the suction exhaust unit.

The above processing was repeated for each of magenta, cyan and black colors.

The dispersion (L-1) for electrodeposition used in Example 1 was then fed to the photoreceptor by using the device of FIG. 4.

The photoreceptor 11 was rotated at a peripheral speed of 10 mm/sec. While the dispersion 12a from the electrodeposition unit 50 was fed to the surface of the photoreceptor, the photoreceptor 11 side was earthed and a voltage of +200 V was applied to the electrode of the electrodeposition unit 50 to carry out the electrodeposition of the resin particles. The dispersion was removed by air squeeze of the suction exhaust unit 15. The electrodeposited resin particles were molten by the infrared line heater of the preheating means 16 to form a film, thus forming the transfer layer 12 composed of the thermoplastic resin. The film thickness was 5 μm.

A drum provided with Blanket 9600-A (adhesion: 80 g.f/10 mm wide; the total thickness: 1.6 mm, a product of Meiji Rubber KK) for offset printing as the primary receptor 20 was previously heated to 120° C. Separately, the photoreceptor 11 was heated by the preheating means 16 and the temperature controlling means 17 so that the surface temperature thereof became 60° C.

The drum of the photoreceptor 11 and the drum of the primary receptor 20 were brought into contact with each other, and heated and pressurized under such conditions that nip pressure was 3 kgf/cm$^2$ and drum peripheral speed was 5 mm/sec. The color toner image 25 together with the transfer layer 12 was completely transferred onto the primary receptor 20.

The surface temperature of the primary receptor 20 was set to 60° C. by the temperature controlling means. The temperature of the back-up roller 22 for transfer was set to 130° C., and the temperature of the back-up roller 23 for release was set to 10° C. Printing coated paper 21 (the final receiving material) was guided between the drum of the primary receptor 20 and the rollers 22, 23 and heated and pressurized under such conditions that nip pressure was 5 kgf/cm$^2$ and drum peripheral speed was 10 mm/sec, whereby the color toner image 25 could be completely transferred onto the coated paper 21. There was obtained a clear color image of high quality.

For the purpose of comparison, the color image was formed on the coated paper by a method wherein the toner image 25 was formed on the photoreceptor 11, the transfer layer was formed thereon, and the toner image was transferred onto the primary receptor 20 without carrying out the treatment with the compound (S).

The color image was insufficiently transferred onto the coated paper so that the resulting color image could not be used as a duplicate. The surface of the photoreceptor was observed, and it was found that the toner image and the transfer layer were greatly left behind on the photoreceptor. This is caused by that the releasability of the surface of the photoreceptor is insufficient.

In the present invention, the toner image is sufficiently released from the photoreceptor and can be easily, completely transferred from the primary receptor to the final receiving material. Accordingly, the above problem is not caused, and an excellent color duplicate can be obtained. It can be seen that sufficient releasability can be provided by the use of the compound (S) when the toner image and the transfer layer are formed and transferred from the photoreceptor.

EXAMPLES 74 TO 94

The procedure of Example 73 was repeated except that a solution of a predetermined amount of each of compounds (S) shown in Table 17 below dissolved in one liter of Isopar G was used in place of the releasing compound (S-1) used Example 73 to impart the releasing property to the surface of the amorphous silicon photoreceptor. The surfaces of the photoreceptors treated with the compounds (S) had adhesion in the range of 3 to 20 g.f.

The resulting color images on the coated paper were clear images which were not fogged, and the images had a sufficient strength as in Example 73.

TABLE 17

| Example | Fluorine and/or Silicon-containing Compound (S) | Amount g/l |
|---|---|---|
| 74 | (S-2) Polyether-modified Silicone TSF 4446 (TSF series, Toshiba Silicon KK)<br>(Estimated Structure) 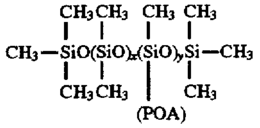<br>POA: polyether moiety (EO/PO: 100/0 by mol) | 0.5 g |

TABLE 17-continued

| Example | Fluorine and/or Silicon-containing Compound (S) | Amount g/l |
|---|---|---|
| 75 | (S-3) Polyether-modified Silicone TSF 4453 (TSF series, Toshiba Silicon KK) (Estimated Structure) 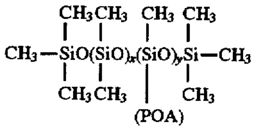 (EO/PO: 75/25 by mol) | 0.8 g |
| 76 | (S-4) Polyether-modified Silicone TSF 4460 (TSF series, Toshiba Silicon KK) (Estimated Structure) 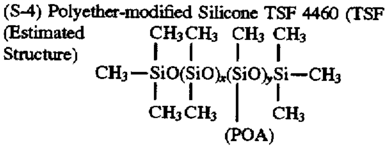 (EO/PO: 0/100 by mol) | 0.5 g |
| 77 | (S-5) Higher Fatty Acid-modified Silicone TSF 411 (TSF series, Toshiba Silicon KK) (Estimated Structure) 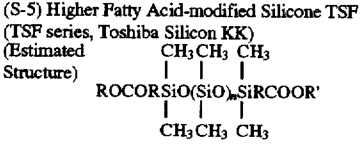 | 1.0 g |
| 78 | (S-6) Epoxy-modified Silicone XF42-A5041 (Toshiba Silicon KK) (Estimated Structure) 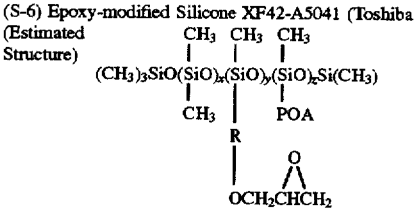 | 1.2 g |
| 79 | (S-7) Fluoro-oligomer Surflon S-382 (Asahi Glass Co.) Sturcture is not clear | 0.3 g |
| 80 | (S-8) 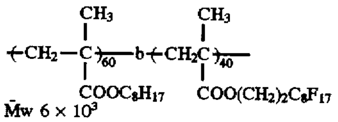 $\bar{M}w$ 6 × $10^3$ | 1.5 g |
| 81 | (S-9) 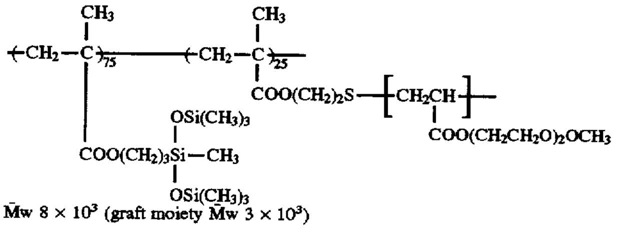 $\bar{M}w$ 8 × $10^3$ (graft moiety $\bar{M}w$ 3 × $10^3$) | 2 g |
| 82 | (S-10) $R_5O(C_2H_4O)_n(C_3H_6)H$ $R_5$: $C_nF_{2n+1}$ (n: 8–12) | 0.1 g |
| 83 | (S-11) 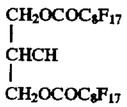 | 0.5 g |
| 84 | (S-12) 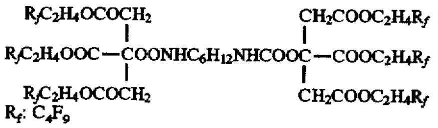 $R_f$: $C_4F_9$ | 0.3 g |
| 85 | (S-13) 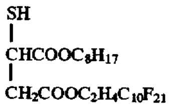 | 1.0 g |

TABLE 17-continued

| Example | Fluorine and/or Silicon-containing Compound (S) | Amount g/l |
| --- | --- | --- |
| 86 | (S-14) 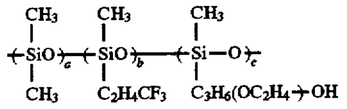 | 0.5 g |
| 87 | (S-15) 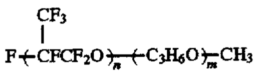 | 0.4 g |
| 88 | (S-16) Carboxy-modified Silicone X-22-3701E (Shin-Etsu Silicone KK)<br>(Estimated Structure) 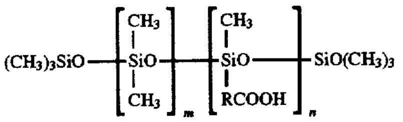 | 0.5 g |
| 89 | (S-17) Carbinol-modified Silicone X-22-176B (Shin-Etsu Silicone KK)<br>(Estimated Structure) 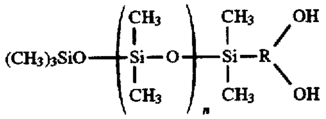 | 1.0 g |
| 90 | (S-18) Mercapto-modified Silicone X-22-167B (Shin-Etsu Silicone KK)<br>(Estimated Structure) 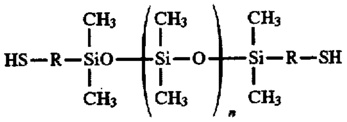 | 2 g |
| 91 | (S-19) Amino-modified Silicone KF-804 (Shin-Etsu Silicone KK)<br>Estimated Structure) 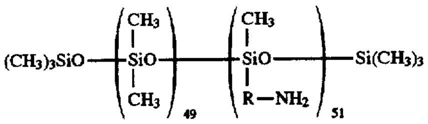 | 2.5 g |
| 92 | (S-20) 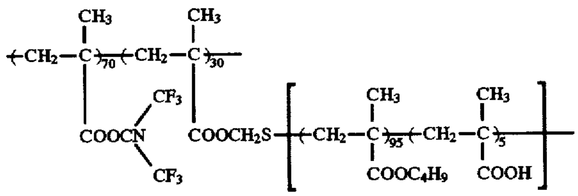<br>$\bar{M}w$ 1 × $10^4$ (graft moiety $\bar{M}w$ 6 × $10^3$) | 5 g |
| 93 | (S-21) 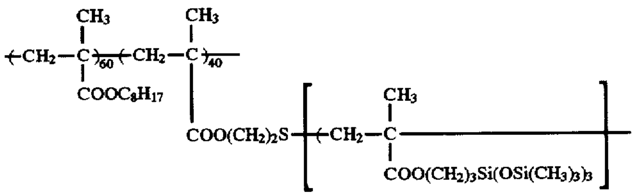<br>$\bar{M}w$ 8 × $10^4$ (graft moiety $\bar{M}w$ 4 × $10^3$) | 10 g |

TABLE 17-continued

| Example | Fluorine and/or Silicon-containing Compound (S) | Amount g/l |
|---|---|---|
| 94 | (S-22) 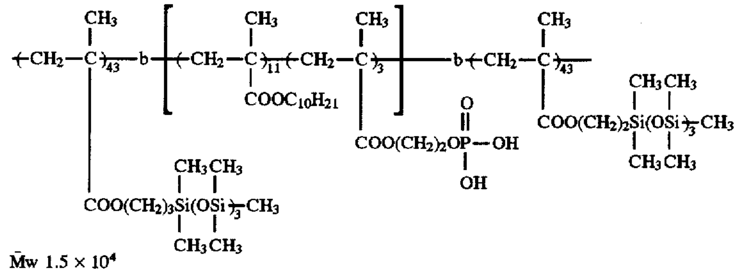 Mw $1.5 \times 10^4$ | 8 g |

EXAMPLE 95

A mixture of 2 g of X type metal-free phthalocyanine (a product of Dainippon Ink & Chemicals Inc.), 8.5 g of the following binder resin (B-8), 1.5 g of the following binder resin (B-9), 0.15 g of the following compound (D) and 80 g of tetrahydrofuran together with glass bead was placed in a 500 ml glass container and dispersed in a paint shaker (a product of Toyo Seiki Seisakusho) for 60 minutes. Glass bead was then recovered by filtration to obtain a dispersion for the photoreceptive layer.

Binder Resin (B-8)

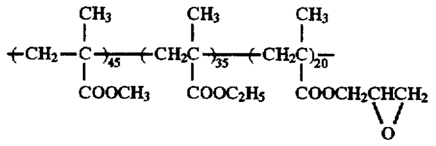

Mw $8 \times 10^4$ (by weight)

Binder Resin (B-9)

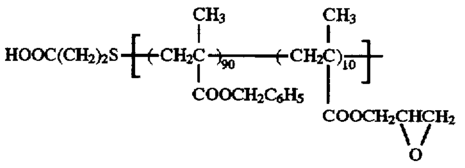

Mw $7 \times 10^3$

Compound (D)

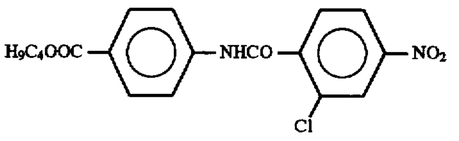

The dispersion was coated on base paper having a thickness of 0.2 mm for paper plating by wire bar coating, said base paper being previously subjected to an electrical conductivity-imparting treatment and a solvent resistance-imparting treatment. The resulting coated paper was dried to the touch and heated at 120° C. in a circulating oven. The resulting photoreceptor had a film thickness of 8 μm.

The photoreceptor 11 was fed to the apparatus of FIG. 2 and brought into contact with a metalling roll having a silicone rubber layer as the uppermost surface layer contacted with a bath containing the compound (S-23) (carboxy-modified silicone oil TSF 4446, a product of Toshiba Silicon KK) to impart the releasing property to the photoreceptor 11. Both drums were rotated at a speed of 15 mm/sec (peripheral speed). The adhesion of the surface of the photoreceptor 11 became 5 g.f by this treatment. The adhesion before treatment was at least 400 g.f.

Further, the treatment was carried out through a transfer roll having a styrene-butadiene rubber layer as the uppermost surface layer between the metalling roll immersed in the silicone bath and the photoreceptor. Similar results to those obtained above were obtained.

Figure 9:
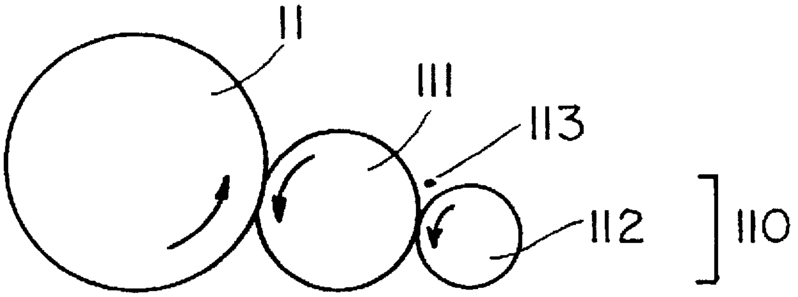
FIG. 9 shows schematically a part of an embodiment of a feeding device of compound (S).

Furthermore, the compound (S-23) 113 was fed between the metalling roll 112 and the transfer roll 111 in the method using metalling roll/transfer roll as shown in FIG. 9 showing a partial view illustrating the compound (S) feeding device 110. Good results could be obtained.

Subsequently, the electrophotographic process was conducted.

The photoreceptor kept in a dark place was passed under the corona charging device 18 and corona-charged to +450 V. The photoreceptor was then exposed to light of 788 nm by the semiconductor laser device 19 so as to provide an exposure amount of 30 erg/cm$^2$ with negative image mode on the basis of information on yellow of yellow, magenta, cyan and black colors which were previously red from the original by a color scanner, subjected to color separation, corrected with regard to color reproducibility peculiar to the system and stored as digital image data in the hard disk in the system.

Positively chargeable yellow toner for signature system (Eastman Kodak Co.) was diluted with Isopar H in an amount of 75 times the amount of the toner, and the resulting liquid developer was fed to the yellow liquid development unit 14y. Bias voltage of +350 V was applied to the development unit side, and reversal development was carried out so as to allow the toner to be electrodeposited on the exposed area. The photoreceptor was rinsed by a bath containing Isopar H alone to remove stain on the non-image area, and the photoreceptor was passed under the suction exhaust unit 15 and the preheating means 16 to dry it.

The above processing was repeated for each of magenta, cyan and black colors to obtain a color toner image.

A transfer layer having a laminated structure was formed on the photoreceptor 11 having the toner image formed thereon in the following manner.

A resin dispersion (L-3) prepared by adding Isopar H to 8 g (on a solid basis) of the resin particles (AL-4) and 0.03 g of the charge controlling agent (CD-3) (1-tetradecene/t-octylmaleic acid half amide copolymer) to make the entire amount one liter was fed to the wet electrodeposition unit 50 (transfer layer-forming device), and a first transfer layer was formed by the wet electrodeposition method. Namely, the photoreceptor 11 was heated by using the preheating means 16 and the temperature controlling means 17 so that the surface temperature of the photoreceptor became 60° C. The drum of the photoreceptor was rotated at a peripheral speed of 10 mm/sec. While the dispersion 12*a* was fed to the surface of the photoreceptor 11 having the toner image 25 formed thereon by using the slit electrodeposition device, the photoreceptor side was earthed, and a voltage of −130 V was applied to the electrode side of the slit electrodeposition device to carry out the electrodeposition of the resin particles. The dispersion was removed by air squeeze of the unit 15. Further, the resin particles were molten by the infrared line heater of the preheating means 16 to form a film, thus forming the first transfer layer composed of the thermoplastic resin. The film thickness was 2 μm.

A resin dispersion (L-4) was prepared in the same manner as in the preparation of the resin dispersion (L-3) except that 8 g (on a solid basis) of the resin particles (AL-18) was used in place of 8 g of the resin particles (AL-4). A second transfer layer 12 of 3 μm in thickness was formed on the first transfer layer at an applied voltage of −250 V by using the resin dispersion (L-4) in the same manner as described above.

The drum of the primary receptor 20 was heated to 100° C. The primary receptor 20 was brought into contact with the drum of the photoreceptor 11 having the toner image 25 and the transfer layer 12 formed on the toner image, and the toner image 25 together with the transfer layer 12 was completely transferred onto the primary receptor 20.

The primary receptor 20 used above was prepared in the following manner. A coat of 10 μm was formed on the surface of the roll of Blanket 9600-A used in Example 1 by using 7 parts by weight of the resin (P-2) and 0.001 g of phthalic anhydride based on 100 parts by weight of isoprene, and the coat was heated at 140° C. for 2 hours to cure it. The resulting coated product was used as the primary receptor 20. The adhesion of the surface thereof was 80 g.f.

The surface temperature of the drum of the primary receptor 20 was set to 60° C. by the temperature controlling means. The back-up roller 22 for transfer was set to 130° C., and the back-up roller 23 for release was set to 10° C. Printing coated paper 21 (final receiving material) was guided between the primary receptor 20 and the rollers 22, 23, and heating and pressurizing were conducted under such conditions that nip pressure was 5 kgf/cm$^2$ and drum peripheral speed was 10 mm/sec, whereby the color toner image 25 could be completely transferred onto the coated paper 21. There was obtained a clear color image of high quality.

For the purpose of comparison, the color image 25 was formed on the coated paper 21 by a method wherein the toner image 25 was formed on the photoreceptor, the transfer layer was formed and the toner image together with the transfer layer was transferred onto the primary receptor 20 without using the compound (S-23).

The color image was insufficiently transferred onto the coated paper so that the resulting color image could not be used as a duplicate. The surface of the photoreceptor was observed, and it was found that the toner image and the transfer layer were greatly left behind on the photoreceptor. This is caused by that the releasability of the surface of the photoreceptor is insufficient.

In the present invention, the toner image is sufficiently released from the photoreceptor and can be easily, completely transferred from the primary receptor to the final receiving material. Accordingly, the above problem is not caused, and an excellent color duplicate can be obtained. It can be seen that sufficient releasability can be provided by the use of the compound (S) when the toner image and the transfer layer are formed and transferred from the photoreceptor.

EXAMPLE 96

The procedure of Example 95 was repeated except that releasability was imparted to the photoreceptor in the following manner to form a color image on the coated paper 21.

Cloth impregnated with the compound (S-24) (fluorine surfactant Surflon S-141, a product of Asahi Glass Co.) was wound around a rubber roller provided with a heating means. The surface of the roller was heated to 60° C. and the roller was brought into contact with the photoreceptor 11. Both drums were rotated at a peripheral speed of 20 mm/sec for 30 seconds. The surface of the photoreceptor 11 became 12 g.f.

The resulting final color image was clear as in Example 95.

EXAMPLE 97

The procedure of Example 95 was repeated except that releasability was imparted to the photoreceptor in the following manner to form a color image on the coated paper 21.

A silicone rubber roller compound of silicone rubber coated around a metallic core roller (a product of Kinyosha K.K.) was allowed to abut against the surface of the photoreceptor 11 under nip pressure of 500 g.f/cm$^2$, and they were rotated at a peripheral speed of 15 mm/sec for 10 seconds. The adhesion of the surface of the photoreceptor was reduced to 15 g.f.

The resulting final image was superior as in Example 95.

EXAMPLES 98 TO 115

The procedure of Example 95 was repeated except that resin particles (AL) shown in Table 18 below were used in place of 8 g of the resin particles (AL-4) used in the resin dispersion (L-3) to form a color image.

TABLE 18

| Example | Resin Particle (AL) (weight ratio) | |
|---|---|---|
| 98 | AL-2/AL-17 | (5/5) |
| 99 | AL-3/AL-18 | (6/4) |
| 100 | AL-3/AL-20 | (5/5) |
| 101 | AL-6 | |
| 102 | AL-19 | |
| 103 | AL-4/AL-18 | (4/6) |
| 104 | AL-5/AL-21 | (7/3) |
| 105 | AL-8/AL-18 | (5/5) |
| 106 | AL-10 | |
| 107 | AL-25 | |
| 108 | AL-3/AL-26 | (4/6) |
| 109 | AL-11/AL-18 | (2.5/7.5) |
| 110 | AL-12/AL-23 | (3/7) |
| 111 | AL-13/AL-28 | (6/4) |
| 112 | AL-14/AL-27 | (5/5) |
| 113 | AL-15/AL-24 | (5/5) |
| 114 | AL-16/AL-26 | (2/8) |
| 115 | AL-7/AL-22 | (4/6) |

The resulting color duplicates were color images of good quality and did not suffer from ground staining. Namely, the toner images formed on the photoreceptor were formed with good image-reproducibility and non-image area was not fogged. Further, the toner image together with the transfer layer was completely transferred onto the coated paper. Writing and sealing could be made on the resulting duplicates as in plain paper.

EXAMPLE 116

The procedure of Example 73 was repeated except that the transfer layer was formed by hot-melt coating in the following manner in place of the electrodeposition method to obtain a color image duplicate.

The photoreceptor was fed to the apparatus of FIG. 2 provided with the device of FIG. 6. After the color image was formed on the photoreceptor 11 in the same manner as in Example 73, an ethylene-vinyl acetate copolymer (vinyl acetate content: 20% by weight; softening point: 90° C. as measured by ball and ring test) as the thermoplastic resin (A) for the transfer layer was coated on the surface of the photoreceptor at a coating rate of 20 mm/sec by the hot-melt coater 30 heated to 120° C. After cooling by blowing cooling air from the unit 15, the surface temperature of the photoreceptor 11 was kept at 30° C. The thickness of the transfer layer was 5 μm.

The resulting color image on the coated paper was clear. The toner on the coated paper was completely covered with the thermoplastic resin of the transfer layer and was not scraped off.

EXAMPLE 117

The procedure of Example 73 was repeated except that the transfer layer was formed by transfer from release paper in the following manner in place of the electrodeposition method to obtain a color image duplicate.

The photoreceptor 11 was fed to the apparatus of FIG. 2 provided with the device of FIG. 5. Separate paper (a product of Oji Paper Co., Ltd.) was used as the release paper, and a coat of 4 μm in thickness composed of a 5/5 by weight combination of polyvinyl acetate and a methyl methacrylate/methyl acrylate (6/4 by weight) copolymer was formed thereon. The resulting coated paper was fed to the device of FIG. 5 and was brought into contact with the photoreceptor 11 having the toner image 25 thereon under such conditions that pressure between the rollers was 3 kgf/cm$^2$ the surface temperature was 80° C. and the peripheral speed was 10 mm/sec, thereby transferring the transfer layer 12 from the release paper.

The resulting color image on the coated paper 21 was a clear image which was not fogged, and the image had a sufficient strength. Further, the duplicate had good writeability and sealability.

EXAMPLE 118

The procedure of Example 116 was repeated except that each of the resins used in Examples 15 to 30 shown in Table 13 was used in place of the ethylene-vinyl acetate copolymer used in the formation of the transfer layer. Similar results to those obtained in Example 116 were obtained.

EXAMPLE 119

The procedure of Example 117 was repeated except that Sun Release (a product of Sanyo Kokusaku Pulp KK) was used in place of separate paper, and a coat of 4 μm in thickness composed of each of the resins (A) used in Examples 31 to 37 shown in Table 14 was provided thereon as the transfer layer 12 to form a color image.

The resulting color images were clear images which did not suffer from ground staining. Further, the duplicated images were substantially not deteriorated in comparison with the original. This shows that the transfer layer can be uniformly, completely transferred, and transfer from the release paper does not have any adverse effect on the image even when there is used the method wherein after the toner image is formed, the transfer layer is formed on the photoreceptor by using release paper, and the transfer layer is further transferred onto the coated paper.

EXAMPLE 120

The procedure of Example 95 was repeated except that the photoreceptor obtained by using a dispersion prepared in the following manner was used in place of the X-type phthalocyanine photoreceptor used in Example 95.

A dispersion for the photoreceptive layer was prepared by using 5 g of 4,4'-bis(diethylamino)-2,2'-dimethyltriphenylmethane as the organic photoconductive material and dissolving the photoconductive material, 4 g of the binder resin (B-3) used in Example 38, 40 mg of the dye (D-1) used in Example 38 and 0.2 g of the anilide compound (C) as the chemical sensitizing agent used in Example 38 in a mixture of 30 ml of methylene chloride and 30 ml of ethylene chloride.

The dispersion for the photoreceptive layer was coated on an electrically conductive transparent support (obtained by depositing an iridium oxide film on a polyethylene terephthalate support of 100 μm in thickness; surface resistance: $10^3\Omega$) by using a wire round rod to obtain an organic thin film of a photoreceptive layer of about 4 μm.

A transferred image was formed in the same manner as in Example 73 except that the photoreceptor 11 obtained above was used in place of the photoreceptor used in Example 73. The resulting duplicated color image on the coated paper was a clear image which did not suffer from ground staining, and the image had a good durable strength.

EXAMPLE 121

The photoreceptor having a photoreceptive layer composed of two layers (surface layer for imparting releasability was not provided) used in Example 40 was kept in a dark place and charged to a surface potential of +500 V. The photoreceptor was exposed to light of 633 nm by using He—Ne laser so as to provide an exposure amount of 30 erg/cm$^2$ and then processed in the same manner as in Example 73 to form a color toner image on the photoreceptor. A transfer layer of 4.5 μm in thickness was then formed thereon by using 4.5 g of the resin particles (AL-17) and 2 g of the resin particles (AL-10) in the same manner as in Example 1. Subsequently, a full color image was formed on the coated paper in the same manner as in Example 73. The resulting duplicated paper had good performance as in Example 73.

EXAMPLE 122

A mixture of 100 g of photoconductive zinc oxide, 15 g of the binder resin (B-5) used in Example 41, 5 g of the binder resin (B-6) used in Example 41, 2 g of the following resin (P-40), 0.01 g of the dye (D-2) used in Example 41, 0.1 g of salicylic acid and 150 g of toluene was placed in a ball mill and dispersed for 2 hours to obtain a dispersion for the photoreceptive layer.

Resin (P-40)

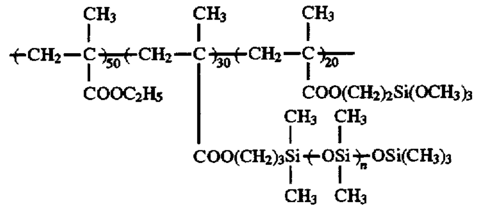

Mw $6 \times 10^4$
(dimethylsiloxane polymer moiety: Mw $6 \times 10^3$)

The dispersion was coated on base paper having a thickness of 0.2 mm for paper plate master by wire bar coating, said base paper being previously subjected to an electrical conductivity-imparting treatment and a solvent resistance-imparting treatment. The resulting coated paper was dried to the touch, heated at 110° C. in a circulating oven and then left to stand at 50° C. and 80% RH for 8 hours. Further, the resulting photoreceptor was left to stand at 25° C. and 65% RH in a dark place for 24 hours. The surface of the photoreceptor had adhesion of 12 g.f.

The releasing compound (S-23) was deposited on the surface of the photoreceptor in the same manner as in Example 95 to further improve releasability. The adhesion of the surface of the photoreceptor 11 was reduced to 1 g.f or below by this treatment.

The photoreceptor kept in a dark place was corona-charged to −600 V and exposed to light of 780 nm by using the semiconductor laser device 19 so as to provide an exposure amount of 25 erg/$cm^2$ with positive image mode on the basis of information on first yellow color by using the same digital image data as those used in Example 73. The residual potential of the exposed area was −120 V. Subsequently, yellow toner for Basertech 3000 (color electrostatic plotter, a product of Xerox) was diluted with Isopar H in an amount of 50 times the amount of the toner, and the resulting developer was fed to the development device. Bias voltage of −200 V was applied to the photoreceptor side electrode of the development device having a pair of plate development electrodes, and positive development was carried out so as to allow the toner to be electrodeposited on the unexposed area. The photoreceptor was rinsed by using a bath containing Isopar H alone to remove stain on the non-image area.

The above processing was repeated for each of magenta, cyan and black colors.

Subsequently, the transfer layer 12 was formed and transferred onto the primary receptor 20 and then onto the coated paper 21 in the same manner as in Example 1 to form a color image on the coated paper 21.

The resulting color image was a clear duplicate of good quality which did not suffer from ground staining.

It will be understood from the above disclosure that when the transfer layer is used in the electrophotographic color image forming method using an intermediate medium according to the present invention, there can be simply, stably obtained a fine, high-quality color image which does not suffer from color drift. Further, the resulting color duplicate has excellent storage stability.

The releasability of the transfer layer can be further improved and more excellent images can be obtained when the surface releasability of the photoreceptor or the intermediate medium (the primary receptor) and ingredients used in the transfer layer are into consideration.

Further, when the transfer layer is appropriately designed, transferability can be further improved, latitude can be enlarged, and an excellent color image can be reproduced without selecting a specific final receiving material. Further, writeability and sealability substantially equal to those of plain paper can be imparted to the color duplicate.

When the transfer layer is formed on the photoreceptor in the electrophotographic apparatus every time after the formation of the toner image, the photoreceptor can be repeatedly used, and hence running costs can be reduced. This can be made by using a color image forming apparatus having a simple structure.

Furthermore, when a specific compound (S) is allowed to be adsorbed or deposited on the surface of the photoreceptor before the formation of the toner image, a photoreceptor having a releasing surface can be simply obtained. Accordingly, general-purpose electrophotographic photoreceptors can be used in the present invention, and hence running costs can be further reduced.

While the present invention has been described in detail and with reference to specific embodiments thereof, it is apparent to one skilled in the art that various changes and modifications can be made therein without departing from the spirit and the scope of the present invention.

What is claimed is:

1. A color image forming apparatus which comprises a means for forming a mono-color or multi-color toner image on an electrophotographic photoreceptor by an electrophotographic process; a means for forming a releasable transfer layer on said photoreceptor having said toner image formed thereon; a means for transferring said toner image together with said transfer layer onto a primary receptor; and a means for transferring said toner image together with said transfer layer from said primary receptor onto a receiving material.

2. A color image forming apparatus as in claim 1, wherein said releasing surface of said electrophotographic photoreceptor has adhesion of 100 gram.force or below, and a surface of said primary receptor has adhesion which is greater than that of said releasing surface of said photoreceptor.

3. A color image forming apparatus as in claim 1, wherein said releasable transfer layer is formed by at least one of hot-melt coating, transfer from release paper, and electrostatic deposition or electrodeposition.

4. A color image forming apparatus as in claim 1, wherein said apparatus further comprises a means for adsorbing or depositing a compound having at least fluorine atom and/or silicon atom on a surface of said electrophotographic photoreceptor.

5. A color image forming apparatus as in claim 4, wherein said releasing surface of said electrophotographic photoreceptor has adhesion of 100 gram.force of below, and a surface of said primary receptor has adhesion which is greater than that of said releasing surface of said photoreceptor.

6. A color image forming apparatus as in claim 4, wherein said releasable transfer layer is formed by at least one of hot-melt coating, transfer from release paper, and electrostatic deposition or electrodeposition.

* * * * *